United States Patent
Inoue et al.

(10) Patent No.: US 9,741,946 B2
(45) Date of Patent: Aug. 22, 2017

(54) LIGHT-EMITTING ELEMENT CONTAINING ORGANIC IRIDIUM EXHIBITS BLUE-GREEN TO BLUE LIGHT EMISSION

(71) Applicant: Semiconductor Energy Laboratory Co., Ltd., Kanagawa-ken (JP)

(72) Inventors: Hideko Inoue, Kanagawa (JP); Yui Yamada, Kanagawa (JP); Nobuharu Ohsawa, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/134,644

(22) Filed: Dec. 19, 2013

(65) Prior Publication Data
US 2014/0175413 A1    Jun. 26, 2014

(30) Foreign Application Priority Data

Dec. 20, 2012 (JP) ................... 2012-277691

(51) Int. Cl.
*H01L 29/08*  (2006.01)
*H01L 29/04*  (2006.01)
(Continued)

(52) U.S. Cl.
CPC .......... *H01L 51/0085* (2013.01); *C09K 11/06* (2013.01); *H01J 1/63* (2013.01);
(Continued)

(58) Field of Classification Search
CPC ............. H01L 51/5016; H01L 51/0085; H01L 51/0072; H01L 51/0074; H01J 1/63;
(Continued)

(56) References Cited

U.S. PATENT DOCUMENTS

| 6,908,695 B2 | 6/2005 | Seo et al. |
| 7,045,955 B2 | 5/2006 | Seo et al. |

(Continued)

FOREIGN PATENT DOCUMENTS

| EP | 1 220 340 A2 | 7/2002 |
| EP | 1 777 229 A1 | 4/2007 |

(Continued)

OTHER PUBLICATIONS

Genevieve et al. "ToF-SIMS characterization of the surface of monophase hybrid organic inorganic materials", J. Mater. Chem., 1998, 8 (8), pp. 1761-1767.*

(Continued)

*Primary Examiner* — Dzung Tran
(74) *Attorney, Agent, or Firm* — Husch Blackwell LLP

(57) ABSTRACT

An organometallic complex which can be provided at low cost and which emits blue phosphorescence is provided. An organometallic complex in which nitrogen at the 1-position of a 5-aryl-4H-1,2,4-triazole derivative is coordinated to a Group 9 metal or a Group 10 metal, the aryl group is bonded to the Group 9 metal or the Group 10 metal, and the 5-aryl-4H-1,2,4-triazole derivative is a 3-aryl-5,6,7,8-tetrahydro-4H-[1,2,4]triazolo[4,3-a]pyridine derivative is provided. The organometallic complex emits green to blue phosphorescence and is also advantageous in terms of cost.

25 Claims, 23 Drawing Sheets

(51) Int. Cl.

| | |
|---|---|
| H01L 29/15 | (2006.01) |
| H01L 33/00 | (2010.01) |
| H01L 51/00 | (2006.01) |
| H01L 51/50 | (2006.01) |
| C09K 11/06 | (2006.01) |
| H01J 1/63 | (2006.01) |

(52) U.S. Cl.
CPC .. *H01L 51/5016* (2013.01); *C09K 2211/1007* (2013.01); *C09K 2211/1011* (2013.01); *C09K 2211/1059* (2013.01); *C09K 2211/185* (2013.01); *H01L 51/0072* (2013.01); *H01L 51/0074* (2013.01)

(58) Field of Classification Search
CPC ............ C09K 11/06; C09K 2211/185; C09K 2211/1007; C09K 2211/1011
USPC .......... 257/40, 98, 59, 72, E21.026; 438/735
See application file for complete search history.

(56) References Cited

U.S. PATENT DOCUMENTS

| | | | |
|---|---|---|---|
| 7,148,076 B2 | 12/2006 | Seo et al. | |
| 7,332,857 B2 | 2/2008 | Seo et al. | |
| 7,413,916 B2 | 8/2008 | Seo et al. | |
| 7,550,173 B2 | 6/2009 | Seo et al. | |
| 7,572,522 B2 | 8/2009 | Seo et al. | |
| 7,579,089 B2 | 8/2009 | Seo et al. | |
| 7,629,025 B2 | 12/2009 | Yamazaki et al. | |
| 7,732,811 B2 | 6/2010 | Shitagaki et al. | |
| 7,737,630 B2 | 6/2010 | Seo et al. | |
| 8,101,771 B2 | 1/2012 | Nomura et al. | |
| 8,178,217 B2 | 5/2012 | Nomura et al. | |
| 8,293,921 B2 | 10/2012 | Nomura et al. | |
| 8,310,147 B2 | 11/2012 | Seo et al. | |
| 8,319,210 B2 | 11/2012 | Shitagaki et al. | |
| 8,354,786 B2 | 1/2013 | Yamazaki et al. | |
| 9,065,061 B2 | 6/2015 | Inoue et al. | |
| 2002/0093283 A1 | 7/2002 | Seo et al. | |
| 2002/0109136 A1* | 8/2002 | Seo et al. | 257/40 |
| 2002/0139303 A1 | 10/2002 | Yamazaki et al. | |
| 2003/0010288 A1 | 1/2003 | Yamazaki et al. | |
| 2005/0031903 A1* | 2/2005 | Park et al. | 428/690 |
| 2006/0036097 A1 | 2/2006 | Qiu et al. | |
| 2006/0125379 A1* | 6/2006 | Liu et al. | 313/504 |
| 2007/0085073 A1 | 4/2007 | Inoue et al. | |
| 2007/0190359 A1* | 8/2007 | Knowles ............ C07F 15/0033 428/690 |
| 2007/0222376 A1 | 9/2007 | Ohsawa et al. | |
| 2007/0262693 A1* | 11/2007 | Seo ........................ C09K 11/06 313/483 |
| 2008/0135835 A1* | 6/2008 | Seo ........................ C08G 77/26 257/40 |
| 2009/0072725 A1* | 3/2009 | Suzuki et al. | 313/504 |
| 2009/0153041 A1* | 6/2009 | Kawakami ........... C07D 413/12 313/504 |
| 2009/0160324 A1* | 6/2009 | Nomura ............... C07D 209/42 313/504 |
| 2010/0079066 A1* | 4/2010 | Nomura et al. ............ 313/504 |
| 2010/0244672 A1* | 9/2010 | Nomura ............... C07D 231/12 313/504 |
| 2011/0101854 A1 | 5/2011 | Inoue et al. | |
| 2011/0198988 A1 | 8/2011 | Inoue et al. | |
| 2011/0220882 A1 | 9/2011 | Inoue et al. | |
| 2011/0285276 A1* | 11/2011 | Kadoma ............... C07D 403/10 313/504 |
| 2012/0199818 A1 | 8/2012 | Nomura et al. | |
| 2013/0002131 A1 | 1/2013 | Inoue et al. | |
| 2013/0048964 A1* | 2/2013 | Takeda ................ H01L 51/0058 257/40 |
| 2013/0075713 A1 | 3/2013 | Shitagaki et al. | |
| 2015/0287936 A1 | 10/2015 | Inoue et al. | |

FOREIGN PATENT DOCUMENTS

| | | |
|---|---|---|
| EP | 2 256 840 A2 | 12/2010 |
| JP | 2002-289352 | 10/2002 |
| JP | 2002-302757 | 10/2002 |
| JP | 2002-313583 | 10/2002 |
| JP | 2002-317262 | 10/2002 |
| JP | 2002-319492 | 10/2002 |
| JP | 2003-92185 | 3/2003 |
| JP | 2003-100461 | 4/2003 |
| JP | 2006-318935 | 11/2006 |
| JP | 2007-137872 | 6/2007 |
| JP | 2007-208102 | 8/2007 |
| JP | 2007-287676 | 11/2007 |
| JP | 2008-69221 | 3/2008 |
| JP | 2008-74921 | 4/2008 |
| JP | 2008-166745 | 7/2008 |
| JP | 2008-308490 | 12/2008 |
| JP | 2009-88491 | 4/2009 |
| JP | 2009-167173 | 7/2009 |
| JP | 2010-77124 | 4/2010 |
| JP | 2010-254679 | 11/2010 |
| JP | 2011-253980 A | 12/2011 |
| JP | 2012-046479 A | 3/2012 |
| JP | 2012-151266 A | 8/2012 |
| WO | WO 2007/029461 A1 | 3/2007 |
| WO | WO 2008/035664 A1 | 3/2008 |
| WO | WO 2008/069153 A1 | 6/2008 |
| WO | WO 2008/143019 A1 | 11/2008 |
| WO | WO 2009/081718 A1 | 7/2009 |
| WO | WO 2009/107497 A1 | 9/2009 |
| WO | WO 2011/052516 A1 | 5/2011 |

OTHER PUBLICATIONS

Wu, Z.L. et al., "Synthesis and Photoluminescence of a Novel Iridium Complex (BuPhOXD)2Ir(acac) with Unit of 1,3,4-Oxadiazole," Chinese Chemical Letters, vol. 16, No. 2, 2005, pp. 241-244, Chinese Chemical Society.

Van Diemen, J.H. et al., "Synthesis and Characterization of Orthometalated Rhodium (III) Complexes Containing Substituted Triazoles," Inorganic Chemistry, vol. 30, No. 21, 1991, pp. 4038-4043, American Chemical Society.

Zamora, F. et al., "Synthesis of Several Palladium Complexes Derived from 2,5-diphenyl-1,3,4-Oxadiazole. Reactivity Against Nucleobase Models,", Journal of Inorganic Biochemistry, vol. 68, No. 4, Dec. 1, 1997, pp. 257-263.

Baldo, M.A. et al., "Very High-Efficiency Green Organic Light-Emitting Devices Based on Electrophosphorescence," Applied Physics Letters, vol. 75, No. 1, Jul. 5, 1999, pp. 4-6.

Liu, J. et al., "Green-Yellow Electrophosphorescence from di [2,5-diphenyl-1,3,4-oxadiazole $C^2$, $N^3$] Platinum( II ) Doped PVK Devices," Chinese Physics Letters, vol. 22, No. 3, pp. 2005, 723-726.

Wu, Z.L. et al., "Synthesis and Photoluminescence of a Novel Iridium Complex (BuPhOXD)2Ir(acac) with Unit of 1,3,4-Oxadiazole," Chinese Chemical Society, vol. 16, No. 2, 2005, pp. 241-244.

Chen, L. et al., "Synthesis, Structure, Electrochemistry, Photophysics and Electroluminescence of 1,3,4-Oxadiazole-Based Ortho-Metalated Iridium(III) Complexes,", Journal of Organometallic Chemistry, vol. 691, No. 16, Aug. 1, 2006, pp. 3519-3530.

Lo, S.-C. et al, "Blue Phosphorescence from Iridium(III) Complexes at Room Temperature," Chemistry of Materials, vol. 18, No. 21, 2006, pp. 5119-5129, American Chemical Society.

* cited by examiner

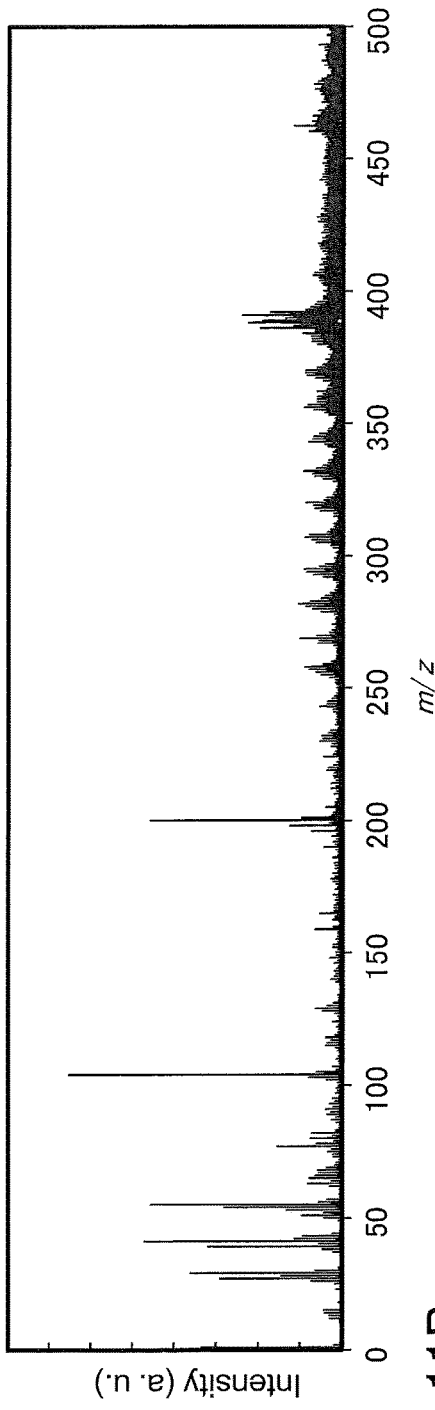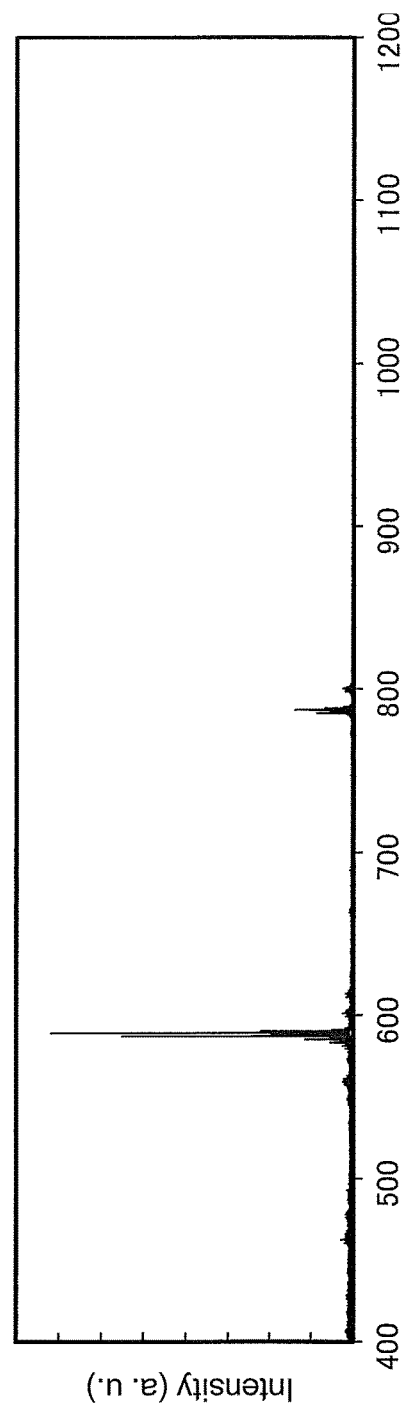

LIGHT-EMITTING ELEMENT CONTAINING ORGANIC IRIDIUM EXHIBITS BLUE-GREEN TO BLUE LIGHT EMISSION

BACKGROUND OF THE INVENTION

1. Field of the Invention

The present invention relates to a novel organometallic complex that is capable of converting a triplet excited state into luminescence. In addition, the present invention relates to a light-emitting element, a light-emitting device, an electronic device, and a lighting device each using the organometallic complex.

2. Description of the Related Art

In recent years, a light-emitting element using a light-emitting organic compound or an inorganic compound as a light-emitting material has been actively developed. In particular, a light-emitting element called an EL (electroluminescence) element has attracted attention as a next-generation flat panel display element because it has a simple structure in which a light-emitting layer containing a light-emitting material is provided between electrodes, and characteristics such as feasibility of being thinner and more lightweight and responsive to input signals and capability of driving with direct current at a low voltage. In addition, a display using such a light-emitting element has a feature that it is excellent in contrast and image quality, and has a wide viewing angle. Further, since such a light-emitting element is a plane light source, the light-emitting element is considered applicable to a light source such as a backlight of a liquid crystal display and lighting.

In the case where the light-emitting substance is an organic compound having a light-emitting property, the emission mechanism of the light-emitting element is a carrier-injection type. That is, by applying a voltage with a light-emitting layer provided between electrodes, electrons and holes injected from electrodes recombine to put the light-emitting substance into an excited state, and light is emitted when the excited state returns to a ground state. There are two types of the excited states which are possible: a singlet excited state (S*) and a triplet excited state (T*). In addition, the statistical generation ratio thereof in a light-emitting element is considered to be an S*-to-T* ratio of 1:3.

In general, the ground state of a light-emitting organic compound is a singlet state. Light emission from a singlet excited state (S*) is referred to as fluorescence where electron transition occurs between the same multiplicities. In contrast, light emission from a triplet excited state (T*) is referred to as phosphorescence where electron transition occurs between different multiplicities. Thus, in a compound emitting fluorescence (hereinafter referred to as fluorescent compound), in general, phosphorescence is not observed at room temperature, and only fluorescence is observed. Accordingly, the internal quantum efficiency (the ratio of generated photons to injected carriers) in a light-emitting element using a fluorescent compound is assumed to have a theoretical limit of 25% based on the S*-to-T* ratio of 1:3.

In contrast, internal quantum efficiency in a light-emitting element using a compound emitting phosphorescence (hereinafter referred to as phosphorescent compound) can be 100% in theory when light emission led from intersystem crossing from a singlet excited state to a triplet excited state is taken into account. For these reasons, the light-emitting element using a phosphorescent compound has been actively developed in recent years in order to provide a highly efficient light-emitting element.

As a phosphorescent compound, an organometallic complex having iridium as a central metal has attracted attention. Development has enabled phosphorescent compounds to emit light with various wavelengths from red to blue; however, phosphorescence is the light emission from a triplet level which is lower than a singlet excited level in terms of energy, and a phosphorescent compound having an extremely wide energy gap is necessary for obtaining green to blue phosphorescence with large energy. Such substances are difficult to develop and the variety thereof is still narrow.

Patent Document 1 discloses, as a phosphorescent compound emitting phosphorescence with a short wavelength, an iridium complex in which an imidazole derivative is a ligand.

REFERENCE

Patent Document

[Patent Document 1] PCT International Publication No. 2007/029461

SUMMARY OF THE INVENTION

In view of practical use of light-emitting elements using a blue phosphorescent material, not only the performance but also cost of the material itself is an issue. Especially in a field of lighting including incandescent lamps, fluorescent lamps, and the like, which forms a mature market, competitiveness in terms of cost is of extreme importance.

Thus, an object of one embodiment of the present invention is to provide a light-emitting element which can be fabricated at low cost and emits light in the wavelength range of blue-green to blue with high efficiency by the use of an organometallic complex which can be inexpensively produced and which emits blue phosphorescence. Another object is to provide an inexpensive light-emitting device, an inexpensive electronic device, and an inexpensive lighting device each using the light-emitting element.

A light-emitting element using an organometallic complex in which nitrogen at the 1-position of a 5-aryl-4H-1,2,4-triazole derivative is coordinated to a Group 9 metal or a Group 10 metal, the aryl group is bonded to the Group 9 metal or the Group 10 metal, and the 5-aryl-4H-1,2,4-triazole derivative is a 3-aryl-5,6,7,8-tetrahydro-4H-[1,2,4]triazolo[4,3-a]pyridine derivative is provided. The organometallic complex emits phosphorescence; specifically, the organometallic complex of a tris-type having iridium as central metal emits green to blue phosphorescence. Raw materials of the ligand are inexpensive and the synthesis thereof is easy; thus, the organometallic complex is advantageous in terms of cost.

Thus, a light-emitting element including the above-described organometallic complex between a pair of electrodes emits light in the wavelength range of blue with high efficiency by application of a voltage, and can be fabricated at low cost.

Such an organometallic complex has a structure represented by General Formula (G1).

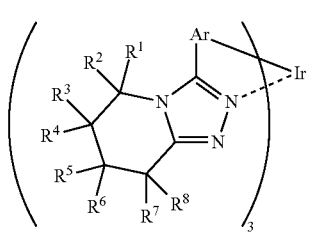

(G1)

In General Formula (G1), Ar represents a substituted or unsubstituted phenylene group or a substituted or unsubstituted naphthylene group. Further, $R^1$ to $R^8$ separately represent hydrogen or an alkyl group having 1 to 4 carbon atoms.

When the organometallic complex is analyzed by time-of-flight secondary ion mass spectrometry (ToF-SIMS) using $Bi_3^{++}$ as a primary ion with an irradiation amount of the primary ion of $1.0 \times 10^{12}$ ions/cm$^3$ or less, signals appear at least around m/z=41 and m/z=55 (m/z refers to a mass-to-charge ratio).

Thus, one embodiment of the present invention is a light-emitting element which includes a layer containing an organic compound between a pair of electrodes. The light-emitting element exhibits blue-green to blue light emission. The layer containing the organic compound contains iridium. When the layer containing the organic compound is analyzed by ToF-SIMS using $Bi_3^{++}$ as a primary ion with an irradiation amount of the primary ion of $1.0 \times 10^{12}$ ions/cm$^3$ or less, signals appear around m/z=41 and m/z=55, at least at a depth of the layer containing the organic compound.

In General Formula (G1), each of $R^1$ to $R^8$ is preferably hydrogen, in which case the raw materials are easily available and the organometallic complex can be synthesized at lower cost. The structure of the organometallic complex is represented by General Formula (G2).

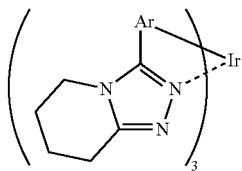

(G2)

When the organometallic complex is analyzed by ToF-SIMS, in the range of m/z=200 to 400, at least 10 signals which are derived from a long-chain alkyl skeleton (which corresponds to a tetrahydropyridine skeleton in the present invention) and a 4H-triazole skeleton appear at intervals of m/z=12 to 14. These signals have similar intensities.

That is, another embodiment of the present invention is the light-emitting element having the above structure, in which, in the range of m/z=250 to 500, at least 10 signals having similar intensities further appear at intervals of m/z=12 to 14.

In General Formula (G1), Ar is preferably an unsubstituted phenyl group, in which case the raw materials are easily available and the organometallic complex can be synthesized at lower cost. The structure of the organometallic complex is represented by Structural Formula (100).

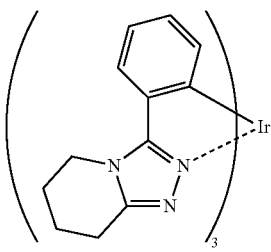

(100)

When this organometallic complex is analyzed by ToF-SIMS under conditions similar to the above, signals derived from the ligand appear around m/z=104 and m/z=200, in addition to the signals around m/z=41 and m/z=55.

That is, a further embodiment of the present invention is a light-emitting element which includes a layer containing an organic compound between a pair of electrodes. The light-emitting element exhibits blue-green to blue light emission. The layer containing the organic compound contains iridium. When the layer containing the organic compound is analyzed by ToF-SIMS using $Bi_3^{++}$ as a primary ion with an irradiation amount of the primary ion of $1.0 \times 10^{12}$ ions/cm$^3$ or less, signals appear around m/z=41, m/z=55, m/z=104, and m/z=200, at least at a depth of the layer containing the organic compound.

When the organometallic complex represented by Structural Formula (100) is analyzed by ToF-SIMS under conditions similar to the above, a strong signal is observed around m/z=589.

That is, a still further embodiment of the present invention is a light-emitting element which includes a layer containing an organic compound between a pair of electrodes. The light-emitting element exhibits blue light emission. The layer containing the organic compound contains iridium. When the layer containing the organic compound is analyzed by ToF-SIMS using $Bi_3^{++}$ as a primary ion with an irradiation amount of the primary ion of $1.0 \times 10^{12}$ ions/cm$^3$ or less, a signal appears around m/z=589, at least at a depth of the layer containing the organic compound.

A yet still further embodiment of the present invention is a light-emitting element which includes a layer containing an organic compound between a pair of electrodes. The light-emitting element exhibits blue light emission. The layer containing the organic compound contains iridium. When the layer containing the organic compound is analyzed by ToF-SIMS using $Bi_3^{++}$ as a primary ion with an irradiation amount of the primary ion of $1.0 \times 10^{12}$ ions/cm$^3$ or less, signals appear around m/z=200 and m/z=589, at least at a depth of the layer containing the organic compound.

A yet still further embodiment of the present invention is the light-emitting element having the above structure, in which signals further appear around m/z=41, m/z=55, and m/z=104.

When the organometallic complex represented by Structural Formula (100) is analyzed by ToF-SIMS, in the range of m/z=250 to 380, at least 10 signals which are derived from a long-chain alkyl skeleton (which corresponds to a tetrahydropyridine skeleton in the present invention) and a 4H-triazole skeleton appear at intervals of m/z=12 to 14. These signals have similar intensities.

That is, a yet still further embodiment of the present invention is the light-emitting element having the above structure, in which, in the range of m/z=250 to 380, at least 10 signals having similar shapes further appear at intervals of m/z=12 to 14.

Further, when the organometallic complex represented by Structural Formula (100) is analyzed by ToF-SIMS under conditions similar to the above, a signal derived from a complex in which one ligand is coordinated to iridium appears around m/z=388.

That is, a yet still further embodiment of the present invention is a light-emitting element having the above structure, in which a signal further appears around m/z=388.

Further, when the organometallic complex represented by Structural Formula (100) is analyzed by ToF-SIMS under conditions similar to the above, a signal derived from a precursor ion appears around m/z=787.

That is, a yet still further embodiment of the present invention is a light-emitting element having the above structure, in which a signal further appears around m/z=787.

The irradiation amount of the primary ion in the above ToF-SIMS analysis is preferably greater than or equal to $8 \times 10^{10}$ ions/cm$^2$ and less than or equal to $1.0 \times 10^{12}$ ions/cm$^3$.

A light-emitting device, an electronic device, and a lighting device each using the above light-emitting element also belong to the category of the present invention. The light-emitting device in this specification includes, in its category, an image display device and a light source. In addition, the light-emitting device includes, in its category, all of a module in which a connector such as a flexible printed circuit (FPC) or a tape carrier package (TCP) is connected to a panel, a module in which a printed wiring board is provided on the tip of a TCP, and a module in which an integrated circuit (IC) is directly mounted on a light-emitting element by a chip on glass (COG) method.

In one embodiment of the present invention, a light-emitting element which can be fabricated at low cost and which emits light in the wavelength range of blue-green to blue with high efficiency can be provided. In addition, an inexpensive light-emitting device, an inexpensive electronic device, and an inexpensive lighting device each using the light-emitting element can be provided.

BRIEF DESCRIPTION OF THE DRAWINGS

FIGS. 11A and 11B show results of ToF-SIMS analysis of [Ir(ptzpytH)$_3$], which is an organometallic complex represented by Structural Formula (100).

DETAILED DESCRIPTION OF THE INVENTION

Figure 1:
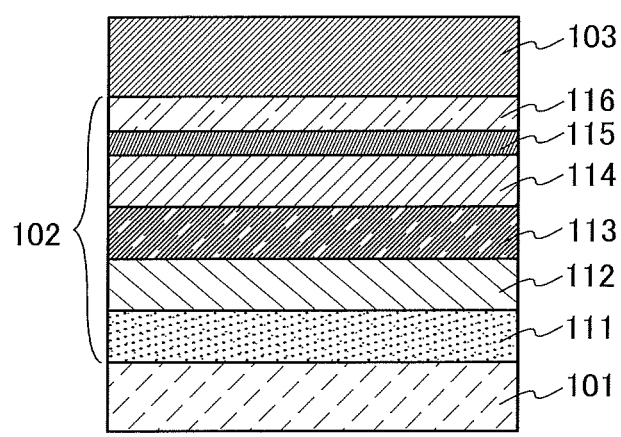
FIG. 1 illustrates a light-emitting element of one embodiment of the present invention.

Embodiments will now be described with reference to drawings in detail. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

In this specification, the term "around" in description of measured values (a mass-to-charge ratio or m/z) in measurement results of ToF-SIMS or LC-MS is used to allow for variations in measured values due to the presence or absence of hydrogen ions and isotopes.

[Embodiment 1]

In this embodiment, the light-emitting element of one embodiment of the present invention will be described.

A light-emitting element in this embodiment is a light-emitting element including an organometallic complex in which a 5-aryl-4H-1,2,4-triazole derivative is a ligand. When a central metal of the organometallic complex is a Group 9 metal or a Group 10 metal, phosphorescence is obtained. In particular, the organometallic complex preferably has iridium as the central metal, in which case favorable phosphorescence quantum yield can be achieved. Note that the organometallic complex is preferably of a tris-type because phosphorescence with a shorter wavelength can be easily obtained and the light-emitting element can have high emission efficiency.

The 5-aryl-4H-1,2,4-triazole derivative as the ligand of the organometallic complex is a 3-aryl-5,6,7,8-tetrahydro- 4H-[1,2,4]triazolo[4,3-a]pyridine derivative. The 5-aryl-4H-1,2,4-triazole derivative involves fewer synthesis steps, is easily synthesized, and is thus advantageous in terms of cost. In addition, the 5-aryl-4H-1,2,4-triazole derivative is advantageous also in terms of yield because complex formation reaction relatively easily proceeds, and the cost can be further reduced.

An organometallic complex having the above structure emits blue-green to blue phosphorescence and can be manufactured inexpensively; thus, the organometallic complex is advantageous in terms of cost. Accordingly, a light-emitting element including the organometallic complex can have high emission efficiency and can be fabricated at low cost.

The above organometallic complex has the structure represented by General Formula (G1).

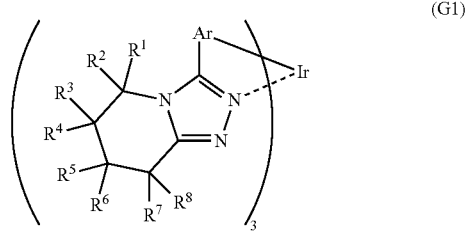

(G1)

In General Formula (G1), Ar represents a substituted or unsubstituted phenylene group or a substituted or unsubstituted naphthylene group. In the case where Ar has a substituent, an alkyl group having 1 to 4 carbon atoms, an alkoxy group having 1 to 4 carbon atoms, an alkylthio group having 1 to 4 carbon atoms, a haloalkyl group having 1 to 4 carbon atoms, a halogeno group, a phenyl group, and the like can be given as the substituent. More specifically, a methyl group, an ethyl group, a propyl group, an isopropyl group, a butyl group, a sec-butyl group, an isobutyl group, a tert-butyl group, a methoxy group, an ethoxy group, a propoxy group, an isopropoxy group, a butoxy group, a sec-butoxy group, an isobutoxy group, a tert-butoxy group, a methylsulfinyl group, an ethylsulfinyl group, a propylsulfinyl group, an isopropylsulfinyl group, a butylsulfinyl group, an isobutylsulfinyl group, a sec-butylsulfinyl group, a tert-butylsulfinyl group, a fluoro group, a fluoromethyl group, a difluoromethyl group, a trifluoromethyl group, a chloro group, a chloromethyl group, a dichloromethyl group, a trichloromethyl group, a bromomethyl group, a 2,2,2-trifluoroethyl group, a 3,3,3-trifluoropropyl group, a 1,1,1,3,3,3-hexafluoroisopropyl group, or the like can be employed.

Further, $R^1$ to $R^8$ separately represent hydrogen or an alkyl group having 1 to 4 carbon atoms. Note that Rs which are bonded to carbon atoms facing each other may be bonded to form a ring.

When the above-described organometallic complex is analyzed by ToF-SIMS using $Bi_3^{++}$ as a primary ion with an irradiation amount of the ion of $1.0 \times 10^{12}$ ions/cm$^3$ or less, signals appear at least around m/z=41 and m/z=55. These signals are derived from the 4H-triazole skeleton of the ligand and are unlikely to appear in the case of a ligand with a 1H-triazole skeleton. Note that the signal around m/z=41 is presumably derived from a C—N—N structure of the triazole ring. The signal around m/z=55 is presumably derived from an N—C—N—N structure of the triazole ring. Note that the irradiation amount of the ion as an irradiation condition of the ion is preferably higher than or equal to $8 \times 10^{10}$ ions/cm$^2$ and lower than or equal to $1.0 \times 10^{12}$ ions/cm$^3$.

When an organometallic complex represented by General Formula (G1) in which each of $R^1$ to $R^8$ is hydrogen is used for a light-emitting element, the light-emitting element can be more advantageous in terms of cost because raw materials of the organometallic complex are easily available and inexpensive. Such an organometallic complex is represented by General Formula (G2).

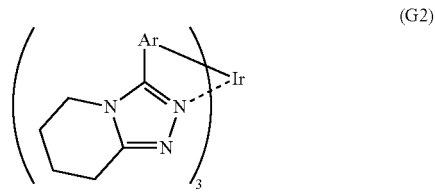

(G2)

When the organometallic complex is analyzed by ToF-SIMS under conditions similar to the above, in the range of m/z=250 to 500, at least 10 signals which are derived from a long-chain alkyl skeleton (which corresponds to a tetrahydropyridine skeleton in the present invention) and a 4H-triazole skeleton appear at intervals of m/z=12 to 14. These signals have substantially the same intensities. Note that the expression "signals have substantially the same intensities" means that when a peak of one signal, which has the highest intensity among the group of the signals has an intensity of 100, main peaks other than isotope peaks of the other signals each have an intensity of 50 or more. In other words, in the range of m/z=250 to 500, at least 10 signals which are derived from a long-chain alkyl skeleton (which corresponds to a tetrahydropyridine skeleton in the present invention) and a 4H-triazole skeleton appear at intervals of m/z=12 to 14, and the intensity of one arbitrary main peak is greater than or equal to half and less than or equal to twice the intensity of another main peak. Note that the range in which the group of the signals appear depends on the kind of Ar, or the presence or absence of a substituent of Ar and the kind of the substituent of Ar.

When an organometallic complex represented by General Formula (G2) in which Ar is an unsubstituted phenyl group is used for a light-emitting element, the light-emitting element can be more advantageous in terms of cost because raw materials of the organometallic complex are easily available and inexpensive. Such an organometallic complex can be represented by Structural Formula (100).

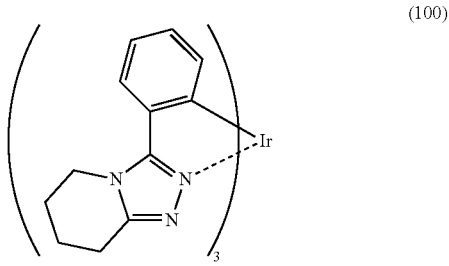

(100)

When this organometallic complex is analyzed by ToF-SIMS under conditions similar to the above, signals appear around m/z=104 and m/z=200, in addition to the signals around m/z=41 and m/z=55. The signal around m/z=200 is presumably derived from a protonated ion of 3-phenyl-5,6,7,8-tetrahydro-4H-1,2,4-triazolo[4,3-a]pyridine that is a ligand. The signal around m/z=104 is presumably derived from a fragment generated due to decomposition of 3-phenyl-5,6,7,8-tetrahydro-4H-1,2,4-triazolo[4,3-a]pyridine that is the ligand, or specifically, the signal is presumably derived from a Ph-C=N structure in which a —C=N group is bonded to a phenyl group. The Ph-C=N structure is presumably composed of the phenyl group of 3-phenyl-5,6,7,8-tetrahydro-4H-1,2,4-triazolo[4,3-a]pyridine, a carbon atom of the triazole skeleton to which the phenyl group is bonded, and a nitrogen atom of the triazole skeleton bonded to the carbon atom.

When the organometallic complex represented by Structural Formula (100) is analyzed by ToF-SIMS under conditions similar to the above, the strongest signal appears around m/z=589. This signal has the highest intensity among the signals observed by the measurement under the above conditions, and is derived from a product ion in which two ligands are coordinated to iridium. This signal is characteristic of the organometallic complex represented by Structural Formula (100).

The signals around m/z=41 and m/z=55 and the at least 10 signals appearing at intervals of m/z=12 to 14 in the range of m/z=250 to 500, which are referred to in the description of the measurement results of the organometallic complex represented by General Formula (G1) or (G2), also appear in the measurement results of the organometallic complex represented by Structural Formula (100).

Note that the at least 10 signals appearing at intervals of m/z=12 to 14 in the range of m/z=250 to 500 appear in the range of m/z=250 to 380 in the case of the organometallic complex represented by Structural Formula (100).

When the organometallic complex represented by Structural Formula (100) is analyzed by ToF-SIMS under conditions similar to the above, signals appear around m/z=388 and m/z=787. The signal around m/z=388 is derived from a skeleton in which one ligand (3-phenyl-5,6,7,8-tetrahydro-4H-1,2,4-triazolo[4,3-a]pyridine) is coordinated to iridium. The signal around m/z=787 is derived from the organometallic complex represented by Structural Formula (100).

Next, an example of a method for synthesizing an organometallic complex which is included in the light-emitting element in this embodiment is described.
<Method for Synthesizing 5-Aryl-4H-1,2,4-triazole Derivative Represented by General Formula (G0)>

First, an example of a method for synthesizing a 5-aryl-4H-1,2,4-triazole derivative represented by General Formula (G0) is described.

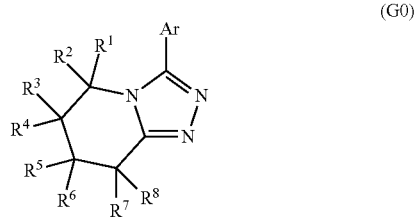

(G0)

In General Formula (G0), Ar represents a substituted or unsubstituted phenylene group or a substituted or unsubstituted naphthylene group. In the case where Ar has a substituent, an alkyl group having 1 to 4 carbon atoms, an alkoxy group having 1 to 4 carbon atoms, an alkylthio group having 1 to 4 carbon atoms, a haloalkyl group having 1 to 4 carbon atoms, a halogeno group, a phenyl group, and the like can be given as the substituent.

As shown in Scheme (a) below, the 5-aryl-4H-1,2,4-triazole derivative represented by General Formula (G0) can be obtained when aryl hydrazide (A1) and an O-methyl valerolactam derivative (A2) react with each other, for example.

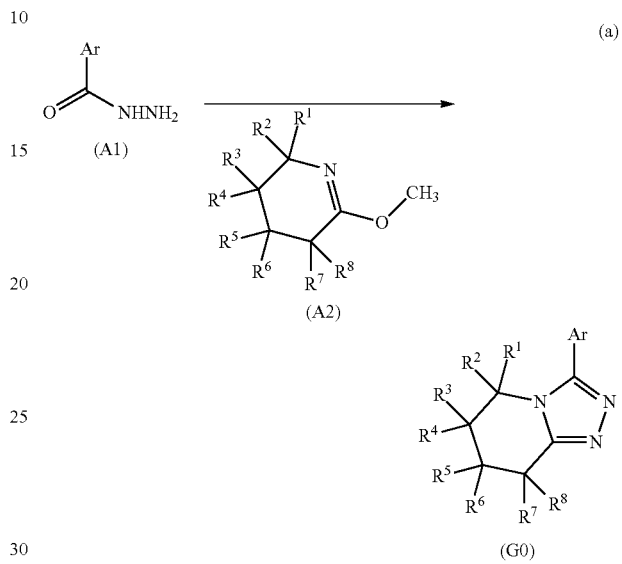

In (A1) in the above formula, Ar represents a substituted or unsubstituted phenylene group or a substituted or unsubstituted naphthylene group.

Note that various kinds of the above-described compounds (A1) and (A2) are commercially available or can be easily synthesized.

<Method for Synthesizing an Organometallic Complex of One Embodiment of the Present Invention, Represented by General Formula (G1)>

The organometallic complex of one embodiment of the invention, represented by General Formula (G1), can be synthesized by Synthesis Scheme (b). That is, the 5-aryl-4H-1,2,4-triazole derivative represented by General Formula (G0) is mixed with an iridium compound which contains a halogen (e.g., iridium chloride, iridium bromide, or iridium iodide) or with an iridium organometallic complex compound (e.g., an acetylacetonate complex or a diethylsulfide complex) and the mixture is then heated, so that the organometallic complex having the structure represented by General Formula (G1) can be obtained. Further, this heating process may be performed after the 5-aryl-4H-1,2,4-triazole derivative represented by General Formula (G0) and the iridium compound which contains a halogen or the iridium organometallic complex compound are dissolved in an alcohol-based solvent (e.g., glycerol, ethylene glycol, 2-methoxyethanol, or 2-ethoxyethanol). There is no particular limitation on a heating means, and an oil bath, a sand bath, or an aluminum block may be used. Alternatively, microwaves can be used as a heating means.

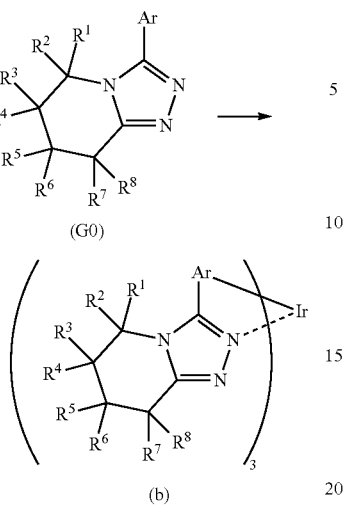
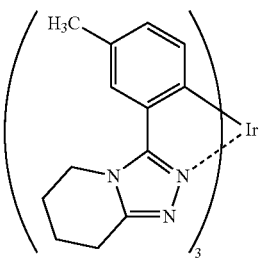
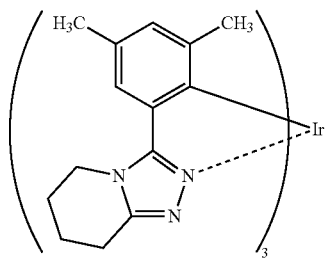
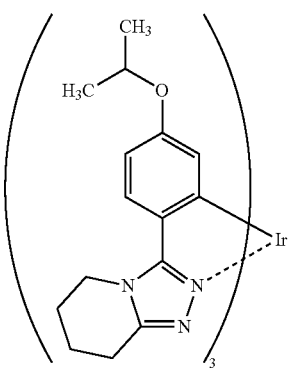

In Scheme (b), Ar represents a substituted or unsubstituted phenylene group or a substituted or unsubstituted naphthylene group. In the case where Ar has a substituent, an alkyl group having 1 to 4 carbon atoms, an alkoxy group having 1 to 4 carbon atoms, an alkylthio group having 1 to 4 carbon atoms, a haloalkyl group having 1 to 4 carbon atoms, a halogen, a phenyl group, and the like can be given as the substituent. Further, $R^1$ to $R^8$ separately represent hydrogen or an alkyl group having 1 to 4 carbon atoms.

As specific examples of organometallic complexes having the structure represented by General Formula (G1), organometallic complexes represented by Structural Formulae (100) to (124) can be given. Note that the present invention is not limited to the organometallic complexes represented by these structural formulae. Note that Structural Formulae (121) to (124) illustrate examples of organometallic complexes in which a ligand comprises an intramolecular bridge structure.

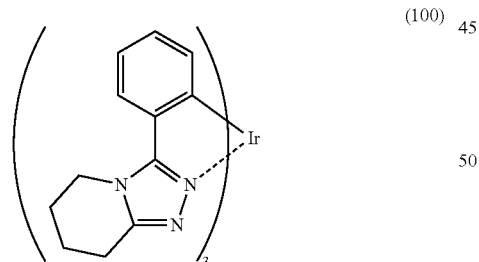
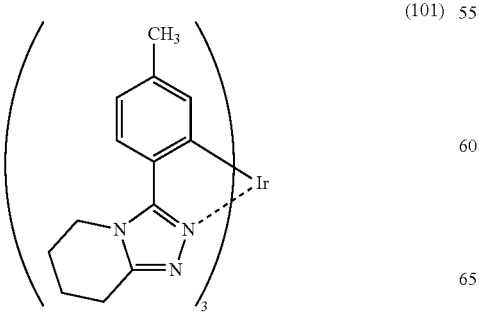
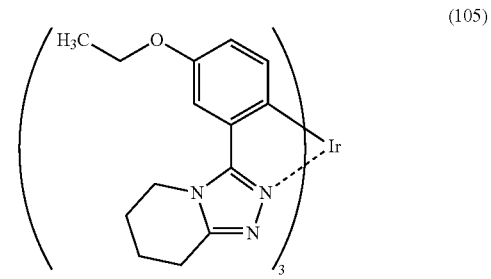
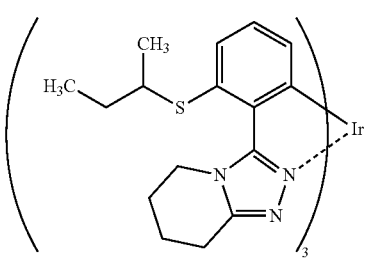

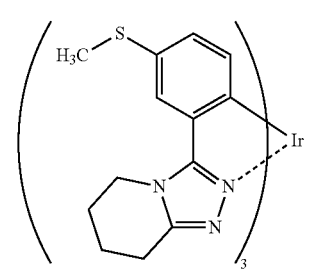 (107)
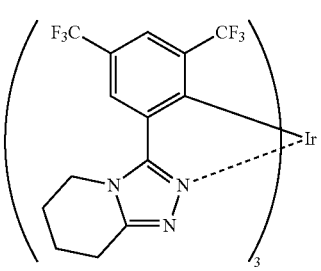 (108)
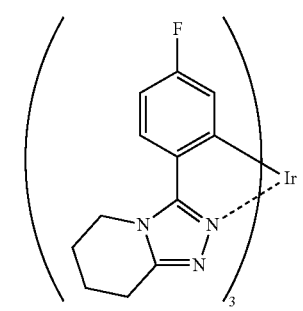 (109)
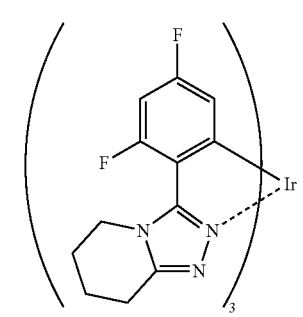 (110)
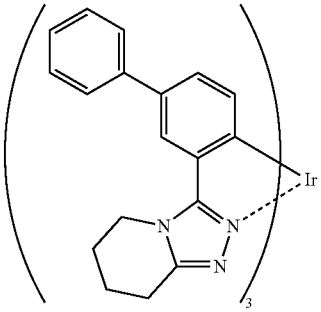 (111)
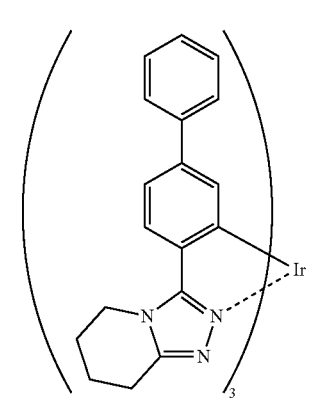 (112)
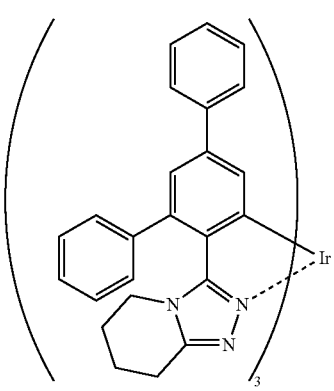 (113)
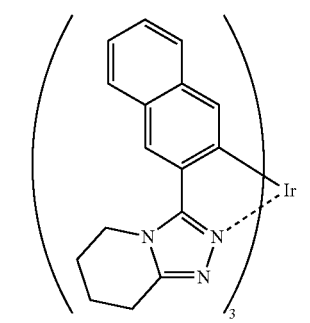 (114)
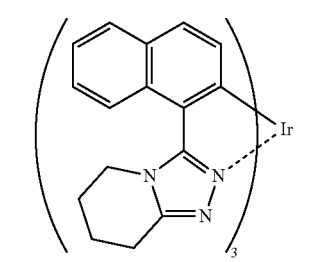 (115)
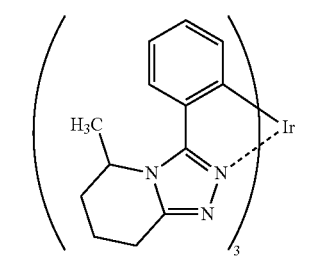 (116)

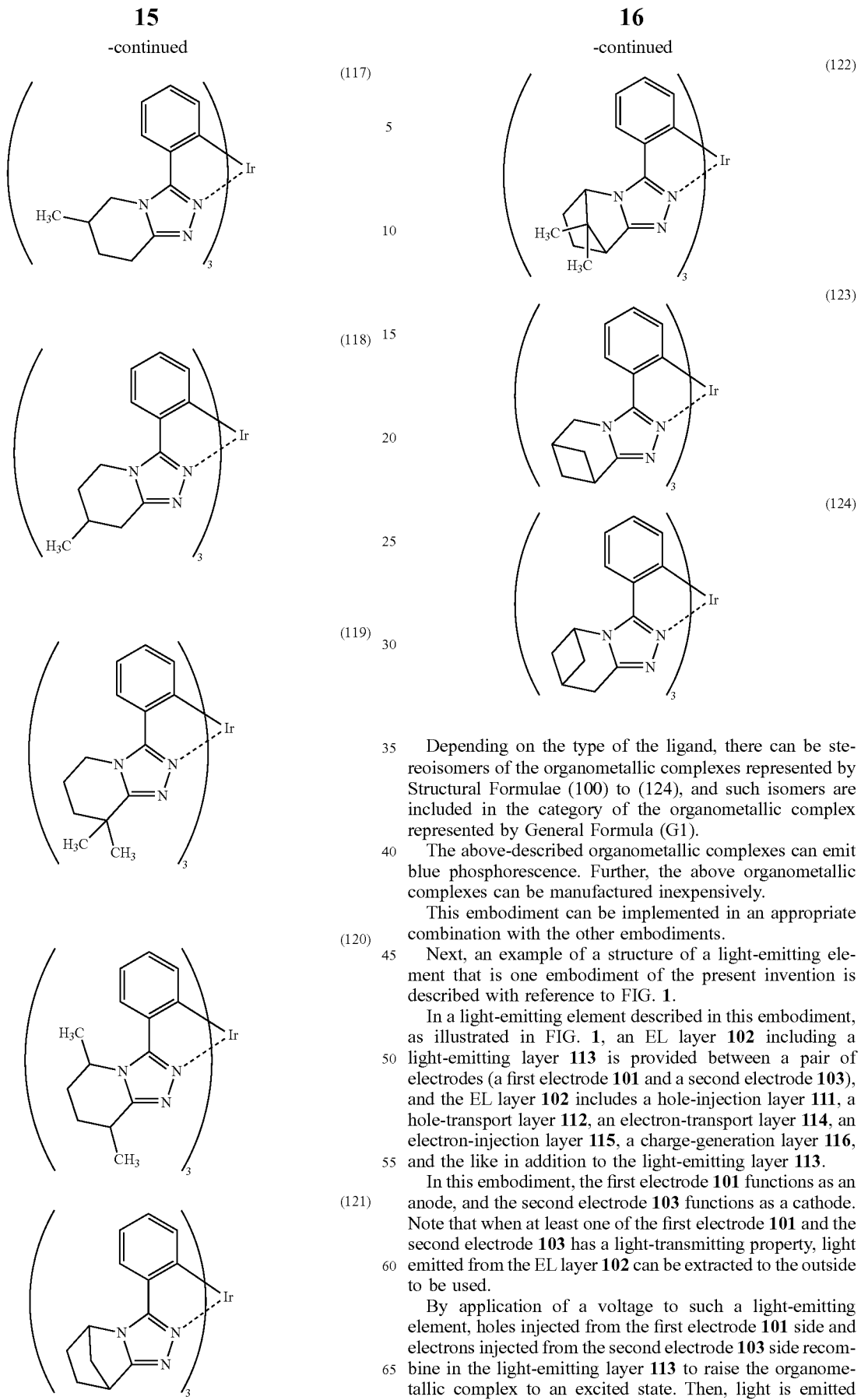

Depending on the type of the ligand, there can be stereoisomers of the organometallic complexes represented by Structural Formulae (100) to (124), and such isomers are included in the category of the organometallic complex represented by General Formula (G1).

The above-described organometallic complexes can emit blue phosphorescence. Further, the above organometallic complexes can be manufactured inexpensively.

This embodiment can be implemented in an appropriate combination with the other embodiments.

Next, an example of a structure of a light-emitting element that is one embodiment of the present invention is described with reference to FIG. 1.

In a light-emitting element described in this embodiment, as illustrated in FIG. 1, an EL layer 102 including a light-emitting layer 113 is provided between a pair of electrodes (a first electrode 101 and a second electrode 103), and the EL layer 102 includes a hole-injection layer 111, a hole-transport layer 112, an electron-transport layer 114, an electron-injection layer 115, a charge-generation layer 116, and the like in addition to the light-emitting layer 113.

In this embodiment, the first electrode 101 functions as an anode, and the second electrode 103 functions as a cathode. Note that when at least one of the first electrode 101 and the second electrode 103 has a light-transmitting property, light emitted from the EL layer 102 can be extracted to the outside to be used.

By application of a voltage to such a light-emitting element, holes injected from the first electrode 101 side and electrons injected from the second electrode 103 side recombine in the light-emitting layer 113 to raise the organometallic complex to an excited state. Then, light is emitted when the organometallic complex in the excited state returns to the ground state. Thus, the organometallic complex in one embodiment of the present invention functions as a light-emitting substance in the light-emitting element.

Note that the hole-injection layer 111 in the EL layer 102 is a layer containing a substance with a hole-injection property, or a layer including a composite material containing a substance with a hole-transport property and a substance exhibiting an acceptor property with respect to the substance with a hole-transport property. When the hole-injection layer is a layer including the composite material, electrons are extracted from the substance with a hole-transport property by the substance exhibiting an acceptor property and thus holes are generated. Thus, holes are easily injected from the hole-injection layer 111 into the light-emitting layer 113 through the hole-transport layer 112.

The above layer containing the composite material can be used as the charge-generation layer 116. Electrons are extracted from the substance having a hole-transport property by the substance exhibiting an acceptor property, and the extracted electrons are injected from the electron-injection layer 115 having an electron-injection property into the light-emitting layer 113 through the electron-transport layer 114. Note that the structure of the charge-generation layer is not limited to the above and the charge-generation layer can have any of the other known structures.

A specific example in which the light-emitting element described in this embodiment is fabricated is described below.

As the first electrode 101 and the second electrode 103, a metal, an alloy, an electrically conductive compound, a mixture thereof, and the like can be used.

It is preferred that the first electrode 101 as the anode be formed using any of metals, alloys, and conductive compounds with a high work function (specifically, 4.0 eV or higher), a mixture thereof, or the like. Specifically, for example, indium oxide-tin oxide (ITO: indium tin oxide), indium oxide-tin oxide containing silicon or silicon oxide, indium oxide-zinc oxide (indium zinc oxide), indium oxide containing tungsten oxide and zinc oxide (IWZO), or the like is given. Films of such conductive metal oxide are generally formed by a sputtering method. For example, indium oxide-zinc oxide can be formed by a sputtering method using a target obtained by adding 1 wt % to 20 wt % of zinc oxide to indium oxide. Moreover, indium oxide (IWZO) including tungsten oxide and zinc oxide can be formed by a sputtering method using a target in which 0.5 wt % to 5 wt % of tungsten oxide and 0.1 wt % to 1 wt % of zinc oxide with respect to indium oxide are included. Note that instead of a sputtering method, a sol-gel method or the like can be applied and used to form the first electrode 101. Besides, as a material used for the first electrode 101, the following can be given: gold (Au), platinum (Pt), nickel (Ni), tungsten (W), chromium (Cr), molybdenum (Mo), iron (Fe), cobalt (Co), copper (Cu), palladium (Pd), a nitride of a metal material (e.g., titanium nitride), and the like. Graphene can also be used.

For the cathode, any of metals, alloys, electrically conductive compounds, and mixtures thereof which have a low work function (specifically, a work function of 3.8 eV or less) or the like can be used. Specific examples of such a cathode material include elements that belong to Groups 1 and 2 of the periodic table such as lithium (Li), cesium (Cs), magnesium (Mg), calcium (Ca), and strontium (Sr), alloys thereof (e.g., MgAg or AlLi), rare earth metals such as europium (Eu) and ytterbium (Yb), alloys thereof, and the like. Any of a variety of conductive materials such as Al, Ag, ITO, indium oxide-tin oxide containing silicon or silicon oxide can be used for the cathode regardless of a work function when comprised in a stacked layer including a film of an alkali metal compound, an alkaline earth metal compound, or a rare earth metal compound (e.g., lithium fluoride (LiF), lithium oxide ($LiO_x$), cesium fluoride (CsF), calcium fluoride ($CaF_2$), or erbium fluoride ($ErF_3$)). Films of these conductive materials can be formed by a sputtering method, an ink-jet method, a spin coating method, or the like.

The hole-injection layer 111 is a layer which is provided in contact with an anode and contains a substance having a hole-injection property. The hole-injection layer 111 can be formed using molybdenum oxide, vanadium oxide, ruthenium oxide, tungsten oxide, manganese oxide, or the like. Alternatively, the hole-injection layer 111 can be formed using a phthalocyanine-based compound such as phthalocyanine (abbreviation: $H_2Pc$) or copper phthalocyanine (abbreviation: CuPc); an aromatic amine compound such as 4,4'-bis[N-(4-diphenylaminophenyl)-N-phenylamino]biphenyl (abbreviation: DPAB) or N,N'-bis{4-[bis(3-methylphenyl)amino]phenyl}-N,N'-diphenyl-[1,1'-biphenyl]-4,4'-diamine (abbreviation: DNTPD); a high molecule such as poly(3,4-ethylenedioxythiophene)/poly(styrenesulfonic acid) (PEDOT/PSS); or the like.

Alternatively, the hole-injection layer 111 can be formed using a composite material in which a substance exhibiting an acceptor property with respect to a substance having a hole-transport property is contained in the substance having a hole-transport property. Note that when the composite material in which a substance exhibiting an acceptor property is contained in a substance having a hole-transport property is provided in contact with the anode, a material for forming the anode can be selected regardless of its work function. In other words, besides a material with a high work function, a material with a low work function may also be used for the anode. As the substance exhibiting an acceptor property, 7,7,8,8-tetracyano-2,3,5,6-tetrafluoroquinodimethane (abbreviation: $F_4$-TCNQ), chloranil, or the like can be used, although it depends on the employed substance with a hole-transport property. In addition, a transition metal oxide can also be used. Moreover, oxides of metals that belong to Group 4 to Group 8 of the periodic table can also be used. Specifically, vanadium oxide, niobium oxide, tantalum oxide, chromium oxide, molybdenum oxide, tungsten oxide, manganese oxide, and rhenium oxide are preferable because their electron-accepting property is high. Among these, molybdenum oxide is especially preferable because it is stable in the air, has a low hygroscopic property, and is easily handled.

As the substance with a hole-transport property used for the composite material, any of a variety of compounds such as an aromatic amine compound, a carbazole derivative, an aromatic hydrocarbon, and a high molecular compound (e.g., an oligomer, a dendrimer, or a polymer) can be used. The organic compound used for the composite material is preferably an organic compound having a high hole-transport property. Specifically, a substance having a hole mobility of $10^{-6}$ $cm^2/Vs$ or higher is preferably used. However, another substance may be used instead of the above-described materials as long as the substance has a hole-transport property higher than an electron-transport property. The organic compounds that can be used for the composite material are specifically given below.

As the aromatic amine compounds, for example, there are N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'- biphenyl)-4,4'-diamine (abbreviation: DNTPD), and 1,3,5-tris[N-(4-diphenylaminophenyl)-N-phenylamino]benzene (abbreviation: DPA3B).

As the carbazole derivatives which can be used for the composite material, the followings are given specifically: 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like.

Other examples of the carbazole derivatives which can be used for the composite material include 4,4'-bis(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), and 1,4-bis[4-(N-carbazolyl)phenyl]-2,3,5,6-tetraphenylbenzene.

Examples of the aromatic hydrocarbon which can be used for the composite material include 2-tert-butyl-9,10-di(2-naphthyl)anthracene (abbreviation: t-BuDNA); 2-tert-butyl-9,10-di(1-naphthyl)anthracene; 9,10-bis(3,5-diphenylphenyl)anthracene (abbreviation: DPPA); 2-tert-butyl-9,10-bis(4-phenylphenyl)anthracene (abbreviation: t-BuDBA); 9,10-di(2-naphthyl)anthracene (abbreviation: DNA); 9,10-diphenylanthracene (abbreviation: DPAnth); 2-tert-butylanthracene (abbreviation: t-BuAnth); 9,10-bis(4-methyl-1-naphthyl)anthracene (abbreviation: DMNA); 2-tert-butyl-9,10-bis[2-(1-naphthyl)phenyl]anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene, and 2,5,8,11-tetra(tert-butyl)perylene. Besides those, pentacene, coronene, or the like can be used. In particular, the aromatic hydrocarbon which has a hole mobility of $1 \times 10^{-6}$ cm$^2$Vs or higher and which has 14 to 42 carbon atoms is particularly preferable.

The aromatic hydrocarbon which can be used for the composite material may have a vinyl skeleton. As the aromatic hydrocarbon having a vinyl group, 4,4'-bis(2,2-diphenylvinyl)biphenyl (abbreviation: DPVBi) and 9,10-bis[4-(2,2-diphenylvinyl)phenyl]anthracene (abbreviation: DPVPA) are given, for example.

Moreover, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide](abbreviation: PTPDMA), or poly[N,N'-bis(4-butylphenyl)-N,N'-bis(phenyl)benzidine](abbreviation: Poly-TPD) can also be used.

Note that a layer formed using such a composite material can be very suitably used for optical design that is performed to control the light extraction efficiency, directivity, or the like of light emitted from the light-emitting layer 113 because the drive voltage hardly varies even when the layer formed using the composite material is formed to be thick or thin.

The hole-transport layer 112 is formed using a substance with a hole-transport property. As a substance with a hole-transport property, for example, aromatic amine compounds such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), and 4-phenyl-4'-(9-phenylfluoren-9-yl)triphenylamine (abbreviation: BPAFLP) can be used. The substances mentioned here are mainly ones that have a hole mobility of $10^{-6}$ cm$^2$/Vs or higher. Any of the organic compounds given above as examples of the substance having a hole-transport property in the composite material can also be used for the hole-transport layer 112. However, another substance may be used instead of the above-described materials as long as the substance has a hole-transport property higher than an electron-transport property. The layer containing a substance with a hole-transport property is not limited to a single layer, and a stacked layer in which two or more layers containing any of the above-described substances are stacked may be used.

Further, for the hole-transport layer 112, a high molecular compound such as poly(N-vinylcarbazole) (abbreviation: PVK), or poly(4-vinyltriphenylamine) (abbreviation: PVTPA) can be used.

The light-emitting layer 113 is a layer containing the organometallic complex represented by General Formula (G1). To prevent a problem such as concentration quenching, the organometallic complex is preferably dispersed in an appropriate host material. A substance having higher triplet excitation energy than this organometallic complex is preferably used as the host material.

Preferable examples of the substance (i.e., host material) used for dispersing the above organometallic complex include a compound having an aryl amine skeleton such as tri{4-[N-(3-methylphenyl)-N-phenyl]amino}phenylamine (abbreviation: MTDATA); a carbazole derivative such as CBP, 1,3-bis(N-carbazolyl)benzene (abbreviation: mCP), 4,4'-bis(carbazol-9-yl)-2,2'-dimethylbiphenyl (abbreviation: CDBP), and 4,4',4''-tris(N-carbazolyl)triphenylamine (abbreviation: TCTA); a nitrogen-containing heterocyclic compound; a thiophene derivative; a furan derivative; and a metal complex of zinc, aluminum, or the like. It is also possible to use a high molecular compound such as PVK, a polyparaphenylenevinylene derivative, a polyparaphenylene derivative, a polyfluorene derivative, or a poly(spirofluorene) derivative, or a dendrimer.

Note that in the case where the light-emitting layer 113 contains the above-described organometallic complex (guest material) and the host material, green to blue phosphorescence with high emission efficiency can be obtained from the light-emitting layer 113.

The electron-transport layer 114 is a layer containing a substance having an electron-transport property. For the electron-transport layer 114, metal complexes such as Alq$_3$, tris(4-methyl-8-quinolinolato)aluminum (abbreviation: Almq$_3$), bis(10-hydroxybenzo[h]quinolinato)beryllium (abbreviation: BeBq$_2$), BAlq, Zn(BOX)$_2$, or bis[2-(2-hydroxyphenyl)benzothiazolato]zinc (abbreviation: Zn(BTZ)$_2$) can be used. Alternatively, a heteroaromatic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4'-tert-butylphenyl)-4-phenyl-5-(4''-biphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), or 4,4'-bis(5-methylbenzoxazol-2-yl)stilbene (abbreviation: BzOs) can be used. Further alternatively, a high molecular compound such as poly(2,5-pyridinediyl) (abbreviation: PPy), poly[(9,9-dihexylfluorene-2,7-diyl)-co-(pyridine-3,5-diyl)](abbreviation: PF-Py), or poly[(9,9-dioctylfluorene-2,7-diyl)-co-(2,2'-bipyridine-6,6'-diyl)](abbreviation: PF-BPy) can be used. The substances described here are mainly ones having an electron mobility of $10^{-6}$ cm$^2$/Vs or higher. Note that other than these substances, any substance that has an electron-transport property higher than a hole-transport property may be used for the electron-transport layer.

Further, the electron-transport layer 114 is not limited to a single layer, and a stacked layer in which two or more layers containing any of the above-described substances are stacked may be used.

The electron-injection layer 115 is a layer containing a substance having an electron-injection property. For the electron-injection layer 115, an alkali metal, an alkaline earth metal, or a compound thereof, such as lithium fluoride (LiF), cesium fluoride (CsF), calcium fluoride (CaF$_2$), or lithium oxide (LiO$_x$), can be used. Alternatively, a rare earth metal compound such as erbium fluoride (ErF$_3$) can be used. Further alternatively, the substances for forming the electron-transport layer 114, which are described above, can be used.

Alternatively, a composite material in which an organic compound and an electron donor (donor) are mixed may be used for the electron-injection layer 115. Such a composite material is excellent in an electron-injection property and an electron-transport property because electrons are generated in the organic compound by the electron donor. In this case, the organic compound is preferably a material excellent in transporting the generated electrons. Specifically, for example, the substances for forming the electron-transport layer 114 (e.g., a metal complex and a heteroaromatic compound), which are described above, can be used. As the electron donor, a substance exhibiting an electron-donating property with respect to the organic compound may be used. Specifically, an alkali metal, an alkaline earth metal, and a rare earth metal are preferable, and lithium, cesium, magnesium, calcium, erbium, ytterbium, and the like are given. In addition, alkali metal oxide or alkaline earth metal oxide such as lithium oxide, calcium oxide, barium oxide, and the like can be given. A Lewis base such as magnesium oxide can alternatively be used. An organic compound such as tetrathiafulvalene (abbreviation: TTF) can alternatively be used.

Note that each of the above-described hole-injection layer 111, hole-transport layer 112, light-emitting layer 113, electron-transport layer 114, electron-injection layer 115, and charge-generation layer 116 can be formed by a method such as an evaporation method (e.g., a vacuum evaporation method), an ink-jet method, or a coating method.

In the above-described light-emitting element, current flows due to a potential difference generated between the first electrode 101 and the second electrode 103 and holes and electrons recombine in the EL layer 102, whereby light is emitted. Then, the emitted light is extracted outside through one or both of the first electrode 101 and the second electrode 103. Therefore, one or both of the first electrode 101 and the second electrode 103 are electrodes having a light-transmitting property.

The above-described light-emitting element can emit phosphorescence originating from the organometallic complex and thus can have higher efficiency than a light-emitting element using a fluorescent compound.

Note that the light-emitting element described in this embodiment is an example of a light-emitting element fabricated using the organometallic complex that is one embodiment of the present invention. Further, as a light-emitting device including the above light-emitting element, a passive matrix light-emitting device and an active matrix light-emitting device can be fabricated. It is also possible to fabricate a light-emitting device with a microcavity structure including a light-emitting element, which is different from the above light-emitting elements, described in another embodiment. Each of the above light-emitting devices is included in the present invention.

Note that there is no particular limitation on the structure of the TFT in the case of fabricating the active matrix light-emitting device. For example, a staggered TFT or an inverted staggered TFT can be used as appropriate. Further, a driver circuit formed over a TFT substrate may be formed of both an n-channel TFT and a p-channel TFT or only either an n-channel TFT or a p-channel TFT. Furthermore, there is also no particular limitation on crystallinity of a semiconductor film used for the TFT. For example, an amorphous semiconductor film, a crystalline semiconductor film, an oxide semiconductor film, or the like can be used.

Note that the structure described in this embodiment can be combined as appropriate with any of the structures described in the other embodiments.

[Embodiment 2]

In this embodiment, as one embodiment of the present invention, a light-emitting element in which two or more kinds of organic compounds as well as the phosphorescent organometallic iridium complex represented by General Formula (G1) in Embodiment 1 are used for a light-emitting layer will be described.

Figure 2:
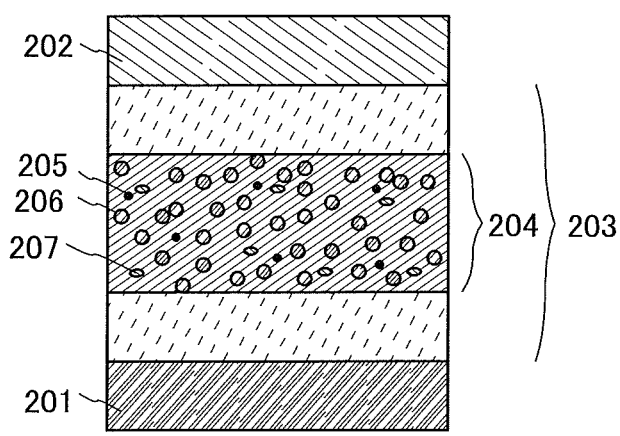
FIG. 2 illustrates a light-emitting element of one embodiment of the present invention.

A light-emitting element described in this embodiment includes an EL layer 203 between a pair of electrodes (a first electrode 201 and a second electrode 202) as illustrated in FIG. 2. Note that the EL layer 203 includes at least a light-emitting layer 204 and may include a hole-injection layer, a hole-transport layer, an electron-transport layer, an electron-injection layer, a charge-generation layer, and the like. Note that the hole-injection layer, the hole-transport layer, the electron-transport layer, the electron-injection layer, and the charge-generation layer have structures similar to the hole-injection layer 111, the hole-transport layer 112, the electron-transport layer 114, the electron-injection layer 115, and the charge-generation layer 116, respectively, which are described in Embodiment 1.

In this embodiment, the first electrode 201 functions as an anode, and the second electrode 202 functions as a cathode. Note that structures of the first electrode 201 and the second electrode 202 can be similar to those of the first electrode 101 and the second electrode 103 described in Embodiment 2.

The light-emitting layer 204 described in this embodiment contains a phosphorescent compound 205 using the organometallic complex described in Embodiment 1, a first organic compound 206 and a second organic compound 207. Note that the phosphorescent compound 205 is a guest material in the light-emitting layer 204. Moreover, one of the first organic compound 206 and the second organic compound 207, the content of which is higher than that of the other in the light-emitting layer 204, is a host material in the light-emitting layer 204.

When the light-emitting layer 204 has the structure in which the guest material is dispersed in the host material, crystallization of the light-emitting layer can be inhibited. Further, it is possible to inhibit concentration quenching due to high concentration of the guest material, and thus the light-emitting element can have higher emission efficiency.

It is preferable that a triplet excitation energy level (T$_1$ level) of each of the first organic compound 206 and the second organic compound 207 be higher than that of the phosphorescent compound 205. The reason for this is that when the $T_1$ level of the first organic compound 206 or the second organic compound 207 is lower than that of the phosphorescent compound 205, the triplet excitation energy of the phosphorescent compound 205, which contributes to light emission, is transferred to the first organic compound 206 or the second organic compound 207 and accordingly the emission efficiency decreases.

Here, it is preferable that an emission spectrum of a host material (a fluorescence spectrum or a phosphorescence spectrum) have a large overlap with an absorption spectrum of a guest material (specifically, a spectrum in an absorption band on the longest wavelength (lowest energy) side).

However, in general, it is difficult to obtain an overlap between a fluorescence spectrum of a host material and an absorption spectrum in an absorption band on the longest wavelength (lowest energy) side of a guest material. The reason for this is that fluorescence is emitted from an energy level higher than that of phosphorescence, and the $T_1$ level of a host material whose fluorescence spectrum has a wavelength close to an absorption spectrum of a guest material on the longest wavelength side is lower than the $T_1$ level of the guest material.

Thus, in this embodiment, a combination of the first organic compound 206 and the second organic compound 207 forms an exciplex (also referred to as excited complex). In that case, the first organic compound 206 and the second organic compound 207 form an exciplex by obtaining energy by recombination of electrons and holes at the time of recombination of carriers (electrons and holes) in the light-emitting layer 204. Fluorescence from the exciplex has a spectrum on a longer wavelength side than a fluorescence spectrum of the first organic compound 206 alone or the second organic compound 207 alone. Therefore, while the $T_1$ levels of the first organic compound and the second organic compound are kept higher than the $T_1$ level of the guest material, the fluorescence can overlap with the absorption band of the guest material on a longer wavelength side, which can maximize energy transfer from a singlet excited state.

For the phosphorescent compound 205, the phosphorescent organometallic iridium complex described in Embodiment 1 is used. The combination of the first organic compound 206 and the second organic compound 207 which forms an exciplex is employed; a combination of a compound which easily accepts electrons (a compound having an electron-trapping property) and a compound which easily accepts holes (a compound having a hole-trapping property) is preferably employed.

Examples of the compound which easily accepts electrons include, but not limited to, the following: 2-[3-(dibenzothiophen-4-yl)phenyl]dibenzo[f,h]quinoxaline (abbreviation: 2mDBTPDBq-II), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), and 6-[3-(dibenzothiophen-4-yl)phenyl]dibenzo[f,h]quinoxaline (abbreviation: 6mDBTPDBq-II).

Examples of the compound which easily accepts holes include, but not limited to, the following: 4-phenyl-4'-(9-phenyl-9H-carbazol-3-yl)triphenylamine (abbreviation: PCBA1BP), 3-[N-(1-naphthyl)-N-(9-phenylcarbazol-3-yl)amino]-9-phenylcarbazole (abbreviation: PCzPCN1), 4,4',4"-tris[N-(1-naphthyl)-N-phenylamino]triphenylamine (abbreviation: 1'-TNATA), 2,7-bis[N-(4-diphenylaminophenyl)-N-phenylamino]-spiro-9,9'-bifluorene (abbreviation: DPA2SF), N,N'-bis(9-phenylcarbazol-3-yl)-N,N'-diphenylbenzene-1,3-diamine (abbreviation: PCA2B), N-(9,9-dimethyl-2-diphenylamino-9H-fluoren-7-yl)diphenylamine (abbreviation: DPNF), N,N',N"-triphenyl-N,N',N"-tris(9-phenylcarbazol-3-yl)benzene-1,3,5-triamine (abbreviation: PCA3B), 2-[N-(9-phenylcarbazol-3-yl)-N-phenylamino]spiro-9,9'-bifluorene (abbreviation: PCASF), 2-[N-(4-diphenylaminophenyl)-N-phenylamino]spiro-9,9'-bifluorene (abbreviation: DPASF), N,N'-bis[4-(carbazol-9-yl)phenyl]-N,N'-diphenyl-9,9-dimethylfluorene-2,7-diamine (abbreviation: YGA2F), N,N'-bis(3-methylphenyl)-N,N'-diphenyl-[1,1'-biphenyl]-4,4'-diamine (abbreviation: TPD), 4,4'-bis[N-(4-diphenylaminophenyl)-N-phenylamino]biphenyl (abbreviation: DPAB), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), 3-[N-(9-phenylcarbazol-3-yl)-N-phenylamino]-9-phenylcarbazole (abbreviation: PCzPCA1), 3-[N-(4-diphenylaminophenyl)-N-phenylamino]-9-phenylcarbazole (abbreviation: PCzDPA 1), 3,6-bis[N-(4-diphenylaminophenyl)-N-phenylamino]-9-phenylcarbazole (abbreviation: PCzDPA2), N,N'-bis{4-[bis(3-methylphenyl)amino]phenyl}-N,N'-diphenyl-(1,1'-biphenyl)-4,4'-diamine (abbreviation: DNTPD), 3,6-bis[N-(4-diphenylaminophenyl)-N-(1-naphthyl)amino]-9-phenylcarbazole (abbreviation: PCzTPN2), and 3,6-bis[N-(9-phenylcarbazol-3-yl)-N-phenylamino]-9-phenylcarbazole (abbreviation: PCzPCA2).

As for the above-described first and second organic compounds 206 and 207, the present invention is not limited to the above examples. The combination is determined so that an exciplex can be formed, the emission spectrum of the exciplex overlaps with the absorption spectrum of the phosphorescent compound 205, and the peak of the emission spectrum of the exciplex has a longer wavelength than the peak of the absorption spectrum of the phosphorescent compound 205.

Note that in the case where a compound which easily accepts electrons and a compound which easily accepts holes are used for the first organic compound 206 and the second organic compound 207, carrier balance can be controlled by the mixture ratio of the compounds, which enables the position of a light emission region to be easily adjusted.

In the light-emitting element described in this embodiment, energy transfer efficiency can be improved owing to energy transfer utilizing an overlap between an emission spectrum of an exciplex and an absorption spectrum of a phosphorescent compound; accordingly, it is possible to achieve high external quantum efficiency of the light-emitting element.

Note that in another structure of the present invention, the light-emitting layer 204 can be formed using a host molecule having a hole-trapping property and a host molecule having an electron-trapping property as the two kinds of organic compounds other than the phosphorescent compound 205 that is the guest material so that a phenomenon (guest coupled with complementary hosts: GCCH) occurs in which holes and electrons are introduced to guest molecules existing in the two kinds of host molecules and the guest molecules are brought into an excited state.

At this time, the host molecule having a hole-trapping property and the host molecule having an electron-trapping property can be respectively selected from the above-described compounds which easily accept holes and the above-described compounds which easily accept electrons.

As a light-emitting device including the above light-emitting element, a passive matrix light-emitting device and an active matrix light-emitting device can be fabricated. It is also possible to fabricate a light-emitting device with a microcavity structure including a light-emitting element, which is different from the above light-emitting elements, described in another embodiment. Each of the above light-emitting devices is included in the present invention.

Note that there is no particular limitation on the structure of the TFT in the case of fabricating the active matrix light-emitting device. For example, a staggered TFT or an inverted staggered TFT can be used as appropriate. Further, a driver circuit formed over a TFT substrate may be formed of both an n-channel TFT and a p-channel TFT or only either an n-channel TFT or a p-channel TFT. Furthermore, there is also no particular limitation on crystallinity of a semiconductor film used for the TFT. For example, an amorphous semiconductor film, a crystalline semiconductor film, an oxide semiconductor film, or the like can be used.

Note that the structure described in this embodiment can be combined as appropriate with any of the structures described in the other embodiments.

[Embodiment 3]

In this embodiment, as one embodiment of the present invention, a light-emitting element (hereinafter referred to as tandem light-emitting element) which includes a plurality of EL layers and a charge-generation layer provided therebetween will be described.

Figure 3A:
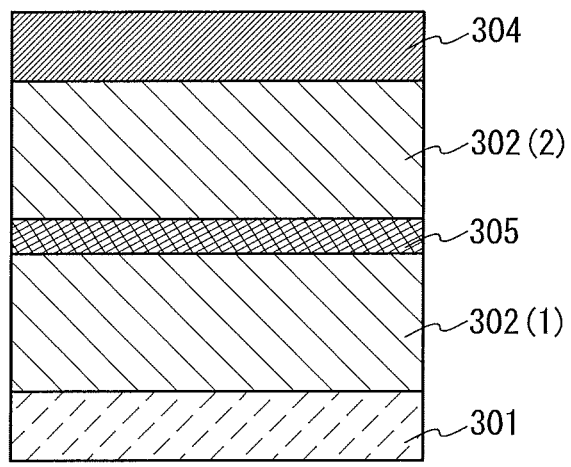
FIGS. 3A and 3B each illustrate a light-emitting element of one embodiment of the present invention.

A light-emitting element described in this embodiment is a tandem light-emitting element including a plurality of EL layers (a first EL layer 302(1) and a second EL layer 302(2)) between a pair of electrodes (a first electrode 301 and a second electrode 304) as illustrated in FIG. 3A.

In this embodiment, the first electrode 301 functions as an anode, and the second electrode 304 functions as a cathode. Note that the first electrode 301 and the second electrode 304 can have structures similar to those of the first electrode 101 and the second electrode 103 which are described in Embodiment 1.

In addition, although the plurality of EL layers (the first EL layer 302(1) and the second EL layer 302(2)) may have a structure similar to that of the EL layer described in Embodiment 1 or 2, any of the EL layers may have a structure similar to that of the EL layer described in Embodiment 1 or 2. In other words, the structures of the first EL layer 302(1) and the second EL layer 302(2) may be the same or different from each other and can be similar to those of the EL layers described in Embodiment 1 or 2.

Further, a charge-generation layer 305 is provided between the EL layers (the first EL layer 302(1) and the second EL layer 302(2)). The charge-generation layer 305 has a function of injecting electrons into one of the EL layers and injecting holes into the other of the EL layers when a voltage is applied between the first electrode 301 and the second electrode 304. For example, when a voltage is applied to the first electrode 301 such that the potential of the first electrode 301 is higher than that of the second electrode 304, the charge-generation layer 305 injects electrons into the first EL layer 302(1) and injects holes into the second EL layer 302(2).

Note that in terms of light extraction efficiency, the charge-generation layer 305 preferably has a light-transmitting property with respect to visible light (specifically, the charge-generation layer 305 has a visible light transmittance of 40% or more). Further, the charge-generation layer 305 functions even if it has lower conductivity than the first electrode 301 or the second electrode 304.

The charge-generation layer 305 may have either a structure (the composite material described in Embodiment 1) in which an electron acceptor (acceptor) is added to an organic compound having a hole-transport property or a structure in which an electron donor (donor) is added to an organic compound having an electron-transport property. Alternatively, both of these structures may be stacked.

In the case of the structure in which an electron acceptor is added to an organic compound having a hole-transport property, as the organic compound having a hole-transport property, for example, an aromatic amine compound such as NPB, TPD, TDATA, MTDATA, or 4,4'-bis[N-(spiro-9,9'-bifluoren-2-yl)-N-phenylamino]biphenyl (abbreviation: BSPB), or the like can be used. The substances mentioned here are mainly ones that have a hole mobility of $10^{-6}$ $cm^2/Vs$ or higher. However, substances other than the above substances may be used as long as they are organic compounds having a hole-transport property higher than an electron-transport property.

Further, as the electron acceptor, 7,7,8,8-tetracyano-2,3,5,6-tetrafluoroquinodimethane (abbreviation: $F_4$-TCNQ), chloranil, or the like can be used. Alternatively, a transition metal oxide can be used. Further alternatively, an oxide of metals that belong to Group 4 to Group 8 of the periodic table can be used. Specifically, vanadium oxide, niobium oxide, tantalum oxide, chromium oxide, molybdenum oxide, tungsten oxide, manganese oxide, and rhenium oxide are preferable because their electron-accepting property is high. Among these, molybdenum oxide is especially preferable because it is stable in the air, has a low hygroscopic property, and is easily handled.

Note that the structure in which an electron acceptor is added to an organic compound having a hole-transport property corresponds to the composite material described in Embodiment 1, and a structure similar to the composite material described in Embodiment 1 can be used; thus, the description is not repeated here. The description of the composite material in Embodiment 1 can be referred to.

On the other hand, in the case of the structure in which an electron donor is added to an organic compound having an electron-transport property, as the organic compound having an electron-transport property for example, a metal complex having a quinoline skeleton or a benzoquinoline skeleton, such as Alq, $Almq_3$, $BeBq_2$, or BAlq, or the like can be used. Alternatively, it is possible to use a metal complex having an oxazole-based ligand or a thiazole-based ligand, such as $Zn(BOX)_2$ or $Zn(BTZ)_2$, or the like. Further alternatively, instead of a metal complex, it is possible to use PBD, OXD-7, TAZ, BPhen, BCP, or the like. The substances mentioned here are mainly ones that have an electron mobility of $10^{-6}$ $cm^2/Vs$ or higher. Note that substances other than the above substances may be used as long as they are organic compounds having an electron-transport property higher than a hole-transport property.

As the electron donor, it is possible to use an alkali metal, an alkaline earth metal, a rare earth metal, a metal belonging to Group 13 of the periodic table, or an oxide or carbonate thereof. Specifically, it is preferable to use lithium (Li), cesium (Cs), magnesium (Mg), calcium (Ca), ytterbium (Yb), indium (In), lithium oxide, cesium carbonate, or the like. Alternatively, an organic compound such as tetrathianaphthacene may be used as the electron donor.

Note that forming the charge-generation layer 305 by using any of the above materials can inhibit an increase in drive voltage caused by the stack of the EL layers.

Figure 3B:
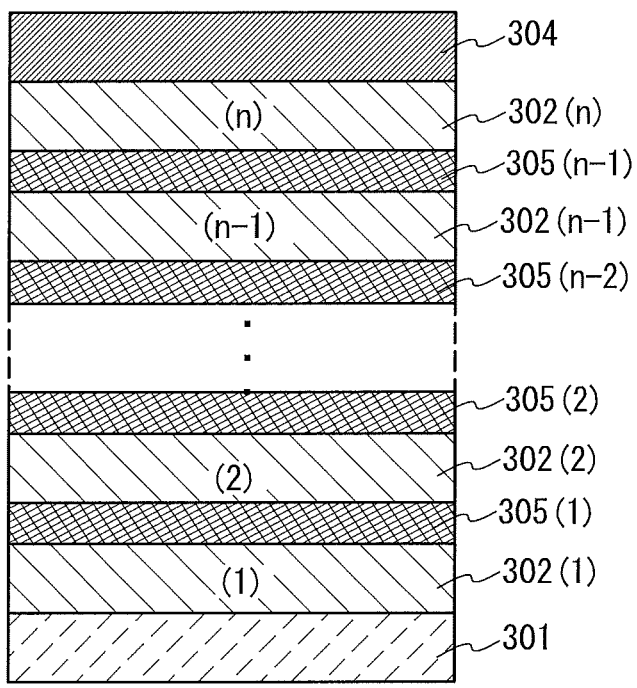

Although FIG. 3A illustrates the light-emitting element having two EL layers, the present invention can be similarly applied to a light-emitting element in which n EL layers (n is a natural number of three or more) are stacked as illustrated in FIG. 3B. In the case where a plurality of EL layers are included between a pair of electrodes as in the light-emitting element of this embodiment, provision of charge-generation layers between the EL layers can inhibit an increase in current density and enables the light-emitting element to emit light with high luminance and to have a long lifetime. In addition, a low power consumption light-emitting device which can be driven at low voltage can be achieved.

By making the EL layers emit light of different colors from each other, the light-emitting element can provide light emission of a desired color as a whole. For example, by forming a light-emitting element having two EL layers such that the emission color of the first EL layer and the emission color of the second EL layer are complementary colors, the light-emitting element can provide white light emission as a whole. Note that the word "complementary" means color relationship in which an achromatic color is obtained when colors are mixed. In other words, emission of white light can be obtained by mixture of light emitted from substances whose emission colors are complementary colors.

Further, the same can be applied to a light-emitting element having three EL layers. For example, the light-emitting element as a whole can provide white light emission when the emission color of the first EL layer is red, the emission color of the second EL layer is green, and the emission color of the third EL layer is blue.

Note that the structure described in this embodiment can be combined as appropriate with any of the structures described in the other embodiments.

[Embodiment 4]

In this embodiment, as a light-emitting device using a phosphorescent light-emitting element which is one embodiment of the present invention, a light-emitting device using the organometallic complex in Embodiment 1 will be described.

Figure 4:
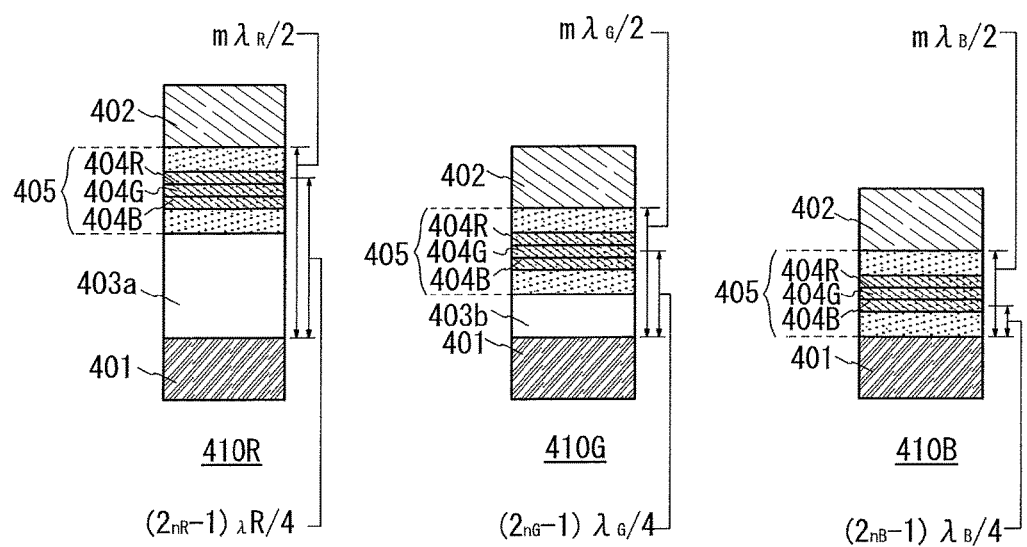
FIG. 4 illustrates light-emitting elements of one embodiment of the present invention.

A light-emitting device described in this embodiment has a micro optical resonator (microcavity) structure in which a light resonant effect between a pair of electrodes is utilized. The light-emitting device includes a plurality of light-emitting elements each of which has at least an EL layer 405 between a pair of electrodes (a reflective electrode 401 and a semi-transmissive and semi-reflective electrode 402) as illustrated in FIG. 4. Further, the EL layer 405 includes at least a light-emitting layer 404 serving as a light-emitting region and may further include a hole-injection layer, a hole-transport layer, an electron-transport layer, an electron-injection layer, a charge-generation layer, and the like. Note that the light-emitting layer 404 contains the organometallic complex described in Embodiment 1.

In this embodiment, a light-emitting device is described which includes light-emitting elements (a first light-emitting element 410R, a second light-emitting element 410G, and a third light-emitting element 410B) having different structures as illustrated in FIG. 4.

The first light-emitting element 410R has a structure in which a first transparent conductive layer 403a, an EL layer 405, and a semi-transmissive and semi-reflective electrode 402 are sequentially stacked over a reflective electrode 401. The second light-emitting element 410G has a structure in which a second transparent conductive layer 403b, the EL layer 405, and the semi-transmissive and semi-reflective electrode 402 are sequentially stacked over the reflective electrode 401. The third light-emitting element 410B has a structure in which the EL layer 405 and the semi-transmissive and semi-reflective electrode 402 are sequentially stacked over the reflective electrode 401.

Note that the reflective electrode 401, the EL layer 405, and the semi-transmissive and semi-reflective electrode 402 are common to the light-emitting elements (the first light-emitting element 41 OR, the second light-emitting element 410 and the third light-emitting element 410B).

Further, the EL layer 405 includes a first light-emitting layer 404B, a second light-emitting layer 404G, and a third light-emitting layer 404R. Note that the first light-emitting layer 404B emits light having a peak at a wavelength of $\lambda_B$. The second light-emitting layer 404G emits light having a peak at a wavelength of $\lambda_G$. The third light-emitting layer 404R emits light having a peak at a wavelength of $\lambda_R$. Thus, from each of the light-emitting elements (the first light-emitting element 410R, the second light-emitting element 410G, and the third light-emitting element 410B), light emitted from the first light-emitting layer 404B, light emitted from the second light-emitting layer 404G, and light emitted from the third light-emitting layer 404R which overlap with each other can be obtained. Note that the above wavelengths satisfy the relation of $\lambda_B<\lambda_G<\lambda_R$.

Each of the light-emitting elements described in this embodiment has a structure in which the EL layer 405 is provided between the reflective electrode 401 and the semi-transmissive and semi-reflective electrode 402. Light emitted in all directions from the light-emitting layers included in the EL layer 405 is resonated by the reflective electrode 401 and the semi-transmissive and semi-reflective electrode 402 which function as a micro optical resonator (microcavity). Note that the reflective electrode 401 is formed using a conductive material having reflectivity, and a film whose visible light reflectivity is 40% to 100%, preferably 70% to 100%, and whose resistivity is $1\times10^{-2}$ Ωcm or lower is used. In addition, the semi-transmissive and semi-reflective electrode 402 is formed using a conductive material having reflectivity and a light-transmitting property, and a film whose visible light reflectivity is 20% to 80%, preferably 40% to 70%, and whose resistivity is $1\times10^{-2}$ Ωcm or lower is used.

In this embodiment, the thicknesses of the transparent conductive layers (the first transparent conductive layer 403a and the second transparent conductive layer 403b) provided in the first light-emitting element 410R and the second light-emitting element 410G respectively, are varied between the light-emitting elements, whereby the light-emitting elements differ in the optical path length from the reflective electrode 401 to the semi-transmissive and semi-reflective electrode 402. In other words, in the case of light emitted from the light-emitting layers of each of the light-emitting elements, thus having a broad emission spectrum, light with a wavelength that is resonated between the reflective electrode 401 and the semi-transmissive and semi-reflective electrode 402 can be enhanced while light with a wavelength that is not resonated therebetween can be attenuated. Thus, when the elements differ in the optical path length from the reflective electrode 401 to the semi-transmissive and semi-reflective electrode 402, light with different wavelengths can be enhanced to be extracted.

Note that the optical path length (also referred to as optical distance) is expressed as a product of an actual distance and a refractive index, and in this embodiment, is a product of an actual thickness and n (refractive index). That is, the following relation is satisfied: optical path length=actual thickness×n.

Note that the optical path length from the reflective electrode 401 to the semi-transmissive and semi-reflective electrode 402 is set to $m\lambda_R/2$ (m is a natural number of 1 or more) in the first light-emitting element 410R; the optical path length from the reflective electrode 401 to the semi-transmissive and semi-reflective electrode 402 is set to $m\lambda_G/2$ (m is a natural number of 1 or more) in the second light-emitting element 410G; and the optical path length from the reflective electrode 401 to the semi-transmissive and semi-reflective electrode 402 is set to $m\lambda_B/2$ (in is a natural number of 1 or more) in the third light-emitting element 410B.

In this manner, the light ($\lambda_R$) emitted from the third light-emitting layer 404R included in the EL layer 405 is mainly enhanced to be extracted from the first light-emitting element 410R, the light ($\lambda_G$) emitted from the second light-emitting layer 404G included in the EL layer 405 is mainly enhanced to be extracted from the second light-emitting element 410G; and the light ($\lambda_B$) emitted from the first light-emitting layer 404B included in the EL layer 405 is mainly enhanced to be extracted from the third light-emitting element 410B. Note that the light extracted from each of the light-emitting elements is emitted from the semi-transmissive and semi-reflective electrode 402 side.

Note that in the above structure, strictly speaking, the optical path length from the reflective electrode 401 to the semi-transmissive and semi-reflective electrode 402 can be the length from a reflection region in the reflective electrode 401 to a reflection region in the semi-transmissive and semi-reflective electrode 402. However, it is difficult to precisely determine the positions of the reflection regions in the reflective electrode 401 and the semi-transmissive and semi-reflective electrode 402; therefore, it is assumed that the above effect can be sufficiently obtained wherever the reflection regions may be set in the reflective electrode 401 and the semi-transmissive and semi-reflective electrode 402.

Further, the optical path length from the reflective electrode 401 to the third light-emitting layer 404R is preferably adjusted to $(2n_R-1)\lambda_R/4$, where $n_R$ is a natural number of 1 or more, because in the first light-emitting element 410R, light (first reflected light) that is reflected by the reflective electrode 401 of the light emitted from the third light-emitting layer 404R considerably interferes with light (first incident light) that directly enters the semi-transmissive and semi-reflective electrode 402 from the third light-emitting layer 404R. By adjusting the optical path length, the phases of the first reflected light and the first incident light can be aligned with each other and the light emitted from the third light-emitting layer 404R can be further amplified.

Note that strictly speaking, the optical path length from the reflective electrode 401 to the third light-emitting layer 404R can be the optical path length from a reflection region in the reflective electrode 401 to a light-emitting region in the third light-emitting layer 404R. However, it is difficult to precisely determine the positions of the reflection region in the reflective electrode 401 and the light-emitting region in the third light-emitting layer 404R; therefore, it is assumed that the above effect can be sufficiently obtained wherever the reflection region and the light-emitting region may be set in the reflective electrode 401 and the third light-emitting layer 404R, respectively.

Next, the optical path length of the second light-emitting element 410G which emits light with the wavelength of $\lambda_G$ and that of the light-emitting element 410B which emits light with the wavelength of $\lambda_B$ are adjusted in a manner similar to the optical path length of light-emitting element 410R, whereby light emitted from each of the light-emitting elements can be amplified.

Note that although each of the light-emitting elements in the above-described structure includes a plurality of light-emitting layers in the EL layer, the present invention is not limited thereto; for example, the structure of the tandem light-emitting element which is described in Embodiment 3 can be combined, in which case a plurality of EL layers are provided so that a charge-generation layer is provided therebetween in one light-emitting element and one or more light-emitting layers are formed in each of the EL layers.

The light-emitting device described in this embodiment has a microcavity structure, in which light with wavelengths which differ depending on the light-emitting element can be extracted even when they include the same EL layer, so that it is not needed to form light-emitting elements for the colors of R, G and B. Therefore, the above structure is advantageous for improvement of yield and an increase of resolution. Further, with the use of color filters at the same time, light with higher purity can be obtained and the light-emitting device can have high color reproductivity. In addition, emission intensity with a predetermined wavelength in the front direction can be increased, whereby power consumption can be reduced. The above structure is particularly useful in the case of being applied to a color display (image display device) including pixels of three or more colors but may also be applied to lighting or the like.

[Embodiment 5]

In this embodiment, a light-emitting device including a light-emitting element in which an organometallic complex that is one embodiment of the present invention is used for a light-emitting layer will be described.

The light-emitting device can be either a passive matrix light-emitting device or an active matrix light-emitting device. Note that any of the light-emitting elements described in the other embodiments can be applied to the light-emitting device described in this embodiment.

In this embodiment, an active matrix light-emitting device is described with reference to FIGS. 5A and 5B.

Figure 5A:
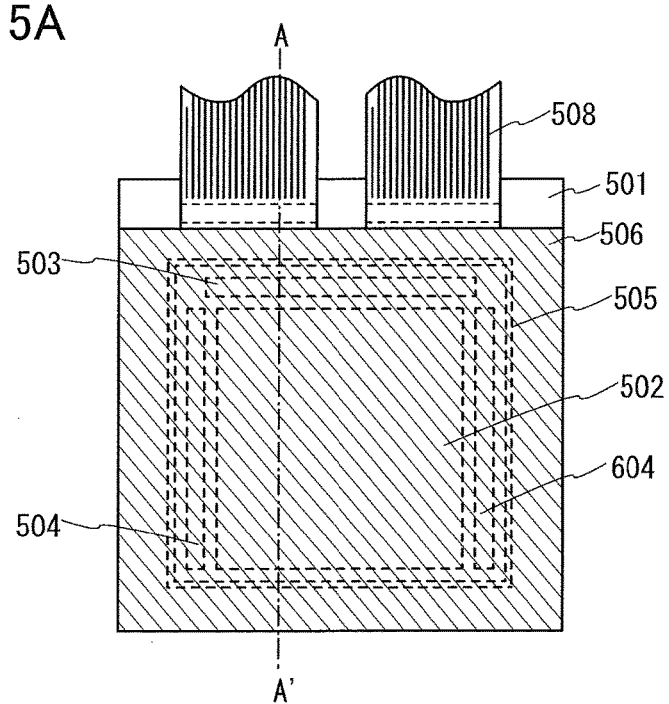
FIGS. 5A and 5B illustrate an active matrix light-emitting device.
Figure 5B:
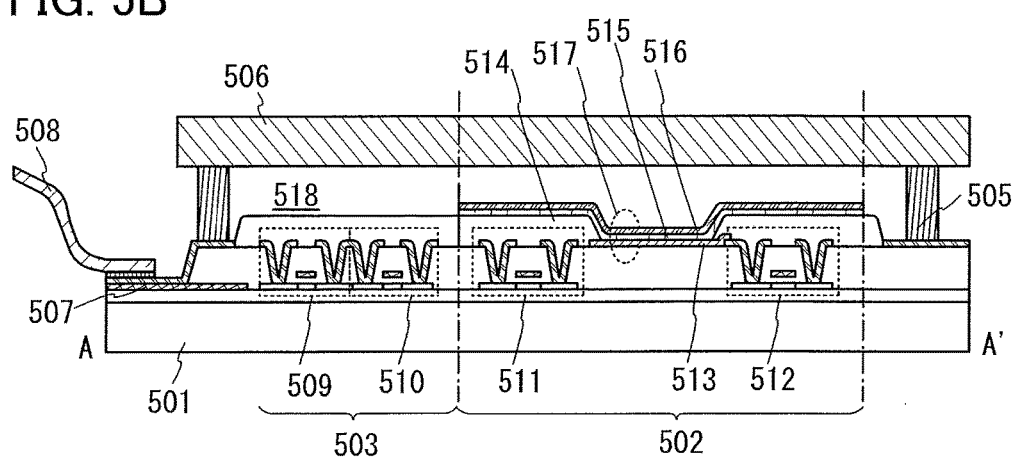

Note that FIG. 5A is a top view illustrating a light-emitting device and FIG. 5B is a cross-sectional view taken along chain line A-A' in FIG. 5A. The active matrix light-emitting device of this embodiment includes a pixel portion 502 provided over an element substrate 501, a driver circuit portion (a source line driver circuit) 503, and a driver circuit portion (a gate line driver circuit) 504. The pixel portion 502, the driver circuit portion 503, and the driver circuit portion 504 are sealed between the element substrate 501 and a sealing substrate 506 by a sealant 505.

In addition, a lead wiring 507 is provided over the element substrate 501. The lead wiring 507 is provided for connecting an external input terminal through which a signal (e.g., a video signal, a clock signal, a start signal, and a reset signal) or a potential from the outside is transmitted to the driver circuit portion 503 and the driver circuit portion 504. Here is shown an example in which a flexible printed circuit (FPC) 508 is provided as the external input terminal. Although the FPC 508 is illustrated alone, this FPC may be provided with a printed wiring board (PWB). The light-emitting device in the present specification includes, in its category, not only the light-emitting device itself but also the light-emitting device provided with the FPC or the PWB.

Next, a cross-sectional structure is described with reference to FIG. 5B. The driver circuit portion and the pixel portion are formed over the element substrate 501; here are illustrated the driver circuit portion 503 which is the source line driver circuit and the pixel portion 502.

The driver circuit portion 503 is an example where a CMOS circuit is formed, which is a combination of an n-channel TFT 509 and a p-channel TFT 510. Note that a circuit included in the driver circuit portion may be formed using various CMOS circuits, PMOS circuits, or NMOS circuits. Although this embodiment shows a driver integrated type in which the driver circuit is formed over the substrate, the driver circuit is not necessarily formed over the substrate, and the driver circuit can be formed outside, not over the substrate.

The pixel portion 502 is formed of a plurality of pixels each of which includes a switching TFT 511, a current control TFT 512, and a first electrode 513 which is electrically connected to a wiring (a source electrode or a drain electrode) of the current control TFT 512. Note that an insulator 514 is formed to cover end portions of the first electrode 513. In this embodiment, the insulator 514 is formed using a positive photosensitive acrylic resin.

The insulator 514 preferably has a curved surface with curvature at an upper end portion or a lower end portion thereof in order to obtain favorable coverage by a film which is to be stacked over the insulator 514. For example, in the case of using a positive photosensitive acrylic resin as a material for the insulator 514, the insulator 514 preferably has a curved surface with a radius of curvature (0.2 µm to 3 µm) at the upper end portion. Note that the insulator 514 can be formed using either a negative photosensitive resin or a positive photosensitive resin. The material of the insulator 514 is not limited to an organic compound and an inorganic compound such as silicon oxide or silicon oxynitride can also be used.

An EL layer 515 and a second electrode 516 are stacked over the first electrode 513. In the EL layer 515, at least a light-emitting layer is provided which contains the organometallic complex described in Embodiment 1. Further, in the EL layer 515, a hole-injection layer, a hole-transport layer, an electron-transport layer, an electron-injection layer, a charge-generation layer, and the like can be provided as appropriate in addition to the light-emitting layer.

A light-emitting element 517 is formed of a stacked structure of the first electrode 513, the EL layer 515, and the second electrode 516. For the first electrode 513, the EL layer 515, and the second electrode 516, the materials described in Embodiment 2 can be used. Although not illustrated, the second electrode 516 is electrically connected to an FPC 508 which is an external input terminal.

Note that in this embodiment, the first electrode 513 functions as an anode, and the second electrode 516 functions as a cathode.

Although the cross-sectional view of FIG. 5B illustrates only one light-emitting element 517, a plurality of light-emitting elements are arranged in matrix in the pixel portion 502. Light-emitting elements which provide three kinds of light emission (R, G, and B) are selectively formed in the pixel portion 502, whereby a light-emitting device capable of full color display can be fabricated. Alternatively, a light-emitting device which is capable of full color display may be fabricated by a combination with color filters.

Further, the sealing substrate 506 is attached to the element substrate 501 with the sealant 505, whereby a light-emitting element 517 is provided in a space 518 surrounded by the element substrate 501, the sealing substrate 506, and the sealant 505. The space 518 may be filled with an inert gas (such as nitrogen or argon), or the sealant 505.

An epoxy-based resin or glass frit is preferably used for the sealant 505. It is preferable that such a material do not transmit moisture or oxygen as much as possible. It is also preferable to form a multiple sealing structure by providing another sealant outside the sealant 505.

As the sealing substrate 506, a glass substrate, a quartz substrate, or a plastic substrate formed of fiber reinforced plastic (FRP), poly(vinyl fluoride) (PVF), polyester, acrylic, or the like can be used.

As described above, an active matrix light-emitting device can be obtained.

Note that the structure described in this embodiment can be combined as appropriate with any of the structures described in the other embodiments.

[Embodiment 6]

In this embodiment, examples of a variety of electronic devices which are completed using a light-emitting device, which is fabricated using the light-emitting element of one embodiment of the invention, will be described with reference to FIGS. 6A to 6D.

Examples of the electronic devices to which the light-emitting device is applied are a television device (also referred to as television or television receiver), a monitor of a computer or the like, a camera such as a digital camera or a digital video camera, a digital photo frame, a mobile phone (also referred to as cellular phone or cellular phone device), a portable game machine, a portable information terminal, an audio reproducing device, and a large-sized game machine such as a pachinko machine. Specific examples of these electronic devices are illustrated in FIGS. 6A to 6D.

Figure 6A:
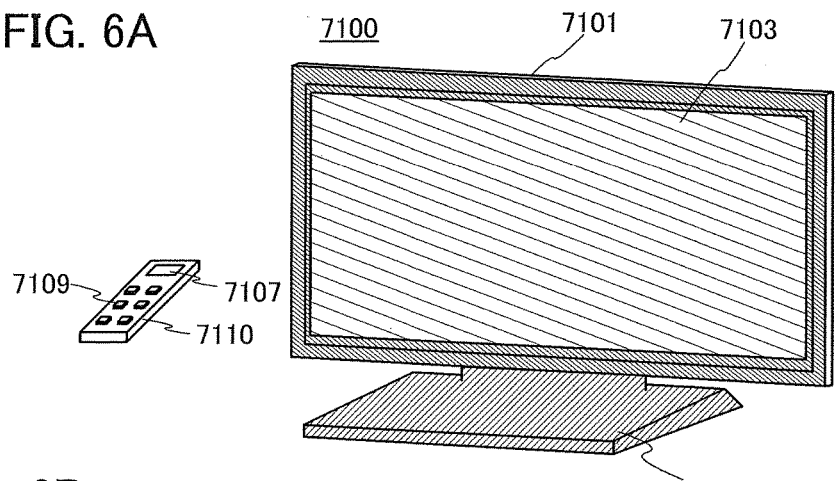
FIGS. 6A to 6D illustrate electronic devices.

FIG. 6A illustrates an example of a television set. In a television set 7100, a display portion 7103 is incorporated in a housing 7101. Images can be displayed on the display portion 7103, and the light-emitting device can be used for the display portion 7103. In addition, here, the housing 7101 is supported by a stand 7105.

Operation of the television set 7100 can be performed with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television set 7100 is provided with a receiver, a modem, and the like. With the receiver, a general television broadcast can be received. Furthermore, when the television set 7100 is connected to a communication network by wired or wireless connection via the modem, one-way (from a transmitter to a receiver) or two-way (between a transmitter and a receiver, between receivers, or the like) data communication can be performed.

Figure 6B:
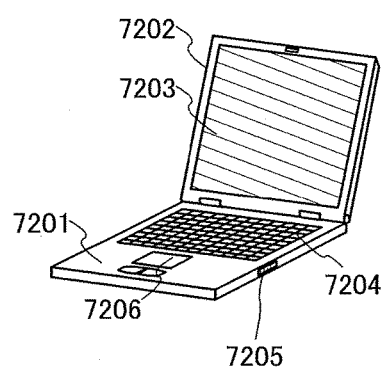

FIG. 6B illustrates a computer having a main body 7201, a housing 7202, a display portion 7203, a keyboard 7204, an external connection port 7205, a pointing device 7206, and the like. Note that this computer is fabricated using the light-emitting device for the display portion 7203.

Figure 6C:
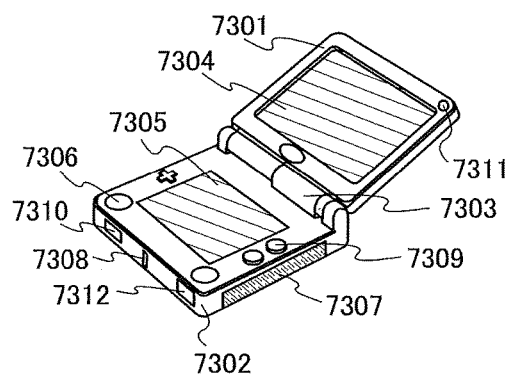

FIG. 6C illustrates a portable game machine having two housings, a housing 7301 and a housing 7302, which are connected with a joint portion 7303 so that the portable game machine can be opened or folded. A display portion 7304 is incorporated in the housing 7301, and a display portion 7305 is incorporated in the housing 7302. In addition, the portable game machine illustrated in FIG. 6C includes a speaker portion 7306, a recording medium insertion portion 7307, an LED lamp 7308, an input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 7312), and the like. Needless to say, the structure of the portable game machine is not limited to the above as long as the light-emitting device is used for at least one of the display portion 7304 and the display portion 7305, and may include other accessories as appropriate. The portable game machine illustrated in FIG. 6C has a function of reading out a program or data stored in a storage medium to display it on the display portion, and a function of sharing information with another portable game machine by wireless communication. Note that a function of the portable game console illustrated in FIG. 6C is not limited to those described above, and the portable game console can have a variety of functions.

Figure 6D:
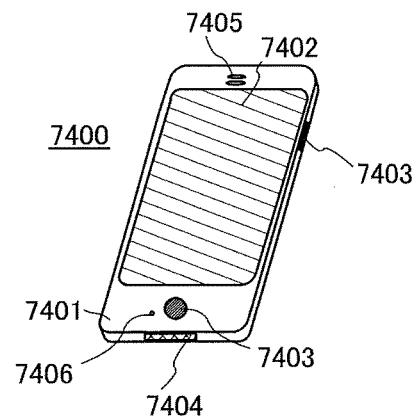

FIG. 6D illustrates an example of a mobile phone. A mobile phone 7400 is provided with a display portion 7402 incorporated in a housing 7401, operation buttons 7403, an external connection port 7404, a speaker 7405, a microphone 7406, and the like. Note that the mobile phone 7400 is fabricated using the light-emitting device for the display portion 7402.

When the display portion 7402 of the mobile phone 7400 illustrated in FIG. 6D is touched with a finger or the like, data can be input to the mobile phone 7400. Further, operations such as making a call and composing e-mail can be performed by touching the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing e-mail, a text input mode mainly for inputting text is selected for the display portion 7402 so that text displayed on the screen can be input. In this case, it is preferable to display a keyboard or number buttons on almost the entire screen of the display portion 7402.

When a detection device including a sensor for detecting inclination, such as a gyroscope or an acceleration sensor, is provided inside the mobile phone 7400, display on the screen of the display portion 7402 can be automatically switched by determining the orientation of the mobile phone 7400 (whether the mobile phone is placed horizontally or vertically for a landscape mode or a portrait mode).

The screen modes are switched by touching the display portion 7402 or operating the operation buttons 7403 of the housing 7401. The screen modes can also be switched depending on the kind of image displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken when the display portion 7402 is touched with the palm or the finger, whereby personal authentication can be performed. Further, by providing a backlight or a sensing light source which emits near-infrared light in the display portion, an image of a finger vein, a palm vein, or the like can be taken.

As described above, the electronic devices can be obtained by application of the light-emitting device that is one embodiment of the present invention. The light-emitting device has a remarkably wide application range, and can be applied to electronic devices in a variety of fields.

Note that the structure described in this embodiment can be combined as appropriate with any of the structures described in the other embodiments.

[Embodiment 7]

In this embodiment, examples of a lighting device to which a light-emitting device including an organometallic complex that is one embodiment of the present invention is applied will be described with reference to FIG. 7.

Figure 7:
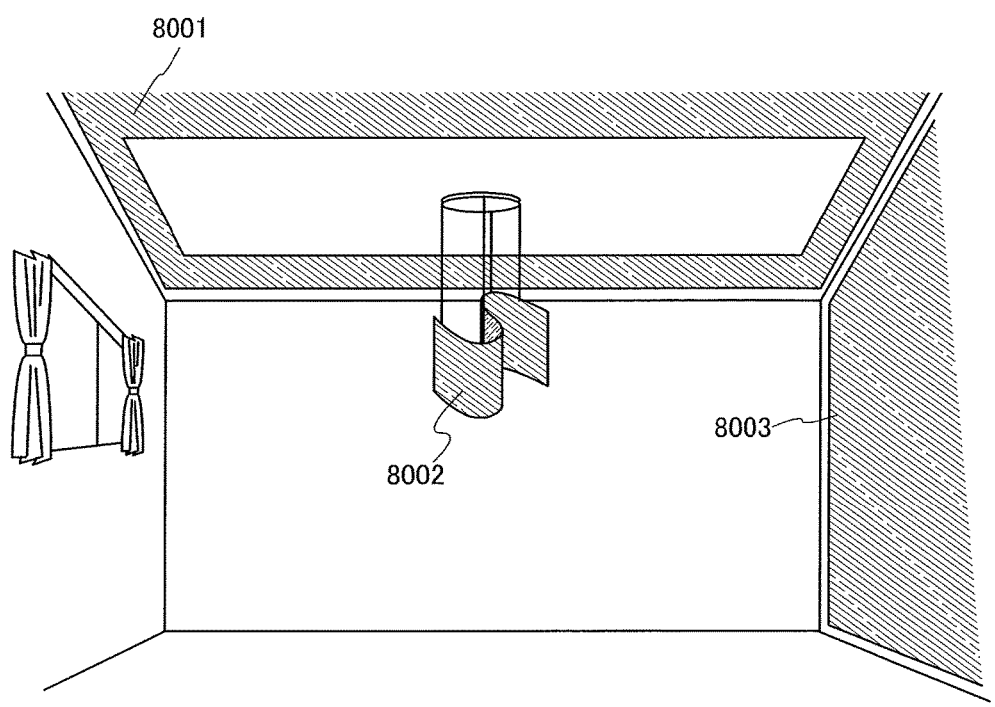
FIG. 7 illustrates lighting devices.

FIG. 7 illustrates an example in which the light-emitting device is used as an indoor lighting device 8001. Since the light-emitting device can have a large area, it can be used for a lighting device having a large area. In addition, a lighting device 8002 in which a light-emitting region has a curved surface can also be obtained with the use of a housing with a curved surface. A light-emitting element included in the light-emitting device described in this embodiment is in a thin film form, which allows the housing to be designed more freely. Therefore, the lighting device can be elaborately designed in a variety of ways. Further, a wall of the room may be provided with a large-sized lighting device 8003.

Moreover, when the light-emitting device is used for a table by being used as a surface of a table, a lighting device 8004 which has a function as a table can be obtained. When the light-emitting device is used as part of other furniture, a lighting device which has a function as the furniture can be obtained.

In this manner, a variety of lighting devices to which the light-emitting device is applied can be obtained. Note that such lighting devices are also embodiments of the present invention.

Note that the structure described in this embodiment can be combined as appropriate with any of the structures described in the other embodiments.

[Embodiment 8]

Figure 8:
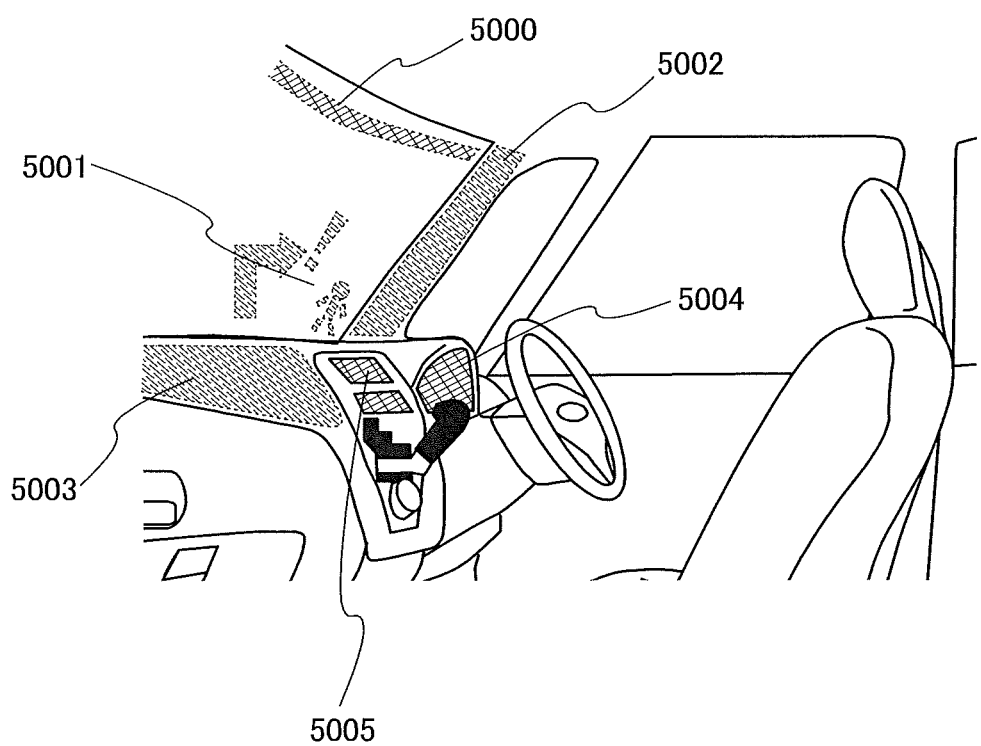
FIG. 8 illustrates examples of a vehicle-mounted display device of one embodiment of the present invention.

The light-emitting element including the organometallic complex of one embodiment of the present invention can also be used in an automobile windshield or an automobile dashboard. FIG. 8 illustrates one mode in which the light-emitting element of one embodiment of the present invention is used for an automobile windshield and an automobile dashboard. Displays 5000 to 5005 each include the light-emitting element of one embodiment of the present invention.

The displays 5000 and 5001 are display devices which are provided in the automobile windshield and in which light-emitting elements each of which is one embodiment of the present invention are incorporated. The light-emitting element of one embodiment of the present invention can be formed into what is called a see-through display device, through which the opposite side can be seen, by including a first electrode and a second electrode formed with electrodes having a light-transmitting property. Such see-through display devices can be provided even in the automobile windshield without hindering the vision. Further, for example, in the case where a transistor for driving the light-emitting element is provided, it is preferable to use a transistor having a light-transmitting property, such as an organic transistor using an organic semiconductor material or a transistor using an oxide semiconductor.

The display 5002 is a display device which is provided in a pillar portion and in which the light-emitting elements each of which is one embodiment of the present invention are incorporated. An image taken by an imaging unit provided in the car body is shown in the display 5002, whereby the view hindered by the pillar portion can be compensated for. Similarly, the display 5003 provided in the dashboard can compensate for the view hindered by the car body by showing an image taken by an imaging unit provided in the outside of the car body, which leads to elimination of blind areas and enhancement of safety. Showing an image so as to compensate for the area which a driver cannot see, makes it possible for the driver to confirm safety easily and comfortably.

A variety of kinds of information such as information of navigation, speedometer, tachometer, mileage, fuel meter, gearshift indicator, and air condition can be shown in the displays 5004 and 5005. The contents or layout of the display can be changed by a user as appropriate. Further, such information can be shown in the displays 5000 to 5003. Note that the displays 5000 to 5005 can also be used as lighting devices.

The light-emitting element of one embodiment of the present invention can have high emission efficiency and low power consumption. Moreover, the light-emitting element can be fabricated inexpensively. Therefore, even when a large number of large screens are provided as in the displays 5000 to 5005, load on a battery can be reduced, which provides comfortable use. Thus, the light-emitting device or the lighting device using the light-emitting element of one embodiment of the present invention can be suitably used as an in-vehicle light-emitting device or an in-vehicle lighting device. Further, the light-emitting device and the lighting device can be mounted inexpensively.

[Embodiment 9]

In this embodiment, a light-emitting device fabricated using the light-emitting element of one embodiment of the present invention will be described with reference to FIGS. 18A and 18B.

Figure 18A:
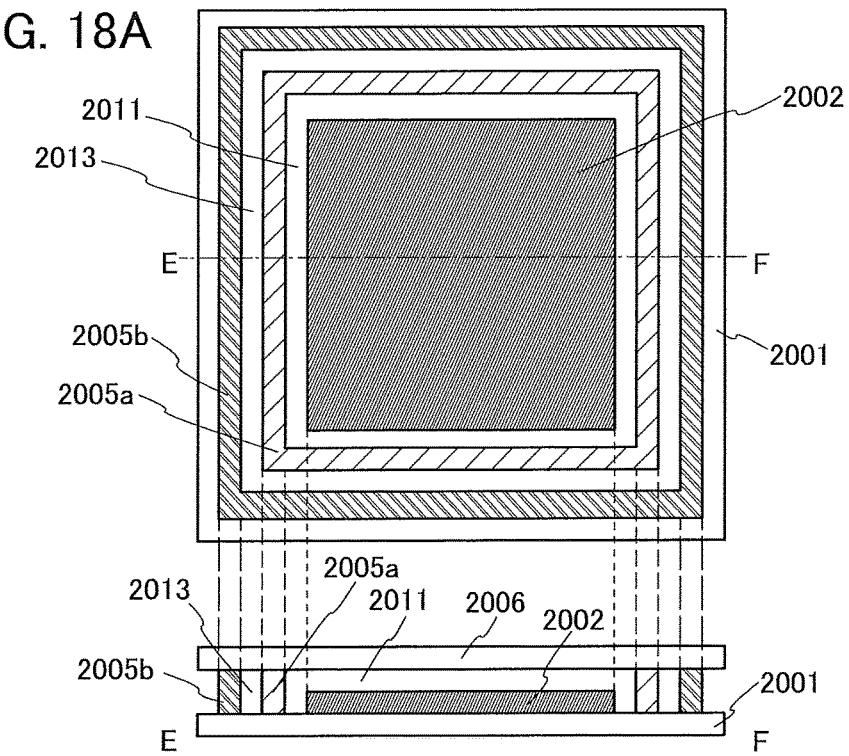
FIGS. 18A and 18B each illustrate a light-emitting device of one embodiment of the present invention.

In FIG. 18A, a plan view of a light-emitting device described in this embodiment and a cross-sectional view taken along dashed-dotted line E-F in the plan view are illustrated.

The light-emitting device illustrated in FIG. 18A includes a light-emitting portion 2002 including a light-emitting element over a first substrate 2001. The light-emitting device has a structure in which a first sealant 2005a is provided so as to surround the light-emitting portion 2002 and a second sealant 2005b is provided so as to surround the first sealant 2005a (i.e., a double sealing structure).

Thus, the light-emitting portion 2002 is positioned in a space surrounded by the first substrate 2001, the second substrate 2006, and the first sealant 2005a.

Note that in this specification, the first sealant 2005a and the second sealant 2005b are not necessarily in contact with the first substrate 2001 and the second substrate 2006. For example, the first sealant 2005a may be in contact with an insulating film or a conductive film formed over the first substrate 2001.

In the above structure, the first sealant 2005a is a resin layer containing a desiccant and the second sealant 2005b is a glass layer, whereby an effect of inhibiting entry of impurities such as moisture and oxygen from the outside (hereinafter, referred to as a sealing property) can be increased.

The first sealant 2005a is the resin layer as described above, whereby the glass layer that is the second sealant 2005b can be prevented from having breaking or cracking (hereinafter, collectively referred to as a crack). Further, in the case where the sealing property of the second sealant 2005b is not sufficient, even when impurities such as moisture and oxygen enter a first space 2013, entry of the impurities such as moisture and oxygen into a second space 2011 can be inhibited owing to a high sealing property of the first sealant 2005a. Thus, deterioration of an organic compound, a metal material, and the like contained in the light-emitting element because of entry of impurities such as moisture and oxygen into the light-emitting portion 2002 can be inhibited.

Figure 18B:
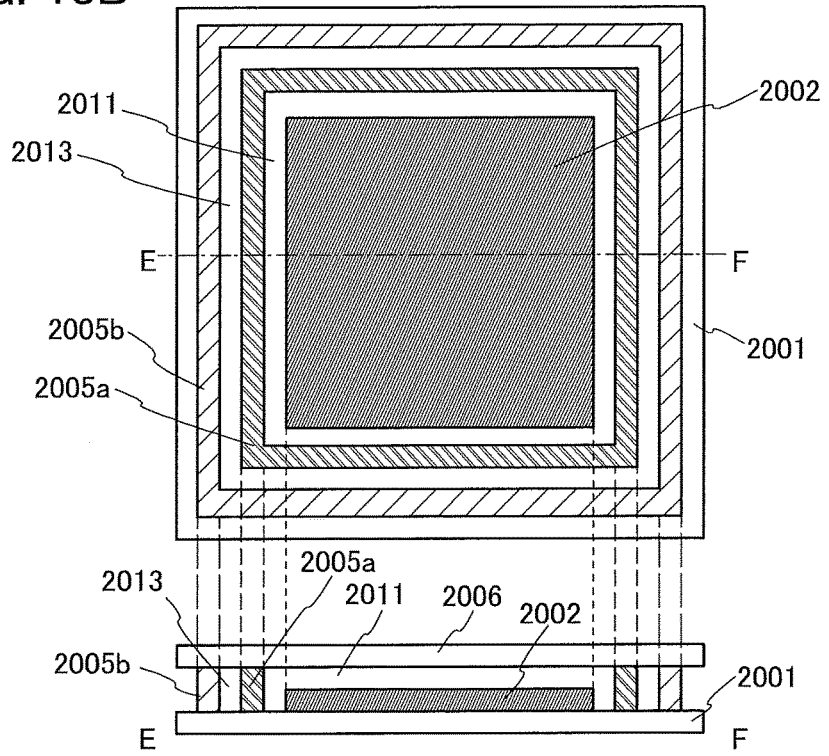

In addition, the structure illustrated in FIG. 18B can be employed: the first sealant 2005a is a glass layer and the second sealant 2005b is a resin layer containing a desiccant.

In each of the light-emitting devices described in this embodiment, distortion due to external force or the like increases toward the outer portion of the light-emitting device. In view of the above, the first sealant 2005a which has relatively small distortion due to external force or the like is a glass layer and the second sealant 2005b is a resin layer which has excellent impact resistance and excellent heat resistance and is not easily broken by deformation due to external force or the like, whereby entry of moisture and oxygen into the first space 2013 can be inhibited.

In addition to the above structure, a material serving as a desiccant may be contained in each of the first space 2013 and the second space 2011.

In the case where the first sealant 2005a or the second sealant 2005b is a glass layer, for example, a glass frit or a glass ribbon can be used. Note that at least a glass material is contained in a glass frit or a glass ribbon.

The glass frit contains a glass material as a frit material. The glass frit may contain, for example, magnesium oxide, calcium oxide, strontium oxide, barium oxide, cesium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, manganese dioxide, molybdenum oxide, niobium oxide, titanium oxide, tungsten oxide, bismuth oxide, zirconium oxide, lithium oxide, antimony oxide, lead borate glass, tin phosphate glass, vanadate glass, or borosilicate glass. The glass frit preferably contains at least one or more kinds of transition metals to absorb infrared light.

Further, in the case where a glass layer is formed using any of the above glass frits, for example, a frit paste is applied to a substrate and is subjected to heat treatment, laser light irradiation, or the like. The frit paste contains the frit material and a resin (also referred to as a binder) diluted with an organic solvent. The frit paste can be formed using a known material and a known composition. An absorber which absorbs light having a wavelength of laser light may be added to the frit material. For example, an Nd:YAG laser or a semiconductor laser is preferably used as a laser. The shape of laser light may be circular or quadrangular.

Note that the thermal expansion coefficient of the glass layer to be formed is preferably close to that of the substrate. The closer the thermal expansion coefficients are, the more generation of a crack in the glass layer or the substrate due to thermal stress can be inhibited.

Although any of known materials, for example, photocurable resins such as an ultraviolet curable resin and thermosetting resins can be used in the case where the first sealant 2005a or the second sealant 2005b is a resin layer, it is particularly preferable to use a material which does not transmit moisture or oxygen. In particular, a photocurable resin is preferably used. The light-emitting element contains a material having low heat resistance in some cases. A photocurable resin, which is cured by light irradiation, is preferably used, in which case change in film quality and deterioration of an organic compound itself caused by heating of the light-emitting element can be inhibited. Furthermore, any of the organic compounds that can be used for the light-emitting element of one embodiment of the present invention may be used.

As the desiccant contained in the resin layer, the first space 2013, or the second space 2011, a known material can be used. As the desiccant, a substance which adsorbs moisture and the like by chemical adsorption or a substance which adsorbs moisture and the like by physical adsorption can be used. Examples thereof are alkali metal oxides, alkaline earth metal oxide (e.g., calcium oxide and barium oxide), sulfate, metal halides, perchlorate, zeolite, silica gel, and the like.

One or both of the first space 2013 and the second space 2011 may have, for example, an inert gas such as a rare gas or a nitrogen gas or may contain an organic resin. Note that these spaces are each in an atmospheric pressure state or a reduced pressure state.

As described above, the light-emitting device described in this embodiment has a double sealing structure, in which one of the first sealant 2005a and the second sealant 2005b is the glass layer having excellent productivity and an excellent sealing property, and the other is the resin layer which is hardly broken because of external force or the like, and can contain the desiccant inside, so that a sealing property of inhibiting entry of impurities such as moisture and oxygen from the outside can be improved.

Thus, the use of the structure described in this embodiment can provide a light-emitting device in which deterioration of a light-emitting element due to impurities such as moisture and oxygen is inhibited.

Note that the structure described in this embodiment can be combined with any of the structures described in the other embodiments and the examples as appropriate.

[Embodiment 10]

In this embodiment, a light-emitting device fabricated using the light-emitting element of one embodiment of the present invention will be described with reference to FIGS. 19A and 19B.

Figure 19A:
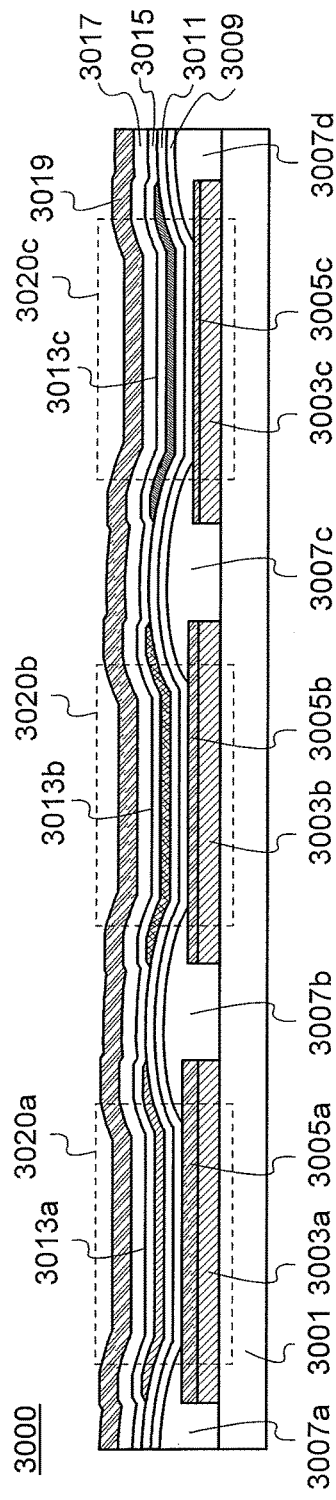
FIGS. 19A and 19B each illustrate a light-emitting device of one embodiment of the present invention.
Figure 19B:
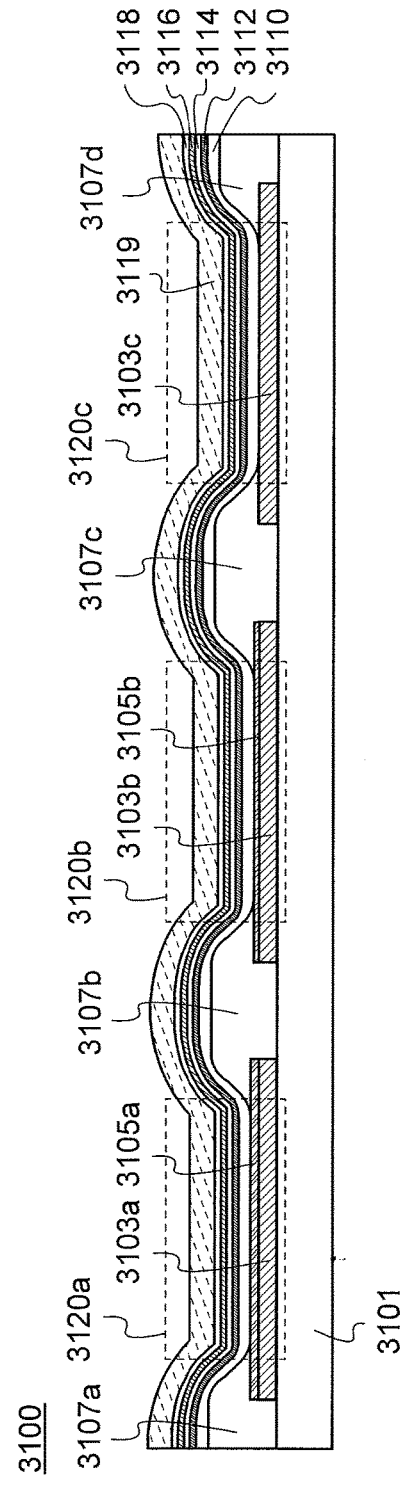

FIGS. 19A and 19B are each an example of a cross-sectional image of a light-emitting device including a plurality of light-emitting elements. A light-emitting device 3000 illustrated in FIG. 19A includes light-emitting elements 3020a, 3020b, and 3020c.

The light-emitting device 3000 includes island-shaped lower electrodes 3003a, 3003b, and 3003c over a substrate 3001. The lower electrodes 3003a, 3003b, and 3003c can function as anodes of the respective light-emitting elements. Reflective electrodes may be provided under the lower electrodes 3003a, 3003b, and 3003c. Transparent conductive layers 3005a, 3005b, and 3005c may be provided over the lower electrodes 3003a, 3003b, and 3003c, respectively. The transparent conductive layers 3005a, 3005b, and 3005c preferably have different thicknesses depending on an emission color of the element.

Further, the light-emitting device 3000 includes partitions 3007a, 3007b, 3007c, and 3007d, which are provided between the lower electrodes 3003a, 3003b, and 3003c.

Further, the light-emitting device 3000 includes a hole-injection layer 3009 over the lower electrodes 3003a, 3003b, and 3003c and the partitions 3007a, 3007b, 3007c, and 3007d.

Further, the light-emitting device 3000 includes a hole-transport layer 3011 over the hole-injection layer 3009. The light-emitting device 3000 also includes light-emitting layers 3013a, 3013b, and 3013c over the hole-transport layer 3011. The light-emitting device 3000 also includes an electron-transport layer 3015 over the light-emitting layers 3013a, 3013b, and 3013c.

Further, the light-emitting device 3000 includes an electron-injection layer 3017 over the electron-transport layer 3015. The light-emitting device 3000 also includes an upper electrode 3019 over the electron-injection layer 3017. The upper electrode 3019 can function as cathodes of the light-emitting elements.

Note that although an example in which the lower electrodes 3003a, 3003b, and 3003c function as the anodes of the light-emitting elements and the upper electrode 3019 functions as the cathodes of the light-emitting elements is described with reference to FIG. 19A, the stacking order of the anode and the cathode may be switched. In this case, the stacking order of the electron-injection layer, the electron-transport layer, the hole-transport layer, and the hole-injection layer may be changed as appropriate.

The light-emitting element of one embodiment of the present invention can be applied to the light-emitting layers 3013a, 3013b, and 3013c. The light-emitting element can have low driving voltage, high current efficiency, or a long lifetime; thus, the light-emitting device 3000 can have low power consumption or a long lifetime.

A light-emitting device 3100 illustrated in FIG. 19B includes light-emitting elements 3120a, 3120b, and 3120c. The light-emitting elements 3120a, 3120b, and 3120c are tandem light-emitting elements in which a plurality of light-emitting layers are provided between lower electrodes 3103a, 3103b, and 3103c and an upper electrode 3119.

The light-emitting device 3100 includes the island-shaped lower electrodes 3103a, 3103b, and 3103c over a substrate 3101. The lower electrodes 3103a, 3103b, and 3103c can function as anodes of the light-emitting elements. Note that reflective electrodes may be provided under the lower electrodes 3103a, 3103b, and 3103c. Transparent conductive layers 3105a and 3105b may be provided over the lower electrodes 3103a and 3103b. The transparent conductive layers 3105a and 3105b preferably have different thicknesses depending on an emission color of the element. Although not illustrated, a transparent conductive layer may also be provided over the lower electrode 3103c.

Further, the light-emitting device 3100 includes partitions 3107a, 3107b, 3107c, and 3107d, which are provided between the lower electrodes 3103a, 3103b, and 3103c.

Further, the light-emitting device 3100 includes a hole-injection and hole-transport layer 3110 over the lower electrodes 3103a, 3103b, and 3103c and the partitions 3107a, 3107b, 3107c, and 3107d.

Further, the light-emitting device 3100 includes a first light-emitting layer 3112 over the hole-injection and hole-transport layer 3110. The light-emitting device 3100 also includes a second light-emitting layer 3116 over the first light-emitting layer 3112 with a charge-generation layer 3114 therebetween.

Further, the light-emitting device 3100 includes an electron-transport and electron-injection layer 3118 over the second light-emitting layer 3116. In addition, the light-emitting device 3100 includes the upper electrode 3119 over the electron-transport and electron-injection layer 3118. The upper electrode 3119 can function as cathodes of the light-emitting elements.

Note that although an example in which the lower electrodes 3103a, 3103b, and 3103c function as the anodes of the light-emitting elements and the upper electrode 3119 functions as the cathodes of the light-emitting elements is described with reference to FIG. 19B, the stacking order of the anode and the cathode may be switched. In this case, the stacking order of the electron-injection layer, the electron-transport layer, the hole-transport layer, and the hole-injection layer may be changed as appropriate.

The light-emitting element of one embodiment of the present invention can be applied to the first light-emitting layer 3112 and the second light-emitting layer 3116. The light-emitting element can have low driving voltage, high current efficiency, or a long lifetime; thus, the light-emitting device 3100 can have low power consumption or a long lifetime.

Note that the structure described in this embodiment can be combined with any of the structures described in the other embodiments and the examples as appropriate.

[Embodiment 11]

In this embodiment, a lighting device fabricated using the light-emitting element of one embodiment of the present invention will be described with reference to FIGS. 20A to 20E.

Figure 20A:
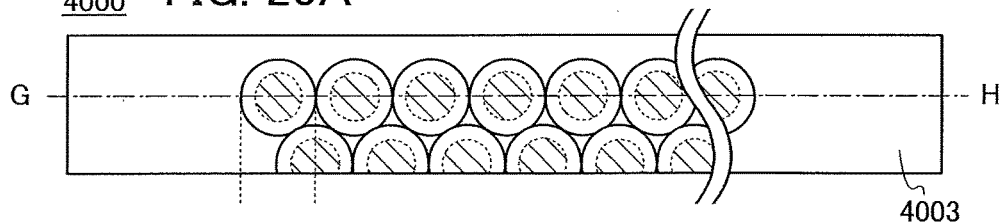
FIGS. 20A to 20E illustrate lighting devices of one embodiment of the present invention.
Figure 20B:
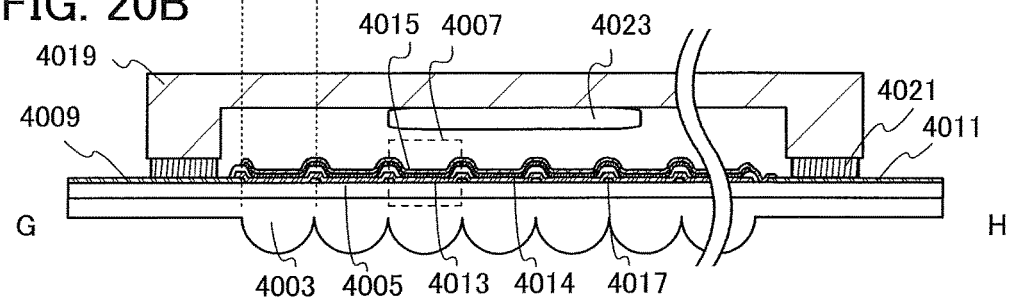
Figure 20C:
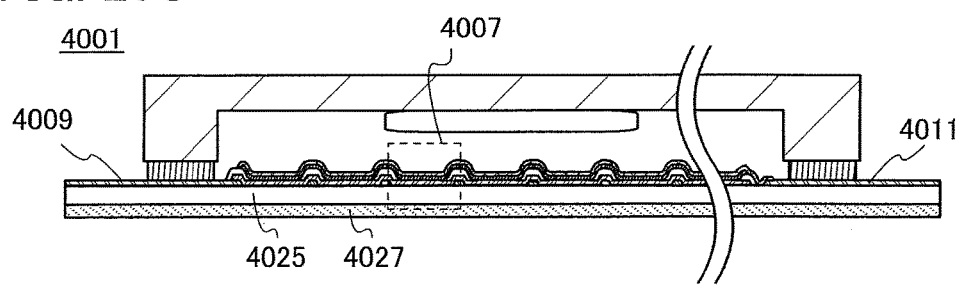

FIGS. 20A to 20E are a plan view and cross-sectional views of lighting devices. FIGS. 20A to 20C illustrate bottom-emission lighting devices in which light is extracted from the substrate side. FIG. 20B is a cross-sectional view taken along dashed-dotted line G-H in FIG. 20A.

A lighting device 4000 illustrated in FIGS. 20A and 20B includes a light-emitting element 4007 over a substrate 4005. In addition, the lighting device 4000 includes a substrate 4003 with unevenness on the outside of the substrate 4005. The light-emitting element 4007 includes a lower electrode 4013, an EL layer 4014, and an upper electrode 4015.

The lower electrode 4013 is electrically connected to an electrode 4009, and the upper electrode 4015 is electrically connected to an electrode 4011. In addition, an auxiliary wiring 4017 electrically connected to the lower electrode 4013 may be provided.

The substrate 4005 and a sealing substrate 4019 are bonded to each other by a sealant 4021. A desiccant 4023 is preferably provided between the sealing substrate 4019 and the light-emitting element 4007.

The substrate 4003 has the unevenness illustrated in FIG. 20A, whereby the extraction efficiency of light emitted from the light-emitting element 4007 can be increased. Instead of the substrate 4003, a diffusion plate 4027 may be provided on the outside of the substrate 4025 as in a lighting device 4001 illustrated in FIG. 20C.

Figure 20D:
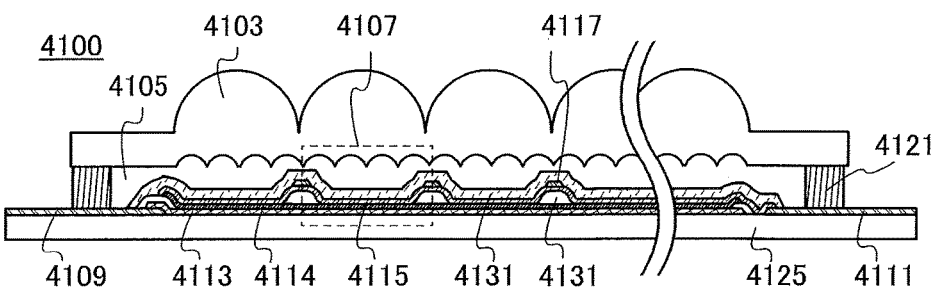
Figure 20E:
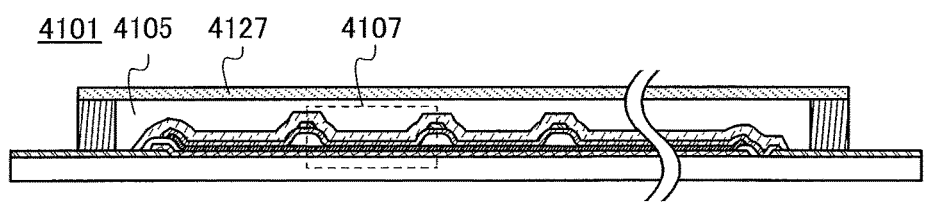

FIGS. 20D and 20E illustrate top-emission lighting devices in which light is extracted from the side opposite to the substrate.

A lighting device 4100 illustrated in FIG. 20D includes a light-emitting element 4107 over a substrate 4125. The light-emitting element 4107 includes a lower electrode 4113, an EL layer 4114, and an upper electrode 4115.

The lower electrode 4113 is electrically connected to an electrode 4109, and the upper electrode 4115 is electrically connected to an electrode 4111. An auxiliary wiring 4117 electrically connected to the upper electrode 4115 may be provided. An insulating layer 4131 may be provided under the auxiliary wiring 4117.

The substrate 4125 and a sealing substrate 4103 with unevenness are bonded to each other by a sealant 4121. A planarization film 4105 and a barrier film 4129 may be provided between the sealing substrate 4103 and the light-emitting element 4107.

The sealing substrate 4103 has the unevenness illustrated in FIG. 20D, whereby the extraction efficiency of light emitted from the light-emitting element 4107 can be increased. Instead of the sealing substrate 4103, a diffusion plate 4127 may be provided over the light-emitting element 4107 as in a lighting device 4101 illustrated in FIG. 20E.

The light-emitting element of one embodiment of the present invention can be applied to light-emitting layers included in the EL layer 4014 and the EL layer 4114. The light-emitting element can have low driving voltage, high current efficiency, or a long lifetime; thus, the lighting devices 4000, 4001, 4100, and 4101 can have low power consumption or a long lifetime.

Note that the structure described in this embodiment can be combined with any of the structures described in the other embodiments and the examples as appropriate.

[Embodiment 12]

In this embodiment, a touch sensor and a module that can be combined with a light-emitting device of one embodiment of the present invention will be described with reference to FIGS. 21A and 21B, FIG. 22, FIG. 23, and FIG. 24.

Figure 21A:
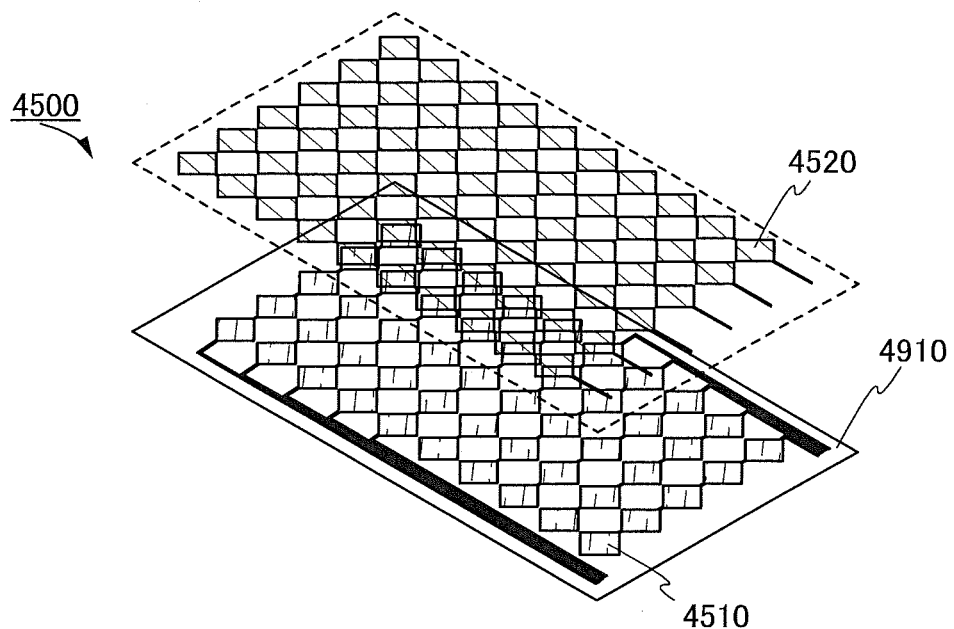
FIGS. 21A and 21B illustrate a touch sensor of one embodiment of the present invention.
Figure 21B:
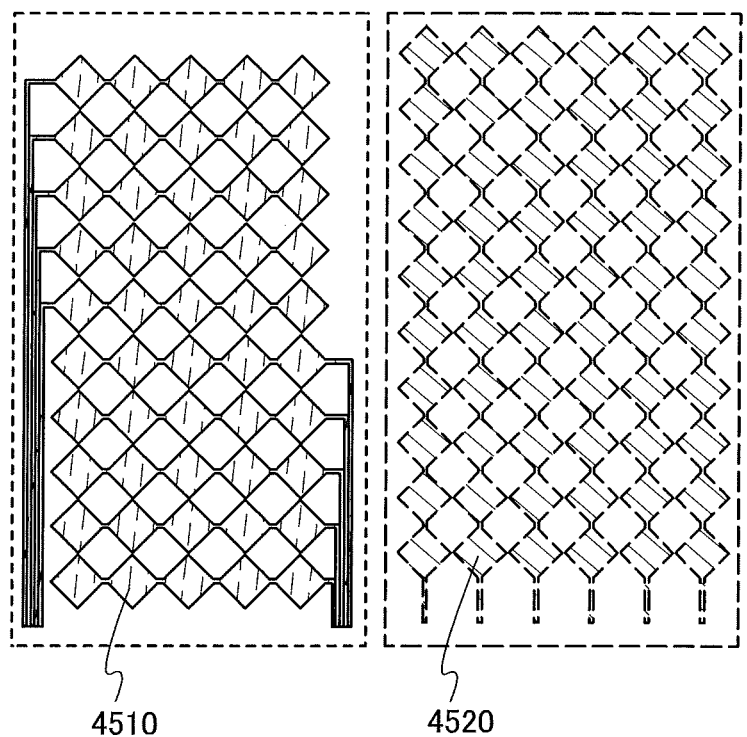

FIG. 21A is an exploded perspective view of a structural example of a touch sensor 4500. FIG. 21B is a plan view of a structural example of an electrode of the touch sensor 4500.

The touch sensor 4500 illustrated in FIGS. 21A and 21B includes, over a substrate 4910, a plurality of conductive layers 4510 arranged in the X-axis direction and a plurality of conductive layers 4520 arranged in the Y-axis direction intersecting with the X-axis direction. In FIGS. 21A and 21B, a plan view of the plurality of conductive layers 4510 of the touch sensor 4500 and a plan view of the plurality of conductive layers 4520 of the touch sensor 4500 are separately illustrated.

Figure 22:
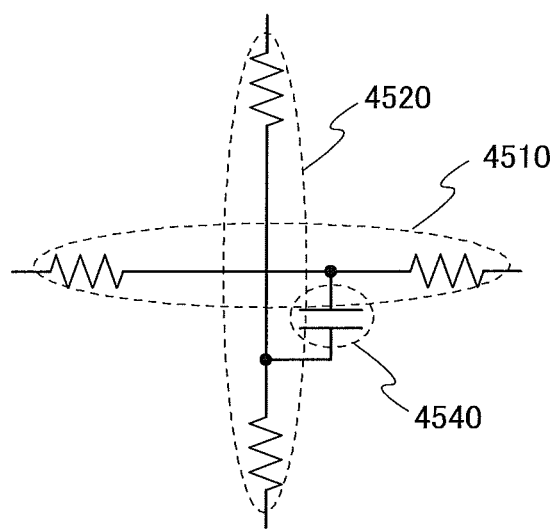
FIG. 22 is a circuit diagram illustrating a touch sensor of one embodiment of the present invention.

FIG. 22 is an equivalent circuit diagram of an intersection portion of the conductive layer 4510 and the conductive layer 4520 of the touch sensor 4500 illustrated in FIGS. 21A and 21B. As illustrated in FIG. 22, a capacitor 4540 is formed at the intersection portion of the conductive layer 4510 and the conductive layer 4520.

The plurality of conductive layers 4510 and the plurality of conductive layers 4520 have structures in each of which a plurality of quadrangular conductive films are connected to each other. The plurality of conductive layers 4510 and the plurality of conductive layers 4520 are provided so that the quadrangular conductive films of the plurality of conductive layers 4510 do not overlap with the quadrangular conductive films of the plurality of conductive layers 4520. At the intersection portion of the conductive layer 4510 and the conductive layer 4520, an insulating film is provided between the conductive layer 4510 and the conductive layer 4520 to prevent the conductive layers 4510 and 4520 from being in contact with each other.

Figure 23:
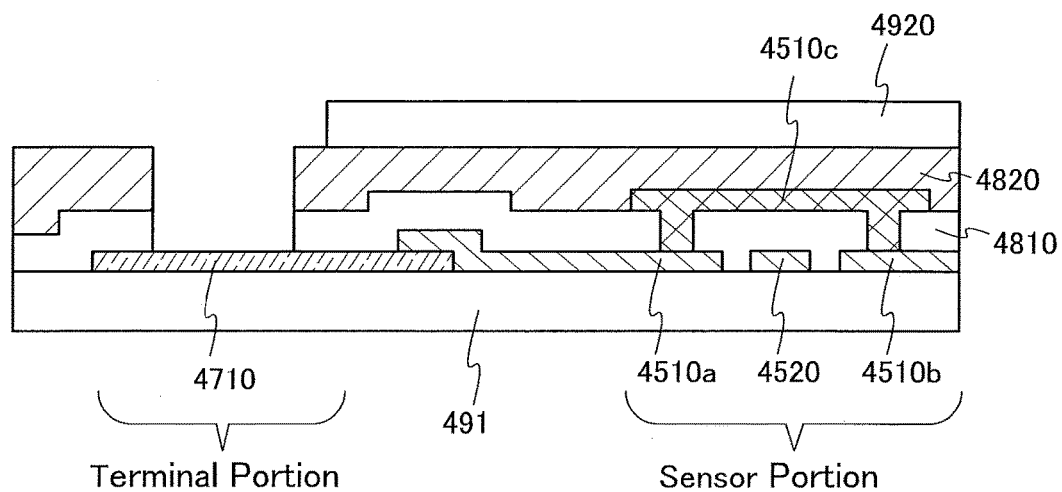
FIG. 23 is a cross-sectional view illustrating a touch sensor of one embodiment of the present invention.

FIG. 23 is a cross-sectional view illustrating an example of a connection structure of the conductive layers 4510 and the conductive layer 4520 of the touch sensor 4500 in FIGS. 21A and 21B. FIG. 23 illustrates, as an example, a cross-sectional view of a portion where the conductive layers 4510 (conductive layers 4510a, 4510b, and 4510c) intersects with the conductive layer 4520.

As illustrated in FIG. 23, the conductive layers 4510 include the conductive layer 4510a and the conductive layer

4510*b* in the first layer and the conductive layer 4510*c* in the second layer over an insulating layer 4810. The conductive layer 4510*a* and the conductive layer 4510*b* are connected by the conductive layer 4510*c*. The conductive layer 4520 is formed using the conductive film in the first layer. An insulating layer 4820 is formed so as to cover the conductive layers 4510 and 4520 and an electrode 4710. As the insulating layers 4810 and 4820, silicon oxynitride films may be formed, for example. A base film formed using an insulating film may be provided between the substrate 4910, and the conductive layers 4510 and the electrode 4710. As the base film, for example, a silicon oxynitride film can be formed.

The conductive layers 4510 and the conductive layer 4520 are formed using a conductive material that transmits visible light, such as indium tin oxide containing silicon oxide, indium tin oxide, zinc oxide, indium zinc oxide, or zinc oxide to which gallium is added.

The conductive layer 4510*a* is connected to the electrode 4710. A terminal for connection to an FPC is formed using the electrode 4710. Like the conductive layers 4510, the conductive layer 4520 is connected to the electrode 4710. The electrode 4710 can be formed of a tungsten film, for example.

The insulating layer 4820 is formed so as to cover the conductive layers 4510 and 4520 and the electrode 4710. An opening portion is formed in the insulating layers 4810 and 4820 over the electrode 4710 to connect the electrode 4710 and the FPC electrically. A substrate 4920 is attached to the insulating layer 4820 using an adhesive, an adhesive film, or the like. The substrate 4910 side is bonded to a color filter substrate of a display panel with an adhesive or an adhesive film, so that a touch panel is completed.

Next, a module that can be formed using a light-emitting device of one embodiment of the present invention is described with reference to FIG. 24.

Figure 24:
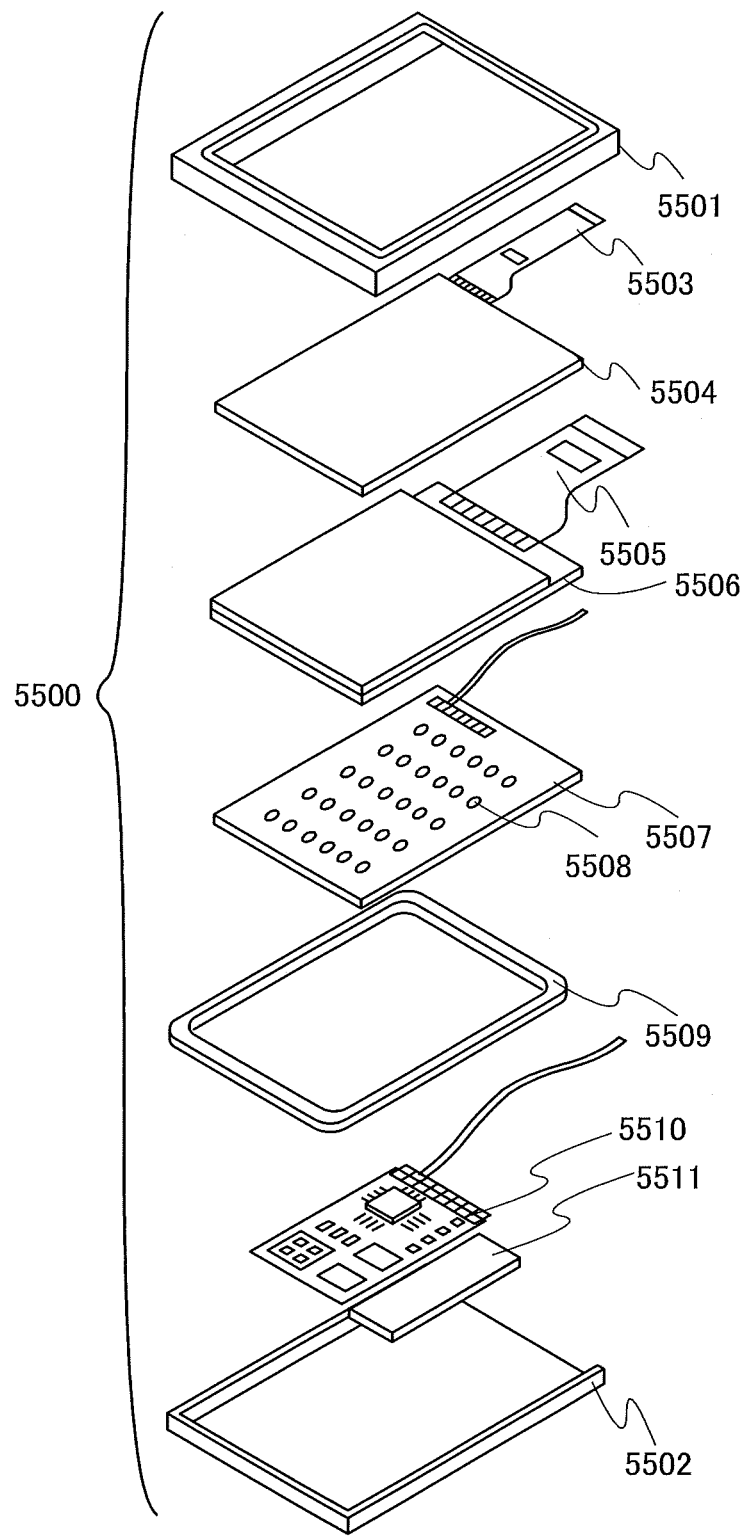
FIG. 24 illustrates a module including a light-emitting device of one embodiment of the present invention.

In a module 5500 in FIG. 24, a touch panel 5504 connected to an FPC 5503, a display panel 5506 connected to an FPC 5505, a backlight unit 5507, a frame 5509, a printed circuit board 5510, and a battery 5511 are provided between an upper cover 5501 and a lower cover 5502.

The shapes and sizes of the upper cover 5501 and the lower cover 5502 can be changed as appropriate in accordance with the sizes of the touch panel 5504 and the display panel 5506.

The touch panel 5504 can be a resistive touch panel or a capacitive touch panel and may be formed so as to overlap with the display panel 5506. A counter substrate (sealing substrate) of the display panel 5506 can have a touch panel function. A photosensor may be provided in each pixel of the display panel 5506 so that the touch panel 5504 can function as an optical touch panel.

The backlight unit 5507 includes a light source 5508. The light source 5508 may be provided at an end portion of the backlight unit 5507 and a light diffusing plate may be used.

The frame 5509 protects the display panel 5506 and functions as an electromagnetic shield for blocking electromagnetic waves generated by the operation of the printed circuit board 5510. The frame 5509 may function as a radiator plate.

The printed circuit board 5510 is provided with a power supply circuit and a signal processing circuit for outputting a video signal and a clock signal. As a power source for supplying power to the power supply circuit, an external commercial power source or a power source using the battery 5511 provided separately may be used. The battery 5511 can be omitted in the case of using a commercial power source.

The module 5500 can be additionally provided with a member such as a polarizing plate, a retardation plate, or a prism sheet.

Note that the structures and the like described in this embodiment can be combined as appropriate with any of the structures described in the other embodiments and the examples.

[Embodiment 13]

In this embodiment, a structure of the light-emitting element of one embodiment of the present invention will be described with reference to FIGS. 25A and 25B.

Figure 25A:
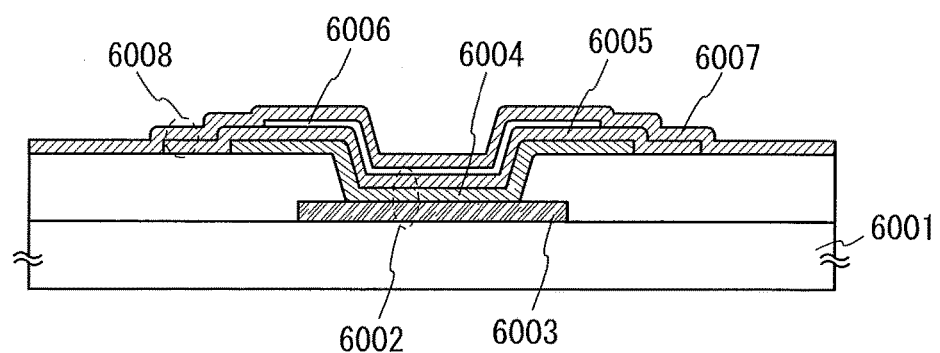
FIGS. 25A and 25B each illustrate a light-emitting element of one embodiment of the present invention.

A light-emitting element 6002 illustrated in FIG. 25A is formed over a substrate 6001. The light-emitting element 6002 includes a first electrode 6003, an EL layer 6004, and a second electrode 6005. In a light-emitting device illustrated in FIG. 25A, a buffer layer 6006 is formed over the second electrode 6005, and a third electrode 6007 is formed over the buffer layer 6006. The buffer layer 6006 can prevent a decrease in light-extraction efficiency due to surface plasmon generated on a surface of the second electrode 6005.

Note that the second electrode 6005 and the third electrode 6007 are electrically connected to each other in a contact portion 6008. The position of the contact portion 6008 is not limited to the position in the drawing, and may be formed in a light-emitting region.

The first electrode 6003 may be an anode and the second electrode 6005 may be a cathode, or alternatively, the first electrode 6003 may be a cathode and the second electrode 6005 may be an anode. At least one of the electrodes has a light-transmitting property, and both of the electrodes may be formed with light-transmitting materials. In the case where the first electrode 6003 has a function of transmitting light from the EL layer 6004, a transparent conductive film such as ITO can be used for the first electrode 6003. In the case where the first electrode 6003 blocks light from the EL layer 6004, a conductive film formed by stacking a plurality of layers (e.g., ITO and silver) can be used for the first electrode 6003.

In a structure in which light from the EL layer 6004 is extracted from the first electrode 6003 side, the thickness of the second electrode 6005 is preferably smaller than the thickness of the third electrode 6007. In a structure in which the light is extracted from the opposite side, the thickness of the second electrode 6005 is preferably larger than the thickness of the third electrode 6007. However, the thickness is not limited thereto.

For the buffer layer 6006, an organic film (e.g., Alq (abbreviation)), an inorganic insulating material (e.g., a silicon nitride film), or the like can be used.

Figure 25B:
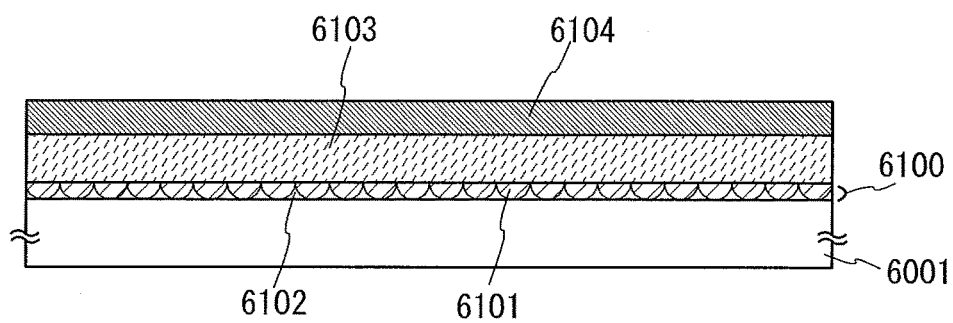

The light-extraction efficiency may be improved by employing a structure illustrated in FIG. 25B as a structure including the light-emitting element of one embodiment of the present invention.

In the structure illustrated in FIG. 25B, a light scattering layer 6100 including a light scatterer 6101 and an air layer 6102 is formed in contact with the substrate 6001; a high refractive index layer 6103 formed with an organic resin is formed in contact with the light scattering layer 6100; and an element layer 6104 including a light-emitting element and the like is formed in contact with the high refractive index layer 6103.

For the light scatterer 6101, particles such as ceramic particles can be used. For the high refractive index layer 6103, a high refractive index (e.g., refractive index of 1.7 to 1.8) material such as polyethylene naphthalate (PEN) can be used.

The element layer 6104 includes the light-emitting element described in this specification and the like.

[Embodiment 14]

In this embodiment, an example of a material which can be used for a light-emitting layer of a light-emitting element will be described.

Specifically, this embodiment describes materials (materials A to C) whose qualitative spectra (positive ions) measured with a time-of-flight secondary ion mass spectrometer (ToF-SIMS) are shown in Table 1 below. Table 1 shows precursor ions and product ions of the materials (materials A to C). Note that the values in the table indicate mass-to-charge ratios (m/z). In this measurement, a product ion 1, a product ion 2, and a product ion 3 are arranged in descending order of an intensity ratio.

TOF SIMS 5 (produced by ION-TOF GmbH) was used for the measurement, and $Bi_3^{2+}$ was used as a primary ion source. Note that irradiation with a primary ion was performed in a pulsed manner with a pulse width of 7 nm to 16 nm. The irradiation amount was greater than or equal to $8.2\times10^{10}$ ions/cm$^2$ and less than or equal to $6.7\times10^{11}$ ions/cm$^2$ (or less than or equal to $1\times10^{12}$ ions/cm$^2$), the acceleration voltage was 25 keV, and the current value was 0.2 pA.

TABLE 1

|  | Precursor Ion (m/z) | Product Ion 1 (m/z) | Product Ion 2 (m/z) | Product Ion 3 (m/z) |
| --- | --- | --- | --- | --- |
| Material A | 588 | 217 | 371 | — |
| Material B | 1096 | 91 | 180 | 901 |
| Material C | 536 | 41 | 55 | — |

EXAMPLE 1

Synthesis Example 1

In this example, a synthesis example of tris(3-phenyl-5,6,7,8-tetrahydro-4H-1,2,4-triazolo[4,3-a]pyridinato)iridium (III) (abbreviation: [Ir(ptzpytH)$_3$]), the organometallic complex described in Embodiment 1, is specifically described. A structural formula of [Ir(ptzpytH)$_3$](abbreviation) is shown below.

(100)

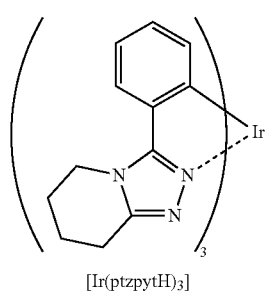

[Ir(ptzpytH)$_3$]

Step 1: Synthesis of 3-Phenyl-5,6,7,8-tetrahydro-4H-1,2,4-triazolo[4,3-a]pyridine (Abbreviation: HptzpytH)

In a 300-mL three-neck flask were put 6.0 g of benzoylhydrazine and 100 mL of xylene. To this mixture was added 5.0 g of O-methyl valerolactam and the mixture was heated and refluxed at 140° C. for 3 hours in a nitrogen stream. After the reflux, the reaction solution was concentrated to give a solid. A small amount of ethyl acetate was added to the obtained solid and suction filtration was performed to obtain 3-phenyl-5,6,7,8-tetrahydro-4H-1,2,4-triazolo[4,3-a]pyridine (abbreviation: HptzpytH) as a white solid in 77% yield. The synthesis scheme (a-1) of Step 1 is shown below.

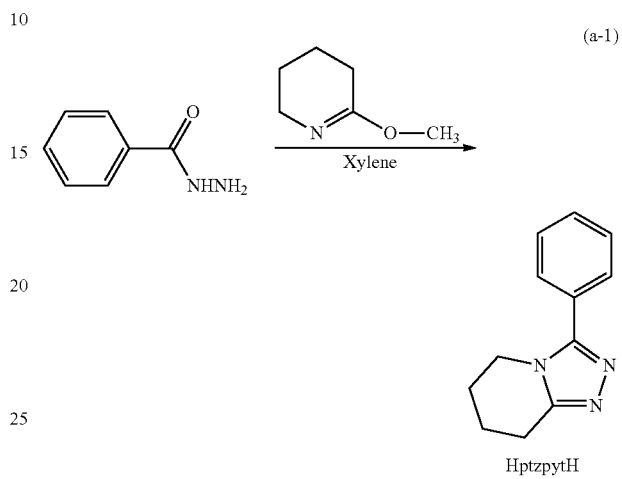

(a-1)

HptzpytH

Step 2: Synthesis of Tris(3-phenyl-5,6,7,8-tetrahydro-4H-1,2,4-triazolo[4,3-a]pyridinato)iridium (III) (Abbreviation: [Ir(ptzpytH)$_3$])

In a reaction container provided with a three-way cock were put 7.3 g of the ligand HptzpytH that was prepared in Step 1 and 0.71 g of tris(acetylacetonato)iridium(III), and the air in the reaction container was replaced with argon. Then, the mixture was heated at 250° C. for 48 hours to be reacted. The obtained reaction mixture was dissolved in dichloromethane and purification by alumina column chromatography was performed. Dichloromethane was used as a developing solvent. The obtained fraction was concentrated to obtain a solid. The obtained solid was recrystallized with a mixed solvent of dichloromethane and ethyl acetate to obtain the organometallic complex [Ir(ptzpytH)$_3$](yellow powder, 30% yield). The synthesis scheme (b-1) of Step 2 is shown below.

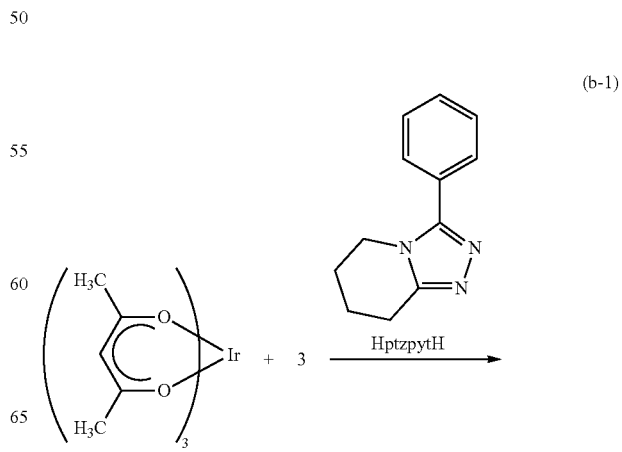

(b-1)

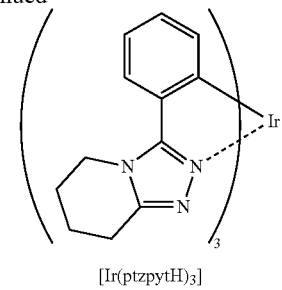

[Ir(ptzpytH)₃]

Figure 9:
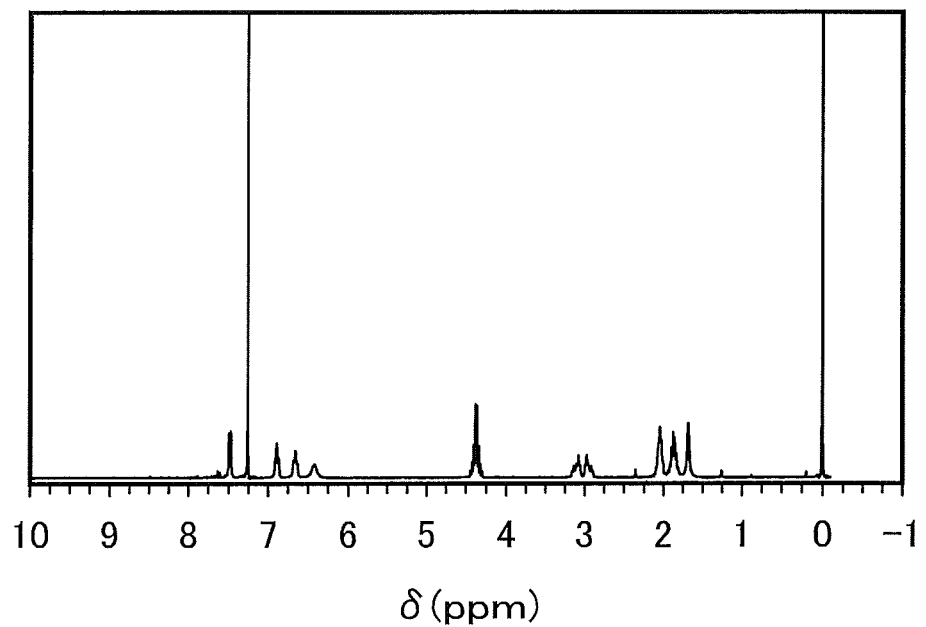
FIG. 9 shows a $^1$H NMR chart of [Ir(ptzpytH)$_3$], which is an organometallic complex represented by Structural Formula (100).

An analysis result by nuclear magnetic resonance spectroscopy (¹H-NMR) of the yellow powder prepared in Step 2 described above is shown below. The ¹H NMR chart is shown in FIG. 9. These results revealed that [Ir(ptzpytH)₃], the organometallic complex of one embodiment of the present invention which is represented by Structural Formula (100), was obtained in this synthesis example 1.

¹H NMR data of the obtained substance are as follows:

¹H-NMR. δ (CDCl₃): 1.81-1.91 (m, 2H), 2.04 (br, 2H), 2.92-3.13 (m, 2H), 4.30-4.44 (m, 2H), 6.42 (br, 1H), 6.66 (t, 1H), 6.89 (t, 1H), 7.48 (d, 1H)

Figure 10:
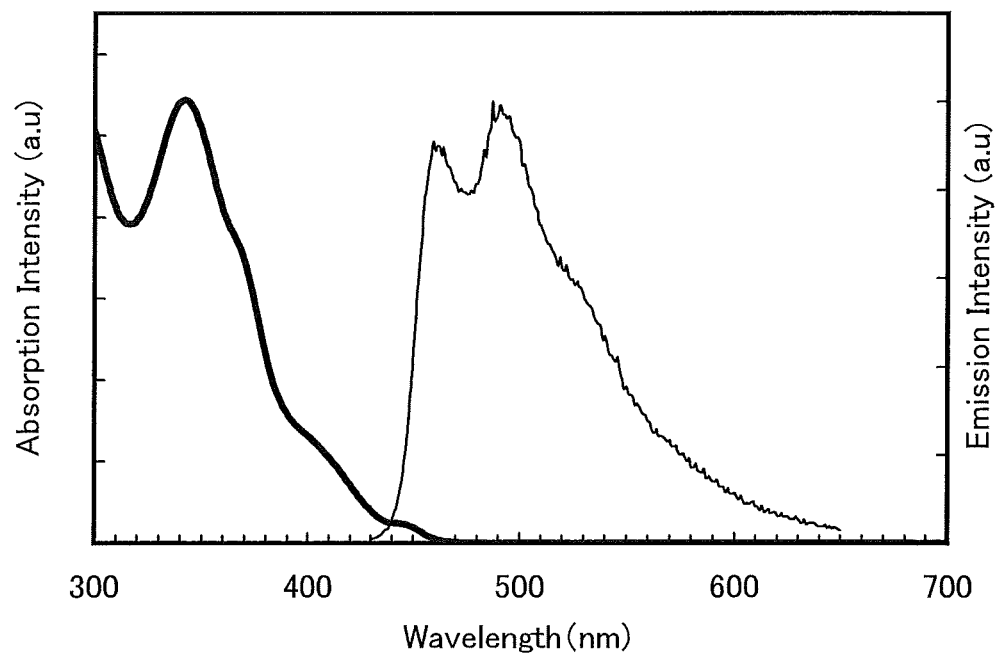
FIG. 10 shows an ultraviolet-visible absorption spectrum and an emission spectrum of [Ir(ptzpytH)$_3$], which is an organometallic complex represented by Structural Formula (100), in a dichloromethane solution.

Next, an ultraviolet-visible absorption spectrum (hereinafter, simply referred to as absorption spectrum) and an emission spectrum of [Ir(ptzpytH)₃] in a dichloromethane solution were measured. The absorption spectrum was measured with the use of an ultraviolet-visible light spectrophotometer (V-550, manufactured by JASCO Corporation) in the state where the dichloromethane solution (0.102 mmol/L) was put in a quartz cell at room temperature. The emission spectrum was measured with the use of a fluorescence spectrophotometer (FS920, manufactured by Hamamatsu Photonics Corporation) in the state where the degassed dichloromethane solution (0.102 mmol/L) was put in a quartz cell at room temperature. FIG. 10 shows measurement results of the absorption spectrum and the emission spectrum. The horizontal axis represents wavelength and the vertical axes represent absorption intensity and emission intensity. Note that the absorption spectrum in FIG. 10 is a result obtained by subtraction of a measured absorption spectrum of only dichloromethane that was put in a quartz cell from the measured absorption spectrum of the dichloromethane solution of [Ir(ptzpytH)₃] in a quartz cell.

As shown in FIG. 10, [Ir(ptzpytH)₃], the organometallic complex of one embodiment of the present invention, has emission peaks at 459 nm and 487 nm, and blue light was observed from the dichloromethane solution.

Qualitative spectra of [Ir(ptzpytH)₃] obtained in this example were measured with a time-of-flight secondary ion mass spectrometer (ToF-SIMS). The qualitative spectra are shown in FIGS. 11A and 11B. Note that the measurement results in FIGS. 11A and 11B are those of positive ions.

In FIG. 11A, the horizontal axis shows m/z in the range of 0 to 500, and the vertical axis represents intensity (arbitrary unit). In FIG. 11B, the horizontal axis shows m/z in the range of 400 to 1200.

TOF SIMS 5 (produced by ION-TOF GmbH) was used as a measurement apparatus, and $Bi_3^{++}$ was used as a primary ion source. Note that irradiation with a primary ion was performed in a pulsed manner with a pulse width of 7 nm to 12 nm. The irradiation amount was greater than or equal to $8.2 \times 10^{10}$ ions/cm² and less than or equal to $6.7 \times 10^{11}$ ions/cm² (or less than or equal to $1 \times 10^{12}$ ions/cm²), the acceleration voltage was 25 keV, and the current value was 0.2 pA. Powder of [Ir(ptzpytH)₃] was used as a sample.

The results in FIGS. 11A and 11B show that when [Ir(ptzpytH)₃], which is one embodiment of the present invention, is analyzed, peaks derived from product ions are detected mainly around m/z=41, m/z=55, m/z=104, m/z=200, m/z=388, m/z=589, and m/z=250 to 380, and a peak derived from a precursor ion is detected around m/z=787.

The results in FIGS. 11A and 11B are characteristically derived from [Ir(ptzpytH)₃] and are thus important data in identification of [Ir(ptzpytH)₃] contained in a mixture.

Among the above signals, the signals around m/z=41 and m/z=55 are derived from the 4H-triazole skeleton of the ligand and are unlikely to appear in the case of a ligand with a 1H-triazole skeleton. Note that the signal around m/z=41 is presumably derived from a C—N—N structure of a triazole ring. The signal around m/z=55 is presumably derived from an N—C—N—N structure of a triazole ring.

The signals in the range of m/z=250 to 380 are derived from a long-chain alkyl skeleton (which corresponds to a tetrahydropyridine skeleton in the present invention) and a 4H-triazole skeleton. The above signals appear at intervals of m/z=12 to 14 in the above range and the number of signals is at least 10. These signals have substantially the same intensities. Note that the expression "signals have substantially the same intensities" means that when a peak of one signal, which has the highest intensity among the group of the signals has an intensity of 100, main peaks other than isotope peaks of the other signals each have an intensity of 50 or more. In other words, in the range of m/z=250 to 500, at least 10 signals which are derived from a long-chain alkyl skeleton (which corresponds to a tetrahydropyridine skeleton in the present invention) and a 4H-triazole skeleton appear at intervals of m/z=12 to 14, and the intensity of one arbitrary main peak is greater than or equal to half and less than or equal to twice the intensity of another main peak.

The signal around m/z=200 is presumably derived from a protonated ion of 3-phenyl-5,6,7,8-tetrahydro-4H-1,2,4-triazolo[4,3-a]pyridine that is a ligand. The signal around m/z=104 is presumably derived from a fragment generated due to decomposition of 3-phenyl-5,6,7,8-tetrahydro-4H-1,2,4-triazolo[4,3-a]pyridine that is the ligand, or specifically, the signal is presumably derived from a Ph-C=N structure in which a —C=N group is bonded to a phenyl group. The Ph-C=N structure is presumably composed of the phenyl group of 3-phenyl-5,6,7,8-tetrahydro-4H-1,2,4-triazolo[4,3-a]pyridine, a carbon atom of the triazole skeleton to which the phenyl group is bonded, and a nitrogen atom of the triazole skeleton bonded to the carbon atom.

When [Ir(ptzpytH)₃] is analyzed, the strongest signal appears around m/z=589. This signal has the highest intensity among the signals observed by the measurement under the above conditions and is derived from a product ion in which two ligands are coordinated to iridium.

The signal around m/z=388 is derived from a skeleton in which one ligand (3-phenyl-5,6,7,8-tetrahydro-4H-1,2,4-triazolo[4,3-a]pyridine) is coordinated to iridium. The signal around m/z=787 is derived from [Ir(ptzpytH)₃].

Next, [Ir(ptzpytH)₃] obtained in this example was analyzed by liquid chromatography mass spectrometry (LC-MS).

The LC-MS was carried out with Acquity UPLC (produced by Waters Corporation) and Xevo G2 Tof MS (produced by Waters Corporation).

In the MS analysis, ionization was carried out by an electrospray ionization (ESI) method. At this time, the capillary voltage and the sample cone voltage were set to 3.0 kV and 30 V, respectively, and detection was performed in a positive mode. A component which underwent the ionization under the above-described conditions was collided with an argon gas in a collision cell to dissociate into product ions. Energy (collision energy) for the collision with argon was 70 eV. A mass range for the measurement was m/z=100-1200.

Figure 12:
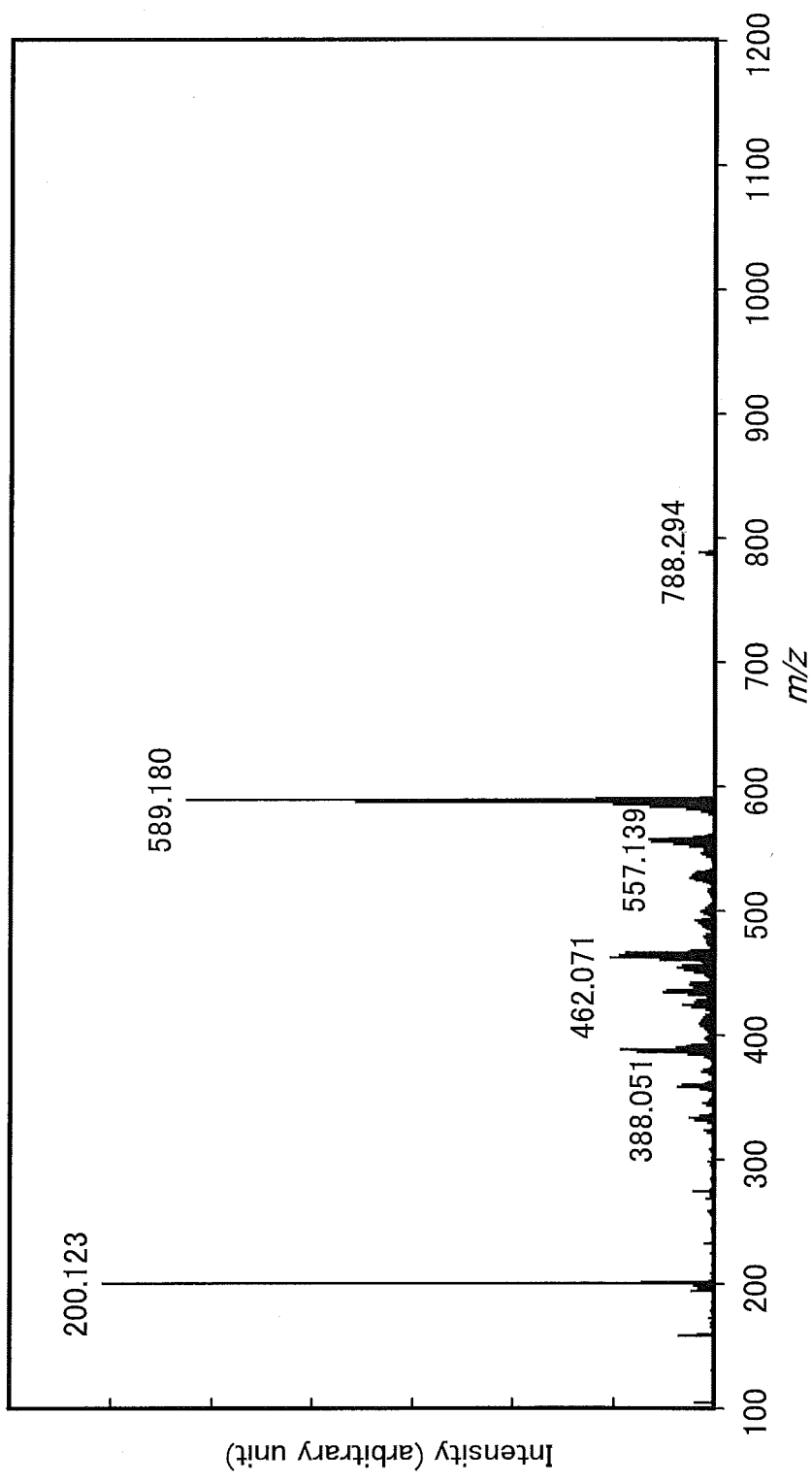
FIG. 12 shows results of LC-MS analysis of [Ir(ptzpytH)$_3$], which is an organometallic complex represented by Structural Formula (100).

FIG. 12 shows results of the MS analysis. The results in FIG. 12 show that when [Ir(ptzpytH)$_3$] obtained in this example is analyzed, peaks derived from product ions are detected mainly around m/z=200, m/z=388, m/z=462, m/z=557, and m/z=589, and a peak derived from a precursor ion is detected around m/z=788.

Here, in the LC-MS analysis, "around" is used to express changes in values of product ions and precursor ions due to the presence and absence of hydrogen ions and isotopes, and these changes in values are in an acceptable range included in similar skeletons.

The signals around m/z=200, m/z=388, and m/z=589 are the signals derived from the fragments which also appeared in the results of the analysis by ToF-SIMS.

The signal around m/z=462 and the signal around m/z=557 do not appear clearly in results of the ToF-SIMS analysis but appear rather clearly in results of the LC-MS analysis. The analysis results in which these signals do not appear clearly in the ToF-SIMS analysis but appear rather clearly in the LC-MS analysis are also characteristics of [Ir(ptzpytH)$_3$]. The signal around m/z=557 is presumably derived from a product ion represented by a molecular formula $C_{23}H_{22}IrN_5\cdots{}^+$, and the signal around m/z=462 is presumably derived from a product ion represented by a molecular formula $C_{18}H_{13}IrN_3\cdots{}^+$.

Parenthetically, the structure of the product ion which is represented by a molecular formula $C_{23}H_{22}IrN_5\cdots{}^+$ and which corresponds to the signal around m/z=557 is presumably represented by Structural Formula a; the structure of the product ion which is represented by a molecular formula $C_{18}H_{13}IrN_3\cdots{}^+$ and which corresponds to the signal around m/z=462 is presumably represented by Structural Formula b.

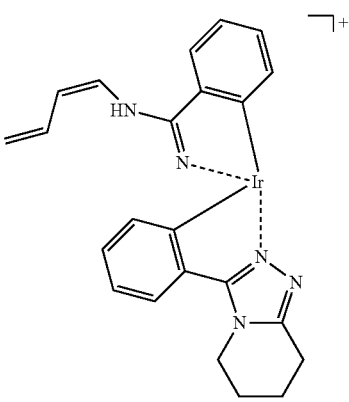

Structural Formula a molecular formula:
$C_{23}H_{22}IrN_5\cdots{}^+$

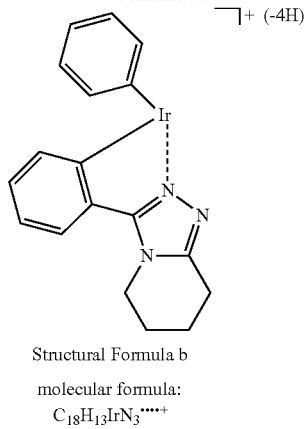

Structural Formula b molecular formula:
$C_{18}H_{13}IrN_3\cdots{}^+$

Note that the above structures are merely examples of presumable structures. Details of the structures, positions of an electric charge and an electron, and the like are not always the same as those shown above. Thus, observation of the signals by the analysis methods can constitute grounds for the existence of [Ir(ptzpytH)$_3$] but do not necessarily prove the existence of the product ions represented by the above structural formulae.

The results in FIG. 12 are characteristically derived from [Ir(ptzpytH)$_3$] and can be thus regarded as important data in identification of [Ir(ptzpytH)$_3$] contained in a mixture.

As described above, [Ir(ptzpytH)$_3$] synthesized in this example, which is the organometallic complex described in Embodiment 1, is a light-emitting substance which emits blue phosphorescence. The number of synthesis steps as small as two and the favorable yield show that [Ir(ptzpytH)$_3$] is an organometallic complex which can be manufactured inexpensively. Note that the yield of tris(4,5-dimethyl-3-phenyl-4H-1,2,4-triazolato)iridium(III) (abbreviation: [Ir(Mptz-Me)$_3$]), a substance in which not alicyclic rings but methyl groups are bonded to the 4-position and the 5-position of the ligand of [Ir(ptzpytH)$_3$], was rather poor. [Ir(ptzpytH)$_3$], the organometallic complex in which the ligand is a 3-aryl-5,6,7,8-tetrahydro-4H-[1,2,4]triazolo[4,3-a]pyridine derivative as in this example, can be synthesized with a high yield as described above, and the number of synthesis steps is small; thus, [Ir(ptzpytH)$_3$] is a blue phosphorescent material which can be very inexpensively synthesized.

From the above, the light-emitting element of one embodiment of the present invention which includes [Ir(ptzpytH)$_3$] that is the organometallic complex described in Embodiment 1 has high emission efficiency and can be fabricated at low cost.

EXAMPLE 2

In this example, a light-emitting element was fabricated which includes tris(3-phenyl-5,6,7,8-tetrahydro-4H-1,2,4-triazolo[4,3-a]pyridinato)iridium(III) (abbreviation: [Ir(ptzpytH)$_3$]), the organometallic complex described in Embodiment 1, as an emission center substance. Shown below are molecular structures of organic compounds used in this example.

(i)

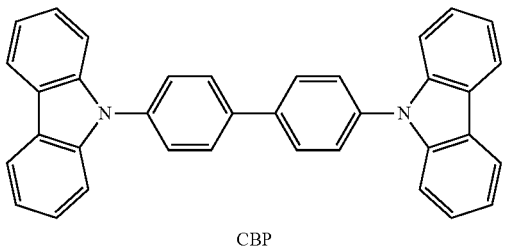

CBP (ii)

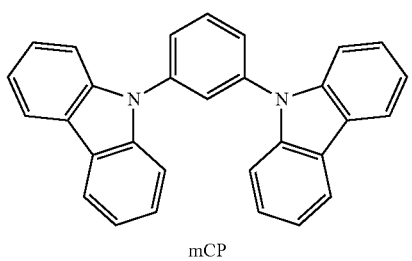

mCP (100)

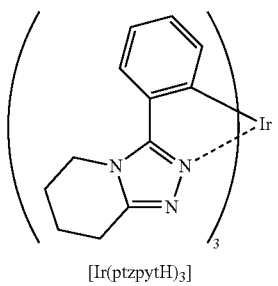

[Ir(ptzpytH)₃]

(iii)

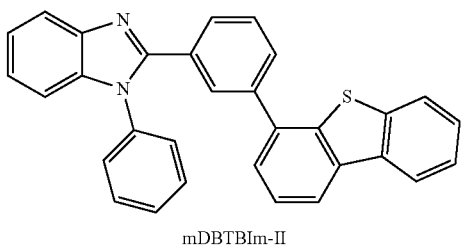

mDBTBIm-II (iv)

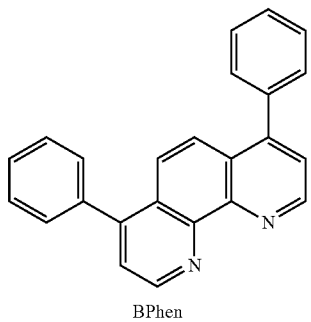

BPhen

<<Fabrication of Light-Emitting Element>>

First, a glass substrate, over which a film of indium tin oxide containing silicon (ITSO) was formed to a thickness of 110 nm as the first electrode 101, was prepared. A surface of the ITSO was covered with a polyimide film so that an area of 2 mm×2 mm of the surface was exposed. The electrode area was 2 mm×2 mm. As pretreatment for forming the light-emitting element over the substrate, the surface of the substrate was washed with water and baked at 200° C. for 1 hour, and then a UV ozone treatment was performed for 370 seconds. Then, the substrate was transferred into a vacuum evaporation apparatus where the pressure was reduced to about $10^{-4}$ Pa, vacuum baking at 170° C. for 30 minutes was performed in a heating chamber of the vacuum evaporation apparatus, and then the substrate was cooled down for about 30 minutes.

Then, the substrate was fixed to a holder provided in the vacuum evaporation apparatus such that the surface of the substrate over which the first electrode 101 was formed faced downward.

After the pressure in the vacuum evaporation apparatus was reduced to $10^{-4}$ Pa, 4,4'-bis(N-carbazolyl)biphenyl (abbreviation: CBP), which is represented by Structural Formula (i), and molybdenum (VI) oxide were co-evaporated so that the weight ratio of CBP to molybdenum oxide was 2:1; thus, the hole-injection layer 111 was formed. The thickness thereof was set to 50 nm. Note that the co-evaporation is an evaporation method in which a plurality of different substances are concurrently vaporized from the respective different evaporation sources.

Next, 1,3-bis(N-carbazolyl)benzene (abbreviation: mCP) which is represented by Structural Formula (ii) was deposited by evaporation to a thickness of 20 nm, so that the hole-transport layer 112 was formed.

Further, the light-emitting layer 113 was formed over the hole-transport layer 112 by forming a stacked layer in such a way that mCP and tris(3-phenyl-5,6,7,8-tetrahydro-4H-1,2,4-triazolo[4,3-a]pyridinato)iridium(III) (abbreviation: [Ir(ptzpytH)₃]) represented by Structural Formula (100), which is one of the organometallic complexes in Embodiment 1, were deposited by evaporation to a thickness of 30 nm so that the weight ratio of mCP to [Ir(ptzpytH)₃] was 1:0.08, and thereover, 2-[3-(dibenzothiophen-4-yl)phenyl]-1-phenyl-1H-benzimidazole (abbreviation: mDBTBIm-II) represented by Structural Formula (iii) and [Ir(ptzpytH)₃] were deposited by evaporation to a thickness of 10 nm so that the weight ratio of mDBTBIm-II to [Ir(ptzpytH)₃] was 1:0.08.

Next, bathophenanthroline (abbreviation: BPhen) represented by Structural Formula (iv) was deposited by evaporation to a thickness of 15 nm, so that the electron-transport layer 114 was formed.

Further, lithium fluoride was deposited by evaporation to a thickness of 1 nm over the electron-transport layer 114, so that the electron-injection layer 115 was formed. Lastly, an aluminum film was formed to a thickness of 200 nm as the second electrode 103 functioning as a cathode. Thus, the light-emitting element was completed. Note that in all the above evaporation steps, evaporation was performed by a resistance-heating method.

The element structure of the completed light-emitting element is shown below.

TABLE 2

| Functional Layer | Hole-injection Layer | Hole-transport Layer | Light-emitting Layer | | Electron-transport Layer | Electron-injection Layer |
|---|---|---|---|---|---|---|
| Thickness | 50 nm | 20 nm | 30 nm | 10 nm | 15 nm | 1 nm |
| Structure | CBP:MoO$_x$ (4:2) | mCP | mCP:[Ir(ptzpytH)$_3$] (1:0.08) | mDBTBIm-II:[Ir(ptzpytH)$_3$] (1:0.08) | BPhen | LiF |

<<Operation Characteristics of Light-Emitting Element>>

The light-emitting element thus obtained was sealed in a glove box under a nitrogen atmosphere without being exposed to the air. Then, the operation characteristics of this light-emitting element were measured. Note that the measurements were carried out at room temperature (in an atmosphere kept at 25° C.).

Figure 13:
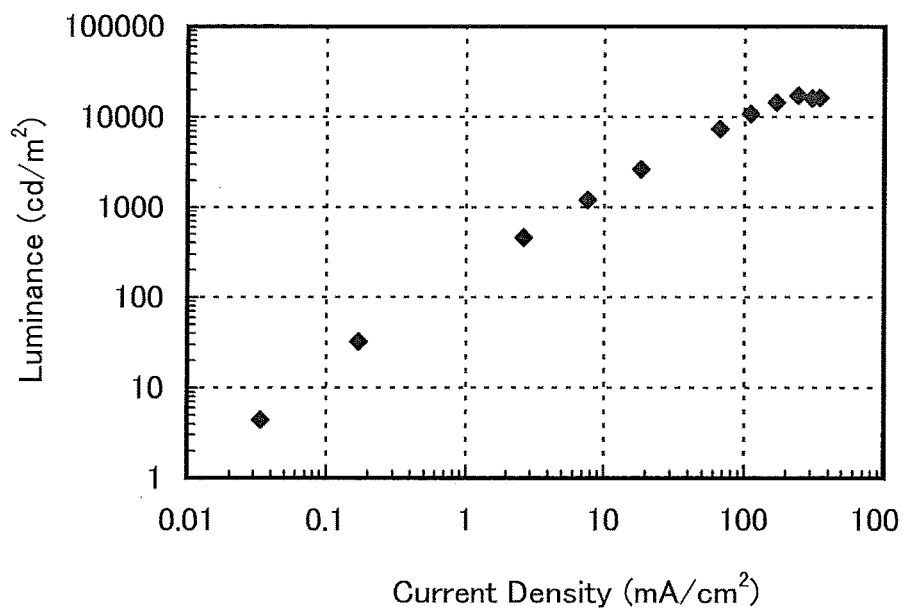
FIG. 13 shows current density-luminance characteristics of a light-emitting element fabricated in Example 1.
Figure 14:
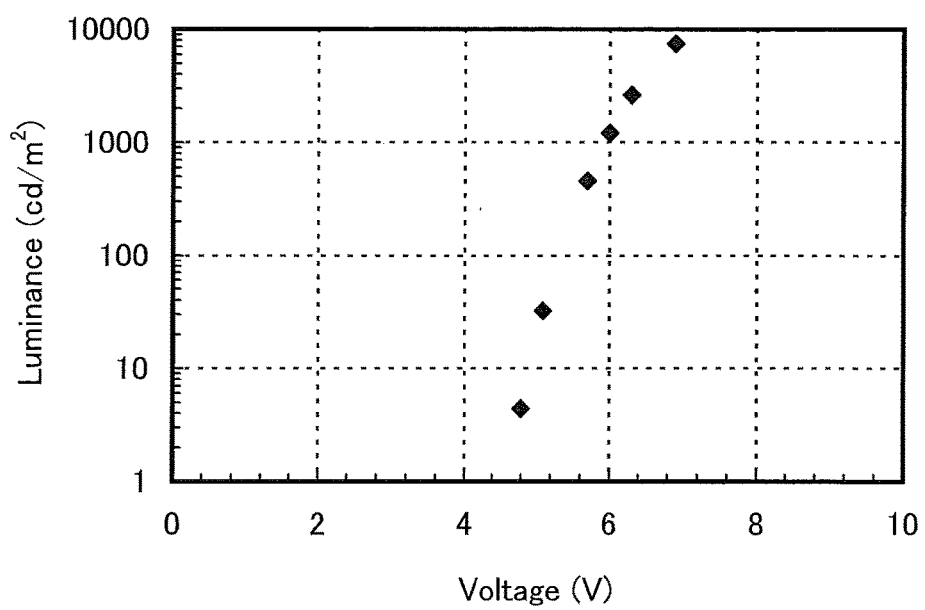
FIG. 14 shows voltage-luminance characteristics of a light-emitting element fabricated in Example 1.
Figure 15:
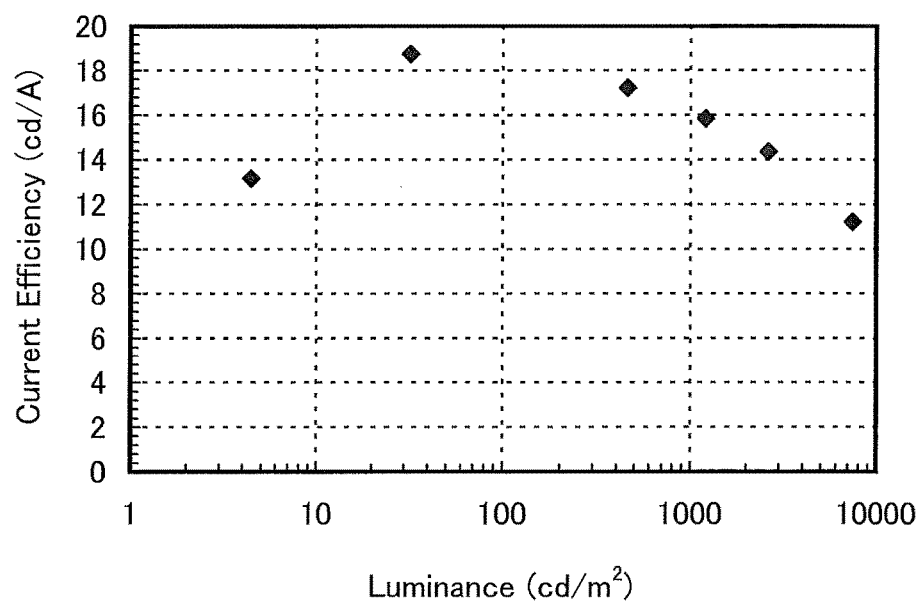
FIG. 15 shows luminance-current efficiency characteristics of a light-emitting element fabricated in Example 1.
Figure 16:
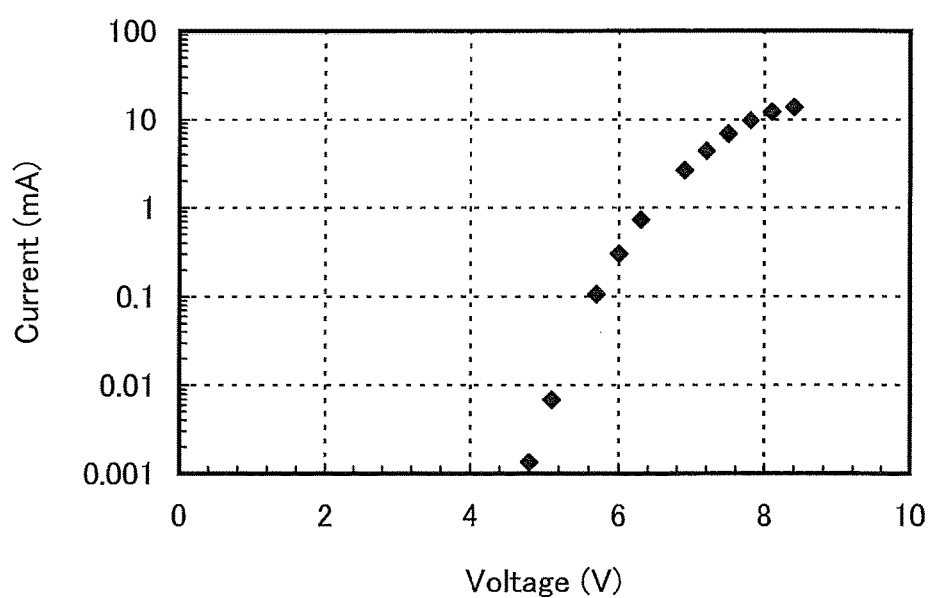
FIG. 16 shows voltage-current characteristics of a light-emitting element fabricated in Example 1.

FIG. 13 shows current density-luminance characteristics of the light-emitting element, FIG. 14 shows its voltage-luminance characteristics, FIG. 15 shows its luminance-current efficiency characteristics, and FIG. 16 shows its voltage-current characteristics.

FIG. 15 shows the favorable luminance-current efficiency characteristics of the light-emitting element of this example. Thus, the light-emitting element was found to have high emission efficiency.

Figure 17:
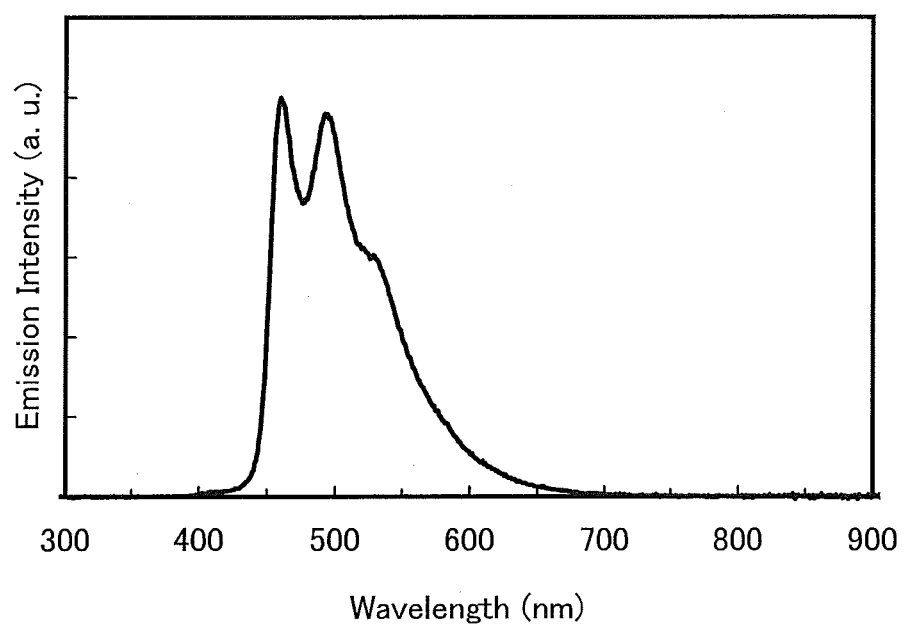
FIG. 17 is a graph showing an emission spectrum of a light-emitting element fabricated in Example 1.

FIG. 17 shows an emission spectrum when a current of 0.1 mA was made to flow in the fabricated light-emitting element. In FIG. 17, the vertical axis represents emission intensity (arbitrary unit), and the horizontal axis represents wavelength (nm). The emission intensity is shown as a value relative to the greatest emission intensity assumed to be 1. FIG. 17 shows that the light-emitting element of this example emits blue light with a maximum emission wavelength of around 460 nm.

Note that [Ir(ptzpytH)$_3$], the emission center material of the light-emitting element of this example, is an organometallic complex capable of emitting blue phosphorescence and being manufactured inexpensively, and therefore the light-emitting element of this example can efficiently emit light in the wavelength region of blue and can be fabricated inexpensively.

This application is based on Japanese Patent Application serial no. 2012-277691 filed with Japan Patent Office on Dec. 20, 2012, the entire contents of which are hereby incorporated by reference.

What is claimed is:

1. A light-emitting element comprising a layer containing an organic compound between a pair of electrodes,
   wherein the light-emitting element exhibits blue-green to blue light emission,
   wherein the organic compound contains iridium,
   wherein the organic compound contains a ligand,
   wherein the ligand contains 4H-triazole skeleton,
   wherein by ToF-SIMS, the 4H-triazole skeleton gives signals around m/z=41, m/z=55, and the ligand gives signals around m/z=200 at least at a depth of the layer containing the organic compound.

2. The light-emitting element according to claim 1, wherein the ligand further gives a signal around m/z=104 at least at the depth.

3. The light-emitting element according to claim 1, wherein, in a range of m/z=250 to 380, the organic compound further gives at least 10 signals having similar shapes at intervals of around m/z=12 to 14 at least at the depth.

4. The light-emitting element according to claim 1, wherein the organic compound further gives a signal at m/z=388 at least at the depth.

5. The light-emitting element according to claim 1,
   wherein the layer containing the organic compound is analyzed by the ToF-SIMS using Bi$_3^{++}$ as a primary ion with an irradiation, and
   wherein the irradiation amount of the primary ion in the ToF-SIMS-is greater than or equal to $8\times10^{10}$ ions/cm$^2$ and less than or equal to $1.0\times10^{12}$ ions/cm$^3$.

6. The light-emitting element according to claim 1, wherein the light emission is phosphorescence.

7. A light-emitting element comprising a layer containing an organic compound between a pair of electrodes,
   wherein the light-emitting element exhibits blue light emission,
   wherein the organic compound contains iridium,
   wherein, by ToF-SIMS, the organic compound gives a signal around m/z=589 at least at a depth of the layer containing the organic compound, and
   wherein the organic compound comprises a ligand represented by the following structure:

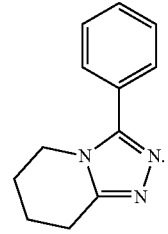 [SMILES: c1ccc(-c2nnc3n2CCCC3)cc1]

8. The light-emitting element according to claim 7, wherein the organic compound further gives a signal around m/z=200 at least at the depth.

9. The light-emitting element according to claim 7, wherein the organic compound further gives signals around m/z=41, m/z=55, and m/z=104 at least at the depth.

10. The light-emitting element according to claim 7, wherein, in a range of m/z=250 to 380, the organic compound further gives at least 10 signals having similar shapes at intervals of around m/z=12 to 14 at least at the depth.

11. The light-emitting element according to claim 7, wherein the organic compound further gives a signal at m/z=388 at least at the depth.

12. The light-emitting element according to claim 7, wherein the organic compound further gives a signal at m/z=787 at least at the depth.

13. The light-emitting element according to claim 7,
   wherein the layer containing the organic compound is analyzed by the ToF-SIMS using Bi$_3^{++}$ as a primary ion with an irradiation, and
   wherein the irradiation amount of the primary ion in the ToF-SIMS is greater than or equal to $8\times10^{10}$ ions/cm$^2$ and less than or equal to $1.0\times10^{12}$ ions/cm$^3$.

14. An electronic device comprising:
a housing; and
a display portion comprising the light-emitting element according to claim 1,
wherein the electronic device is selected from the group consisting of a television set, a computer, a portable game machine, and a mobile phone.

15. An electronic device comprising:
a housing; and
a display portion comprising the light-emitting element according to claim 7,
wherein the electronic device is selected from the group consisting of a television set, a computer, a portable game machine, and a mobile phone.

16. The light-emitting element according to claim 1, wherein the ligand comprises the following structure:

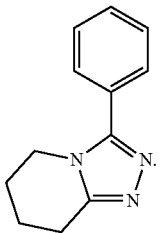 [SMILES: c1ccc(-c2nnc3n2CCCC3)cc1]

17. The light-emitting element according to claim 7, wherein the organic compound is represented by the following structure:

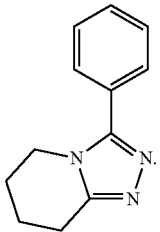

18. The light-emitting element according to claim 1, wherein the signals around m/z=41 and m/z=55 m/z=104, and m/z=200 are detected from one kind of molecules.

19. The light-emitting element according to claim 1, wherein the ligand further gives a signal around m/z=589 at least at the depth.

20. A light-emitting element comprising a layer containing an organic compound between a pair of electrodes,
wherein the light-emitting element exhibits blue-green to blue light emission,
wherein the organic compound contains iridium,
wherein the organic compound contains a ligand,
wherein the ligand contains 4H-triazole skeleton,
wherein the 4H-triazole skeleton is identified by values at m/z=41 and m/z=55, and the ligand is identified by a value at m/z=200.

21. The light-emitting element according to claim 20, wherein a value m/z=104 is obtained from the ligand.

22. The light-emitting element according to claim 20, wherein a value m/z=388 is obtained from the organic compound.

23. The light-emitting element according to claim 20,
wherein the layer containing the organic compound is analyzed by the ToF-SIMS using $Bi_3^{++}$ as a primary ion with an irradiation, and
wherein the irradiation amount of the primary ion in the ToF-SIMS-is greater than or equal to $8\times10^{10}$ ions/cm$^2$ and less than or equal to $1.0\times10^{12}$ ions/cm$^3$.

24. An electronic device comprising:
a housing; and
a display portion comprising the light-emitting element according to claim 20,
wherein the electronic device is selected from the group consisting of a television set, a computer, a portable game machine, and a mobile phone.

25. The light-emitting element according to claim 20, wherein the ligand comprises the following structure:

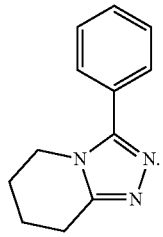

* * * * *